(12) United States Patent
Hamatani et al.

(10) Patent No.: US 7,215,408 B2
(45) Date of Patent: May 8, 2007

(54) SPECIFICATION DETERMINING METHOD, PROJECTION OPTICAL SYSTEM MAKING METHOD AND ADJUSTING METHOD, EXPOSURE APPARATUS AND MAKING METHOD THEREOF, AND COMPUTER SYSTEM

(75) Inventors: Masato Hamatani, Kounosu (JP); Toshio Tsukakoshi, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/214,795

(22) Filed: Aug. 31, 2005

(65) Prior Publication Data
US 2006/0007418 A1   Jan. 12, 2006

Related U.S. Application Data

(62) Division of application No. 10/072,866, filed on Feb. 12, 2002, now Pat. No. 6,961,115.

(30) Foreign Application Priority Data

| Feb. 13, 2001 | (JP) | ............................. 2001-036182 |
| Feb. 13, 2001 | (JP) | ............................. 2001-036184 |
| Feb. 26, 2001 | (JP) | ............................. 2001-051178 |
| Jan. 31, 2002 | (JP) | ............................. 2002-023547 |
| Jan. 31, 2002 | (JP) | ............................. 2002-023567 |

(51) Int. Cl.
*G03B 27/32* (2006.01)
*G03B 27/34* (2006.01)
*G03B 27/52* (2006.01)
*G03B 27/68* (2006.01)

(52) U.S. Cl. ............................. 355/52; 355/55; 355/57; 355/77

(58) Field of Classification Search .................. 355/52, 355/55, 57, 77
See application file for complete search history.

(56) References Cited

U.S. PATENT DOCUMENTS 4,786,166 A    11/1988   Kroko (Continued)

FOREIGN PATENT DOCUMENTS

DE        198 20 785 A1    10/1999

(Continued)

OTHER PUBLICATIONS

Winter 1998 Microlithography World pp. 11-20 Authors: Donis G. Flagello and Bernd Geh Title: "The influence of Lens aberrations in lithography".

(Continued)

*Primary Examiner*—Rodney Fuller
(74) *Attorney, Agent, or Firm*—Oblon, Spivak, McClelland, Maier & Neustadt, P.C.

(57) ABSTRACT

An exposure apparatus for transferring a pattern onto an object via a projection optical system, including a moving body arranged on an image plane side with respect to the projection optical system, a wave-front measuring unit at least a part of which is arranged in the moving body, and which measures wave-front information of the projection optical system, an adjusting unit that adjusts a state of an image of a projected pattern generated on the object via the projection optical system, and a controller that controls the adjusting unit using the wave-front information and Zernike Sensitivity corresponding to exposure conditions of the object.

33 Claims, 12 Drawing Sheets

U.S. PATENT DOCUMENTS

| | | | |
|---|---|---|---|
| 5,321,493 A | 6/1994 | Kamon | |
| 5,754,299 A | 5/1998 | Sugaya et al. | |
| 5,807,647 A | 9/1998 | Hashimoto | |
| 5,898,501 A | 4/1999 | Suzuki et al. | |
| 5,978,085 A | 11/1999 | Smith et al. | |
| 6,078,554 A | 6/2000 | Ootaki et al. | |
| 6,100,978 A | 8/2000 | Naulleau et al. | |
| 6,118,535 A | 9/2000 | Goldberg et al. | |
| 6,245,470 B1 | 6/2001 | Kamon | |
| 6,248,486 B1 | 6/2001 | Dirksen et al. | |
| 6,268,903 B1 | 7/2001 | Chiba et al. | |
| 6,329,112 B1 | 12/2001 | Fukuda et al. | |
| 6,368,763 B2 | 4/2002 | Dirksen et al. | |
| 6,459,480 B1 | 10/2002 | Kye | |
| 6,548,312 B1 | 4/2003 | Hayano et al. | |
| 6,570,143 B1 | 5/2003 | Neil et al. | |
| 6,741,327 B2 | 5/2004 | Nomura et al. | |
| 6,787,789 B2 | 9/2004 | Van Der Laan | |
| 6,887,625 B2 | 5/2005 | Baselmans et al. | |
| 6,937,345 B2 | 8/2005 | Kuramoto | |
| 6,960,415 B2 | 11/2005 | Shiode | |
| 6,975,387 B2 | 12/2005 | Mizuno | |
| 7,075,651 B2 | 7/2006 | Tsukakoshi | |
| 2002/0001071 A1 | 1/2002 | Nomura et al. | |
| 2002/0008869 A1 | 1/2002 | Van Der Laan et al. | |
| 2002/0036758 A1 | 3/2002 | De Mol et al. | |
| 2002/0191165 A1 | 12/2002 | Baselmans et al. | |
| 2005/0024612 A1 | 2/2005 | Hirukawa et al. | |
| 2005/0206850 A1 | 9/2005 | Shimizu et al. | |

FOREIGN PATENT DOCUMENTS

| | | |
|---|---|---|
| EP | 0 267 721 | 5/1988 |
| EP | 0 338 200 | 10/1989 |
| EP | 1 079 223 | 2/2001 |
| EP | 1 128 217 | 8/2001 |
| EP | 1 160 626 | 12/2001 |
| EP | 1 160 626 A1 | 12/2001 |
| EP | 1 355 140 A1 | 10/2003 |
| EP | 1 359 608 A1 | 11/2003 |
| JP | 5-296879 | 11/1993 |
| JP | 6-235619 | 8/1994 |
| JP | 10-154657 | 6/1998 |
| JP | 11-118613 | 4/1999 |
| JP | 11-233424 | 8/1999 |
| JP | 2000-47103 | 2/2000 |
| JP | 2000-121491 | 4/2000 |
| JP | 2000-146757 | 5/2000 |
| JP | 2000-266640 | 9/2000 |
| JP | 2000-331923 | 11/2000 |
| JP | 2001-85305 | 3/2001 |
| JP | 2001-230193 | 8/2001 |
| WO | WO 99/60361 | 11/1999 |
| WO | WO 00/31592 | 6/2000 |
| WO | WO 00/55890 | 9/2000 |
| WO | WO 02/50506 A1 | 6/2002 |

OTHER PUBLICATIONS

Journal of Vacuum Science & Technology B: Microelectronics Processing and Phenomena, American Vacuum Society, New York, NY, US, vol. 16, No. 6, Nov. 1998 pp. 3435-3439 Authors: K. Goldberg, et al. Title: "High-accuracy interferometry of extreme ultraviolet lithographic optical System".

SPIE Microlithography Seminar, pp. 1-14 Authors: Donis G. Flaggelo, et al. Title: "Towards a Comprehensive Control of Full-Field Image Quality in Optical Photolithography".

$67_{i,j}$ $74_1(74_2)$

SPECIFICATION DETERMINING METHOD, PROJECTION OPTICAL SYSTEM MAKING METHOD AND ADJUSTING METHOD, EXPOSURE APPARATUS AND MAKING METHOD THEREOF, AND COMPUTER SYSTEM

BACKGROUND OF THE INVENTION

1. Field of the Invention

The present invention relates to a specification determining method, a projection optical system making method and adjusting method, an exposure apparatus and making method thereof, and a computer system, and more specifically to a specification determining method of determining the specification of a projection optical system to be provided in an optical apparatus, a method of making and a method of adjusting a projection optical system to be provided in an optical apparatus, an exposure apparatus provided with the projection optical system made according to the method of a projection optical system and making method thereof, and a computer system suitable for implementing the specification determining method and adjusting the imaging characteristic of the projection optical system provided in the exposure apparatus.

2. Description of the Related Art

In a lithography process for manufacturing semiconductor devices (CPU, DRAM, etc.), image picking-up devices (CCD, etc.), liquid crystal display devices, membrane magnetic heads or the like, exposure apparatuses have been used which form device patterns on a substrate. Because of increasingly high integration of semiconductor devices in these years, a step-and-repeat type of reduction projection exposure apparatus (the so-called stepper) that can form fine patterns on a substrate such as a wafer or glass plate, a step-and-scan type of scan projection exposure apparatus (the so-called scanning stepper) that is improved over the stepper, or the like is mainly used.

In the process of manufacturing semiconductor devices, because multiple layers each of which has a sub-circuit pattern need to be overlaid and formed on a substrate, it is important to accurately align a reticle (or mask) having a sub-circuit pattern formed thereon with respect to the already-formed pattern in each shot area on a substrate. In order to accurately align, the optical characteristic of the projection optical system needs to be precisely measured and adjusted to be in a desired state (for example, a state where magnification error of the transferred image of a reticle pattern relative to each shot area's pattern on the substrate is corrected). It is remarked that, also when transferring a reticle pattern for a first layer onto each shot area of the substrate, the imaging characteristic of the projection optical system is preferably adjusted in order to accurately transfer reticle patterns for second and later layers onto each shot area.

As the method of measuring the optical characteristic (the imaging characteristic, etc.) of the projection optical system, a method is mainly used which calculates the optical characteristic based on the result of measuring a resist image obtained by exposing a substrate through a measurement reticle having a predetermined measurement pattern that remarkably responds to a specific aberration, formed thereon and then developing the substrate where the projected image of the measurement pattern is formed, the method being called a "print method", hereinafter.

In exposure apparatuses of the prior art, measuring lower-order aberrations such as Seidel's five aberrations, i.e., spherical aberration, coma, astigmatism, field curvature, and distortion according to the print method and adjusting and managing the above aberrations due to the projection optical system based on the measuring result has been performed.

For example when measuring distortion due to the projection optical system, a measurement reticle is used on which inner box marks that each are a square having a dimension of 100 um and outer box marks that each are a square having a dimension of 200 um are formed, and after having transferred the inner or outer box marks onto a wafer whose surface is coated with a resist through the projection optical system, the wafer stage is moved and then the other marks are transferred and overlaid onto the wafer through the projection optical system. When the magnification is equal to ⅕ for example, the resist image of box-in-box marks appears, after development of the wafer, in each of which a box mark having a dimension of 20 um is located inside of a box mark having a dimension of 40 um. And distortion due to the projection optical system is detected by measuring the positional relation between both the marks and deviation from their reference point in the stage coordinate system.

Moreover, when measuring the coma, a measurement reticle is used on which a line-and space pattern (hereinafter, referred to as a "L/S") having five lines whose width is, for example, 0.9 um is formed, and the pattern is transferred onto a wafer whose surface is coated with a resist through the projection optical system. When the magnification is equal to ⅕ for example, the resist image of the L/S pattern appears, after development of the wafer, having a line width of 0.18 um. And coma due to the projection optical system is detected by measuring the widths L1, L5 of two lines in both ends of the pattern and obtaining a line-width abnormal value given by the following equation:

$$\text{the line-width abnormal vale} = (L1-L5)/(L1+L5) \qquad (1).$$

Moreover, in measuring a best focus position of the projection optical system, a wafer is moved sequentially to a plurality of positions along the optical axis direction which are a given distance (step pitch) apart from each other, and the L/S pattern is transferred each time onto a different area of the wafer through the projection optical system. The wafer position associated with one whose line width is maximal out of the resist images of the L/S pattern, which appear after development of the wafer, is adopted as the best focus position.

When measuring the spherical aberration, the measurement of a best focus position is performed a plurality of times each time with a different L/S pattern having a different duty ratio, and based on the differences between the best focus positions, the spherical aberration is obtained.

When measuring the field curvature, the measurement of a best focus position is performed in a plurality of measurement points within the field of the projection optical system, and based on the measuring results, the field curvature is calculated using the least-squares method.

In addition, when measuring the astigmatism due to the projection optical system, the measurement of a best focus position is performed with two kinds of periodic patterns whose period directions are perpendicular to each other, and based on the difference between the best focus positions, the astigmatism is calculated.

In the prior art, the specification of a projection optical system in the making of an exposure apparatus is determined according to the same standard as in the above managing of the optical characteristic of the projection optical system. That is, the specification is determined such that the five aberrations measured by the print method or obtained by a simulation substantially equivalent thereto are at or below given respective values.

However, because of the demand for further improved exposure accuracy corresponding to increasingly high integration in these years, measuring only the lower-order aberrations according to the prior art method and, based on the measuring result, adjusting the optical characteristic of the projection optical system does not yield a desired result. The reason for that is as follows.

The space image of a measurement pattern, for example, a L/S pattern has space-frequency components (intrinsic frequency components), i.e. a fundamental wave corresponding to the L/S period and higher harmonics, and the pattern determines the space-frequencies of the components that pass through the pupil plane of the projection optical system. Meanwhile, reticles having various patterns are used in the actual manufacturing of devices, the space images of which patterns include innumerable space-frequency components. Therefore, the prior art method of measuring and adjusting aberrations based on the limited information hardly meet the demand for further improved exposure accuracy.

In this case, although reticle patterns having intrinsic frequency components that are missing in the information need to be measured, it takes an enormous amount of measurement and time, so that it is not practical.

Furthermore, because of the accuracy in measuring resist images, which are affected by the intrinsic characteristic of the resist, etc., the correlation between the resist image and a corresponding optical image needs to be found before extracting data from the measuring result.

Furthermore, when an aberration is large, the linearity of the resist image to the corresponding space image of the pattern is lost, so that accurate measurement of the aberration is difficult. In this case, for the purpose of accurately measuring the aberration, it is necessary to change the pattern-pitch, the line width (space frequency), etc., of the measurement pattern of the reticle, through trial and error, such that the intrinsic characteristic of the resist can be measured (the linearity is obtained).

For the same reason, the method of determining the specification of a projection optical system according to the above criteria has reached its limit. It is because a projection optical system satisfying the specification determined obviously cannot achieve exposure accuracy demanded at present and in the future.

In such circumstances, the adjusting method has been adopted where, when making a projection optical system according to the specification determined, the positions, etc., of lens devices are adjusted such that the Seidel's five aberrations (lower-order aberrations) satisfy the determined specification, based on the result of measuring the aberration due to the projection optical system according to the print method after the assembly of the projection optical system in the making process, and, after that, detecting residual higher-order aberrations by a light-rays tracing method and adjusting the positions, etc., of lens devices in the projection optical system (additionally reprocessing such as non-spherical-surface process, if necessary) are performed (refer to Japanese Patent Laid-Open No. 10-154657).

However, the above method of making a projection optical system needs the two steps of correcting lower-order aberrations and correcting higher-order aberrations and also computation for light-rays tracing that even super-computer will take several days to perform.

Furthermore, when an aberration (non-linear aberration) occurs by which the linearity of the resist image to the corresponding space image of a pattern is lost, adjusting the projection optical system in view of the order in which aberrations are adjusted is needed. For example, when coma is large, the image of a pattern is not resolved, so that accurate data of distortion, astigmatism and spherical aberration cannot be obtained. Therefore, it is necessary to measure coma using a pattern for accurate measurement of coma and adjust the projection optical system to make the coma small enough and then measure distortion, astigmatism and spherical aberration and, based on the measuring result, adjust the projection optical system. The fact that the order of measuring the aberrations to be adjusted is specified means that the selection of the lenses used is restricted.

In addition, the prior art method uses, regardless of what maker the user of the exposure apparatus is, measurement patterns suitable to measure the respective aberrations by in order to determine the specification of the projection optical system and adjust the optical characteristic, the measurement patterns remarkably responding to the respective aberrations.

Meanwhile, the effects that the aberrations due to the projection optical system have on the imaging characteristic for various patterns are different. For example, contact-hole features are more influenced by astigmatism than by the others while a fine line-and-space pattern is more influenced by coma than by the others. Furthermore, the best focus position is different between an isolated line and line-and-space pattern.

Therefore, the optical characteristic (aberrations, etc.) of the projection optical system and other capabilities of an exposure apparatus actually differ between its users.

DISCLOSURE OF INVENTION

This invention was made under such circumstances, and a first purpose of the present invention is to provide a specification determining method with which it is possible to simplify the process of making a projection optical system according to the determined specification and securely achieve a target that an optical apparatus with the projection optical system is to achieve.

Moreover, a second purpose of the present invention is to provide a projection optical system making method with which it is possible to simplify the process of making a projection optical system and securely achieve a target that an optical apparatus is to achieve.

A third purpose of the present invention is to provide an adjusting method which can accurately and easily adjust the optical characteristic of a projection optical system.

A fourth purpose of the present invention is to provide an exposure apparatus which can accurately transfer a pattern on a mask onto a substrate through the projection optical system and a making method thereof.

Moreover, a fifth purpose of the present invention is to provide a computer system with which it is possible to simplify the process of making a projection optical system according to the determined specification and securely achieve a target that an optical apparatus with the projection optical system is to achieve.

A sixth purpose of the present invention is to provide a computer system which can automatically perform setting of desired exposure conditions for an exposure apparatus.

According to a first aspect of the present invention, there is provided a specification-determining method with which to determine a specification of a projection optical system used in an optical apparatus, said determining method comprising obtaining target information which said optical apparatus is to achieve; and determining, based on said target information, the specification of said projection optical system with using one of a wave-front aberration amount and value corresponding to a wave-front aberration, which said projection optical system is to satisfy, as a standard.

Herein, the value corresponding to a wave-front aberration includes an index of the wave-front aberration such as a Zernike coefficient, etc., and target information means a resolving power, a minimum line width, the wavelength (center wavelength, wavelength width, etc.) of illumination light incident on the projection optical system, information of a pattern subject to projection, other information about the projection optical system which determines the capabilities of the optical apparatus, which information can be a target for the projection optical system.

According to this method, the specification of a projection optical system is determined based on target information which the optical apparatus is to achieve, with using one of a wave-front aberration amount and value corresponding to a wave-front aberration, which the projection optical system is to satisfy, as a standard. That is, the specification of the projection optical system is determined using overall information as a standard, which is information of the wave-front on the pupil plane of the projection optical system and different from the above limited information about light that passes through the pupil plane. Therefore, in making the projection optical system according to the determined specification, higher-order aberrations are simultaneously corrected as well as lower-order aberrations by adjusting the projection optical system based on the result of measuring the wave-front aberration, so that the making process is simplified. Furthermore, a target that an optical apparatus with the projection optical system is to achieve can be securely achieved.

In this case, there are various methods of determining the specification of a projection optical system using a wave-front aberration amount as a standard.

For example, in the determining of said specification, the specification of said projection optical system is determined with using as a standard the coefficient of a specific term selected, based on said target information, from coefficients of terms of a Zernike polynomial in which a wave-front in said projection optical system is expanded.

Alternatively, in the determining of said specification, the specification of said projection optical system is determined with using as a standard the RMS value (Root-mean-square value) of coefficients of terms of a Zernike polynomial in which a wave-front in said projection optical system is expanded such that said RMS value within the entire field of said projection optical system is not over a given limit.

Alternatively, in the determining of said specification, the specification of said projection optical system is determined with using as standards the coefficients of terms of a Zernike polynomial in which a wave-front in said projection optical system is expanded such that said coefficients are not over given respective limits.

Alternatively, in the determining of said specification, the specification of said projection optical system is determined with using as a standard the RMS value, within the field of said projection optical system, of coefficients of n'th order, $m\theta$ terms corresponding to a watched, specific aberration out of coefficients of terms of a Zernike polynomial in which a wave-front in said projection optical system is expanded such that said RMS value is not over a given limit.

Alternatively, in the determining of said specification, the specification of said projection optical system is determined with using as a standard the RMS value, within the field of said projection optical system, of coefficients of each group of $m\theta$ terms having the same $m\theta$ value out of terms, which correspond to a watched, specific aberration, out of terms of a Zernike polynomial in which a wave-front in said projection optical system is expanded such that said RMS value is not over a given respective limit.

Alternatively, in the determining of said specification, the specification of said projection optical system is determined with using as a standard the RMS value of coefficients given by weighting according to said target information the coefficients of terms of a Zernike polynomial in which a wave-front in said projection optical system is expanded such that said RMS value of the weighted coefficients is not over a given limit.

In the specification-determining method according to this invention, said target information may include information of a pattern subject to projection by said projection optical system.

In the specification-determining method according to this invention, said optical apparatus may be an exposure apparatus which transfers a given pattern onto a substrate via said projection optical system.

In the specification-determining method according to this invention, in the determining of said specification, based on information of a pattern subject to projection by said projection optical system, a simulation may be performed that obtains a space image formed on the image plane when said projection optical system projects with said pattern, and said simulation result may be analyzed to determine a limit for wave-front aberration as a standard such that said pattern is transferred finely.

In this case, said simulation may obtain said space image based on linear combinations between sensitivities (Zernike Sensitivity) of coefficients of terms of a Zernike polynomial in which a wave-front in said projection optical system is expanded, to a specific aberration for said pattern as a pattern subject to projection and the coefficients of terms of a Zernike polynomial in which a wave-front in said projection optical system is expanded, said sensitivities depending on said pattern. Here, "sensitivities (Zernike Sensitivity) of coefficients of terms of a Zernike polynomial" means the imaging capability of the projection optical system under given exposure conditions, for example, variation per $1\lambda$ in each of the coefficients of Zernike polynomial's terms corresponding to various aberrations (or their indexes). Herein, the term (Zernike Sensitivity) is used to denote such meaning.

According to a second aspect of the present invention, there is provided a first projection-optical-system making method with which to make a projection optical system used in an optical apparatus, said method comprising determining the specification of said projection optical system according to the specification-determining method of this invention; and adjusting said projection optical system to satisfy said specification.

According to this, the specification of a projection optical system is determined by the specification-determining method based on target information which the optical apparatus is to achieve, with using a wave-front aberration amount, which the projection optical system is to satisfy, as a standard. And the projection optical system is adjusted to satisfy the specification. Therefore, the projection optical system is adjusted to satisfy the specification determined using overall information as a standard, which is information of the wave-front on the pupil plane of the projection optical system and different from the above limited information about light that passes through the pupil plane. Here, higher-order aberrations are adjusted as well as lower-order aberrations, so that the two-step adjustment in the prior art and light-rays tracing for adjustment of higher-order aberrations are not necessary. Therefore, the process of making a projection optical system is simplified. Furthermore, a target that an optical apparatus with the projection optical system is to achieve can be securely achieved.

In the first projection-optical-system making method according to this invention, any of the various methods of determining the specification of a projection optical system using a wave-front aberration amount as a standard can be used. Moreover, in the determining of said specification a simulation may be performed that obtains a space image formed on the image plane when said projection optical system projects with a pattern subject to projection by said projection optical system, and said simulation result may be analyzed to determine a limit for wave-front aberration as a standard such that said pattern is transferred finely. In this case, said simulation may obtain said space image based on linear combinations between sensitivities of coefficients of terms of a Zernike polynomial in which a wave-front in said projection optical system is expanded, to a specific aberration for said pattern as a pattern subject to projection and the coefficients of terms of a Zernike polynomial in which a wave-front in said projection optical system is expanded, said sensitivities depending on said pattern.

In the first projection-optical-system making method according to this invention, said target information may include information of a pattern subject to projection by said projection optical system.

In the first projection-optical-system making method according to this invention, in adjusting said projection optical system, said projection optical system may be adjusted based on a result of measuring a wave-front aberration in said projection optical system so as to satisfy said specification.

Here, "adjusting the projection optical system" means changing the position (or distance from another), tilt, etc., of at least one optical device of the projection optical system and, when the optical device is a lens, changing its eccentricity or rotating it about the optical axis, and replacing individually optical devices of the projection optical system and, when the projection optical system has a plurality of lens barrels, replacing lens barrels as units, and, further, reprocessing at least one optical device of the projection optical system, especially when the optical device is a lens, processing its surface to become non-spherical, if necessary. Herein, the expression "adjusting the projection optical system" is used to denote such meaning.

In this case, said measuring of a wave-front aberration may be performed before installing said projection optical system in the main body of said optical apparatus, or said measuring of a wave-front aberration may be performed after having installed said projection optical system in the main body of said optical apparatus.

In the first projection-optical-system making method according to this invention, said optical apparatus may be an exposure apparatus which transfers a given pattern onto a substrate via said projection optical system.

According to a third aspect of the present invention, there is provided a second projection-optical-system making method with which to make a projection optical system used in an exposure apparatus, said method comprising adjusting said projection optical system according to exposure conditions scheduled to be used such that a best focus position in at least one point of an exposure area within the field of said projection optical system is displaced by a given amount, said exposure area being illuminated with exposure illumination light.

According to this, corresponding to exposure conditions scheduled to be used, the projection optical system is adjusted such that the best focus position in at least one point of an exposure area within the field of the projection optical system is displaced by a given amount, the exposure area being illuminated with exposure illumination light. That is, under certain exposure conditions, the best focus position within the exposure area may deviate due to the aberrations of the projection optical system (e.g. astigmatism, spherical aberration, etc.), so that the depth of focus becomes smaller. According to this invention, the projection optical system is made in which the best focus position in at least one point of an exposure area is corrected according to exposure conditions. Therefore, an exposure apparatus having the projection optical system installed therein can perform exposure under the exposure conditions, where the deviation of the best focus position is greatly reduced and the depth of focus is larger than before.

In this case, said exposure conditions may include an illumination condition that a coherence factor is smaller than 0.5.

In the second projection-optical-system making method according to this invention, said exposure conditions may include use of phase-shift-type masks.

According to a fourth aspect of the present invention, there is provided a first exposure apparatus which transfers a pattern formed on a mask onto a substrate via an exposure optical system, said exposure apparatus comprising a projection optical system made according to one of the first and second making methods of this invention as said exposure optical system.

According to this, when the first exposure apparatus comprises a projection optical system made according to the first making method as the exposure optical system, because in the projection optical system higher-order aberrations have been adjusted as well as lower-order aberrations, it can accurately transfer the pattern of a mask onto a substrate. When the first exposure apparatus comprises a projection optical system made according to the second making method as the exposure optical system, it can perform exposure under the exposure conditions, where the deviation of the best focus position is greatly reduced and the depth of focus is larger than before. Therefore, the first exposure apparatus can perform exposure with high accuracy.

According to a fifth aspect of the present invention, there is provided a method with which to make an exposure apparatus, said method comprising making a projection optical system by using one of the first and second making methods of this invention; and installing said projection optical system in the exposure apparatus main body.

According to a sixth aspect of the present invention, there is provided a first projection-optical-system adjusting method with which to adjust a projection optical system used in an optical apparatus, said adjusting method comprising measuring a wave-front in said projection optical system; and adjusting said projection optical system based on a result of said measuring of a wave-front.

According to this, the projection optical system is adjusted based on the result of measuring the wave-front in the projection optical system. Therefore, the projection optical system is adjusted based on the result of measuring overall information which is information of the wave-front on the pupil plane of the projection optical system and different from the above limited information about light that passes through the pupil plane. Here, higher-order aberrations are adjusted as well as lower-order aberrations with no need to consider the order of aberrations like in the prior art. Therefore, the optical characteristic of the projection optical system can be very accurately and easily adjusted.

In this case, in said adjusting, said projection optical system may be adjusted such that the coefficient of a specific term selected, based on target information, from coefficients of terms of a Zernike polynomial in which a wave-front in said projection optical system is expanded is not over a given limit.

Alternatively, in said adjusting, said projection optical system is adjusted such that the RMS value of coefficients of terms of a Zernike polynomial in which said wave-front within the entire field of said projection optical system is expanded is not over a given limit.

Alternatively, in said adjusting, said projection optical system is adjusted such that the coefficients of terms of a Zernike polynomial in which a wave-front in said projection optical system is expanded are not over given respective limits.

Alternatively, in said adjusting, said projection optical system is adjusted such that the RMS value, within the field of said projection optical system, of coefficients of n'th order, mθ terms corresponding to a watched, specific aberration out of coefficients of terms of a Zernike polynomial in which a wave-front in said projection optical system is expanded is not over a given limit.

Alternatively, in said adjusting, said projection optical system is adjusted such that the RMS value, within the field of said projection optical system, of coefficients of each group of mθ terms having the same mθ value out of terms, which correspond to a watched, specific aberration, out of terms of a Zernike polynomial in which a wave-front in said projection optical system is expanded is not over a given respective limit.

When the first projection-optical-system adjusting method according to this invention further comprises obtaining information of a pattern subject to projection in said projection optical system, said projection optical system, in said adjusting, may be adjusted based on a space image of said pattern calculated based on linear combinations between sensitivities (Zernike Sensitivity), to a watched aberration, of coefficients of terms of a Zernike polynomial in which a wave-front in said projection optical system is expanded and the coefficients of terms of a Zernike polynomial in which a wave-front measured in said projection optical system is expanded, such that said watched aberration is not over a limit, said sensitivities depending on said pattern.

When the first projection-optical-system adjusting method according to this invention further comprises obtaining target information that said optical apparatus is to achieve, said projection optical system, in said adjusting, may be adjusted such that the RMS value of coefficients given by weighting according to said target information the coefficients of terms of a Zernike polynomial in which a wave-front in said projection optical system is expanded is not over a given limit.

In this case, said target information may include information of a pattern subject to projection by said projection optical system.

In the first projection-optical-system adjusting method according to this invention, various methods may be used to measure the wave-front; for example, in measuring said wave-front, a wave-front in said projection optical system may be measured based on a result of printing a given pattern on a wafer via a pinhole and said projection optical system, or a wave-front in said projection optical system may be measured based on a space image formed via a pinhole and said projection optical system.

According to a seventh aspect of the present invention, there is provided a second projection-optical-system adjusting method with which to adjust a projection optical system used in an exposure apparatus, said adjusting method comprising performing, when setting exposure conditions that a phase-shift mask is used with a coherence factor of smaller than 0.5 as an illumination condition, prior focus correction that displaces a best focus position in at least one point of an exposure area within the field of said projection optical system by a given amount, said exposure area being illuminated with exposure illumination light.

According to this, when setting exposure conditions that a phase-shift mask is used with a coherence factor of smaller than 0.5 as an illumination condition, prior focus correction is performed that displaces a best focus position in at least one point of an exposure area within the field of the projection optical system by a given amount, the exposure area being illuminated with exposure illumination light. Therefore, the projection optical system can perform exposure under the exposure conditions, where the deviation of the best focus position is greatly reduced and the depth of focus is larger than before.

In this case, although the phase-shift mask may be of a half-tone type or of another type, said phase-shift mask is preferably a space-frequency-modulation type of phase-shift mask.

In the second projection-optical-system adjusting method according to this invention, said prior focus correction may be implemented by adjusting an aberration in said projection optical system.

According to an eighth aspect of the present invention, there is provided a second exposure apparatus which transfers a given pattern onto a substrate via a projection optical system, said exposure apparatus comprising a wave-front measuring unit that measures a wave-front in said projection optical system; an adjusting unit that adjusts a state of an image of said pattern formed by said projection optical system; and a controller that controls said adjusting unit using a result of said wave-front measuring unit measuring a wave-front.

According to this, a wave-front measuring unit measures a wave-front in the projection optical system, and a controller controls an adjusting unit using the result of measuring the wave-front that provides overall information about light passing through the pupil plane of the projection optical system. Therefore, because the state of the image of the pattern formed by the projection optical system is automatically adjusted based on the result of measuring the wave-front, the projection optical system can accurately transfer the pattern onto a substrate.

In this case, the construction of the adjusting unit does not matter as long as it can adjust the state of the image of the pattern formed by the projection optical system. For example, said adjusting unit may comprise an imaging-characteristic adjusting mechanism that adjusts the imaging-characteristic of said projection optical system.

In the second exposure apparatus according to this invention, said controller may control said imaging-characteristic adjusting mechanism based on a space image of said pattern calculated based on linear combinations between sensitivities (Zernike Sensitivity), to a watched aberration, of coefficients of terms of a Zernike polynomial in which a wave-front in said projection optical system is expanded and the coefficients of terms of a Zernike polynomial in which a wave-front measured in said projection optical system is expanded, such that said watched aberration is not over a limit, said sensitivities depending on said pattern.

According to a ninth aspect of the present invention, there is provided a first computer system comprising a first computer into which target information that an optical apparatus is to achieve is inputted; and a second computer which is connected to said first computer via a communication path and determines the specification of a projection optical system used in said optical apparatus based on said target information received from said first computer via said communication path with using one of a wave-front aberration amount and value corresponding to a wave-front aberration, which said projection optical system is to satisfy, as a standard.

According to this, target information that an optical apparatus is to achieve is inputted into a first computer, and a second computer determines the specification of a projection optical system based on the target information received from the first computer via the communication path with using one of a wave-front aberration amount and value corresponding to a wave-front aberration, which the projection optical system is to satisfy, as a standard. That is, the specification of the projection optical system is determined using overall information as a standard, which is information of the wave-front on the pupil plane of the projection optical system and different from the above limited information about light that passes through the pupil plane. Therefore, in making the projection optical system according to the determined specification, higher-order aberrations are simultaneously corrected as well as lower-order aberrations by adjusting the projection optical system based on the result of measuring the wave-front aberration, so that the making process is simplified. Furthermore, a target that an optical apparatus with the projection optical system is to achieve can be securely achieved.

In this case, when said target information includes information of a pattern subject to projection by said projection optical system, said second computer may perform a simulation that obtains a space image formed on the image plane when said projection optical system projects with said pattern, based on said pattern information, and analyze said simulation result to determine a limit for wave-front aberration in said projection optical system as a standard such that said pattern is transferred finely.

In this case, said second computer may obtain said space image based on linear combinations between sensitivities of coefficients of terms of a Zernike polynomial in which a wave-front in said projection optical system is expanded, to a specific aberration for said pattern as a pattern subject to projection and the coefficients of terms of a Zernike polynomial in which a wave-front in said projection optical system is expanded, said sensitivities depending on said pattern.

In the first computer system according to this invention, said optical apparatus may be, among various apparatuses, an exposure apparatus which transfers a given pattern onto a substrate via said projection optical system.

According to a tenth aspect of the present invention, there is provided a second computer system comprising a first computer which is connected to an exposure apparatus main body which transfers a given pattern onto a substrate via a projection optical system; and a second computer which is connected to said first computer via a communication path, performs a simulation that obtains a space image formed on the image plane when said projection optical system projects with said pattern, based on information of said pattern received from said first computer via said communication path and known aberration information of said projection optical system, and analyzes said simulation result to determine best exposure conditions.

According to this, a second computer performs a simulation that obtains a space image formed on the image plane when the projection optical system projects with the pattern, based on information of the pattern received from the first computer via the communication path and known aberration information of the projection optical system, and analyzes the simulation result to determine best exposure conditions. Therefore, optimum exposure conditions can be set almost automatically.

In this case, said pattern information may be part of exposure conditions that are inputted into said first computer, or, when the computer system further comprises a reading-in unit that reads in said pattern information recorded on a mask on a path on which said mask is transported to said exposure apparatus main body, said pattern information may be inputted into said first computer via said reading-in unit.

In the second computer system according to this invention, said second computer may send said best exposure conditions determined to said first computer via said communication path.

In this case, said first computer may set exposure conditions of said exposure apparatus main body to said best exposure conditions.

In the second computer system according to this invention, said second computer may obtain said space image based on linear combinations between sensitivities (Zernike Sensitivity) of coefficients of terms of a Zernike polynomial in which a wave-front in said projection optical system is expanded, to a specific aberration for said pattern as a pattern subject to projection and the coefficients of terms of a Zernike polynomial in which a wave-front in said projection optical system is expanded, which wave-front is obtained based on a result, sent by said first computer via said communication path, of measuring a wave-front in said projection optical system, said sensitivities depending on said pattern.

In this case, said result of measuring a wave-front may be inputted into said first computer, or, when the computer system further comprises a wave-front measuring unit that measures a wave-front in said projection optical system, said first computer itself may obtain said result of measuring a wave-front from said wave-front measuring unit.

In the second computer system according to this invention, said best exposure conditions may include, among various things, information of a pattern suitable for exposure by said exposure apparatus main body, or said best exposure conditions may include at least one of an illumination condition for transferring a given pattern and numerical aperture of said projection optical system.

Further, said best exposure conditions may include specification of aberration due to said projection optical system upon transferring said given pattern. In this case, when the computer system further comprises an imaging-characteristic adjusting mechanism that adjusts the imaging-characteristic of said projection optical system provided in said exposure apparatus main body connected to said second computer via said communication path, said second computer may control said imaging-characteristic adjusting mechanism, based on said best exposure conditions determined, to adjust the imaging-characteristic of said projection optical system.

According to an eleventh aspect of the present invention, there is provided a third computer system comprising a first computer which is connected to an exposure apparatus main body having a projection optical system that projects an image of a given pattern onto a substrate; an adjusting unit which adjusts a state of an image of said pattern formed by said projection optical system; and a second computer which is connected to said first computer via a communication path, wherein said second computer calculates control information with which to control said adjusting unit, using a result of measuring a wave-front in said projection optical system, which result has been received from said first computer via said communication path, and wherein one of said first and second computers controls said adjusting unit based on said control information.

According to this, a first computer sends the result of measuring a wave-front in the projection optical system to a second computer through a communication path. And the second computer calculates control information with which to control the adjusting unit, using a result of measuring a wave-front in the projection optical system, which result has been received from the first computer via the communication path, and one of the first and second computers controls the adjusting unit based on the control information. Therefore, the state of an image of said pattern formed by said projection optical system is accurately adjusted using the information of the wave-front on the pupil plane of the projection optical system, that is, overall information about light passing through the pupil plane. In this case, the second computer can be placed remote from the exposure apparatus main body and the first computer connected thereto, in which case the remote system calculates control information with which to control the adjusting unit, and the state of the image of the pattern formed by the projection optical system can be very accurately adjusted based on the control information.

In the third computer system according to this invention, said result of measuring a wave-front is inputted into said first computer, or, when the computer system further comprises a wave-front measuring unit that measures a wave-front in said projection optical system, said first computer itself may obtain said result of measuring a wave-front from said wave-front measuring unit. In the latter case, the first computer connected to the exposure apparatus main body measures a wave-front in said projection optical system by using a wave-front measuring unit in a so-called self-measuring manner, and the state of an image of said pattern formed by said projection optical system is almost automatically and accurately adjusted.

In the third computer system according to this invention, the construction of the adjusting unit does not matter as long as it can adjust the state of the image of the pattern formed by the projection optical system. For example, said adjusting unit may comprise an imaging-characteristic adjusting mechanism that adjusts the imaging-characteristic of said projection optical system.

In this case, said first computer may send information of said pattern used in said exposure apparatus main body to said second computer via said communication path, and said second computer may obtain a space image formed on the image plane when said projection optical system projects said pattern by a simulation based on said pattern information and said result of measuring a wave-front, calculates a limit for a watched aberration due to said projection optical system at which said space image is finely formed, and calculate control information with which to control said imaging-characteristic adjusting mechanism such that said watched aberration due to said projection optical system is not over said limit.

In this case, said second computer may calculate a space image of said pattern based on linear combinations between sensitivities (Zernike Sensitivity), to a watched aberration, of coefficients of terms of a Zernike polynomial in which a wave-front in said projection optical system is expanded and the coefficients of terms of a Zernike polynomial in which a wave-front measured in said projection optical system is expanded, said sensitivities depending on said pattern.

In the third computer system according to this invention, only one exposure apparatus main body and only one first computer connected thereto may be provided, or, when a plurality of sets of said exposure apparatus main body and said first computer are provided, and said exposure apparatus main bodies each have said adjusting unit, said second computer may be connected via said communication path to at least one of the set of said plural first computers and the set of said plural adjusting units.

In the first, second, and third computer systems according to this invention, various things can be used as the communication path. That is, said communication path may be a local area network, or said communication path may include a public telephone line, or said communication path may include a radio line.

In addition, in a lithography process, by one of the first and second exposure apparatuses according to this invention performing exposure, patterns can be accurately formed on a substrate, and highly integrated micro-devices can be manufactured with high yield. Therefore, according to another aspect of the present invention, there is provided a device manufacturing method using one of the first and second exposure apparatuses (i.e., a device manufacturing method comprising the step of transferring a pattern onto a photosensitive object by using one of the first and second exposure apparatuses).

DETAILED DESCRIPTION OF THE PREFERRED EMBODIMENTS

An embodiment of the present invention will be described below based on FIGS. 1 to 11.

Figure 1:
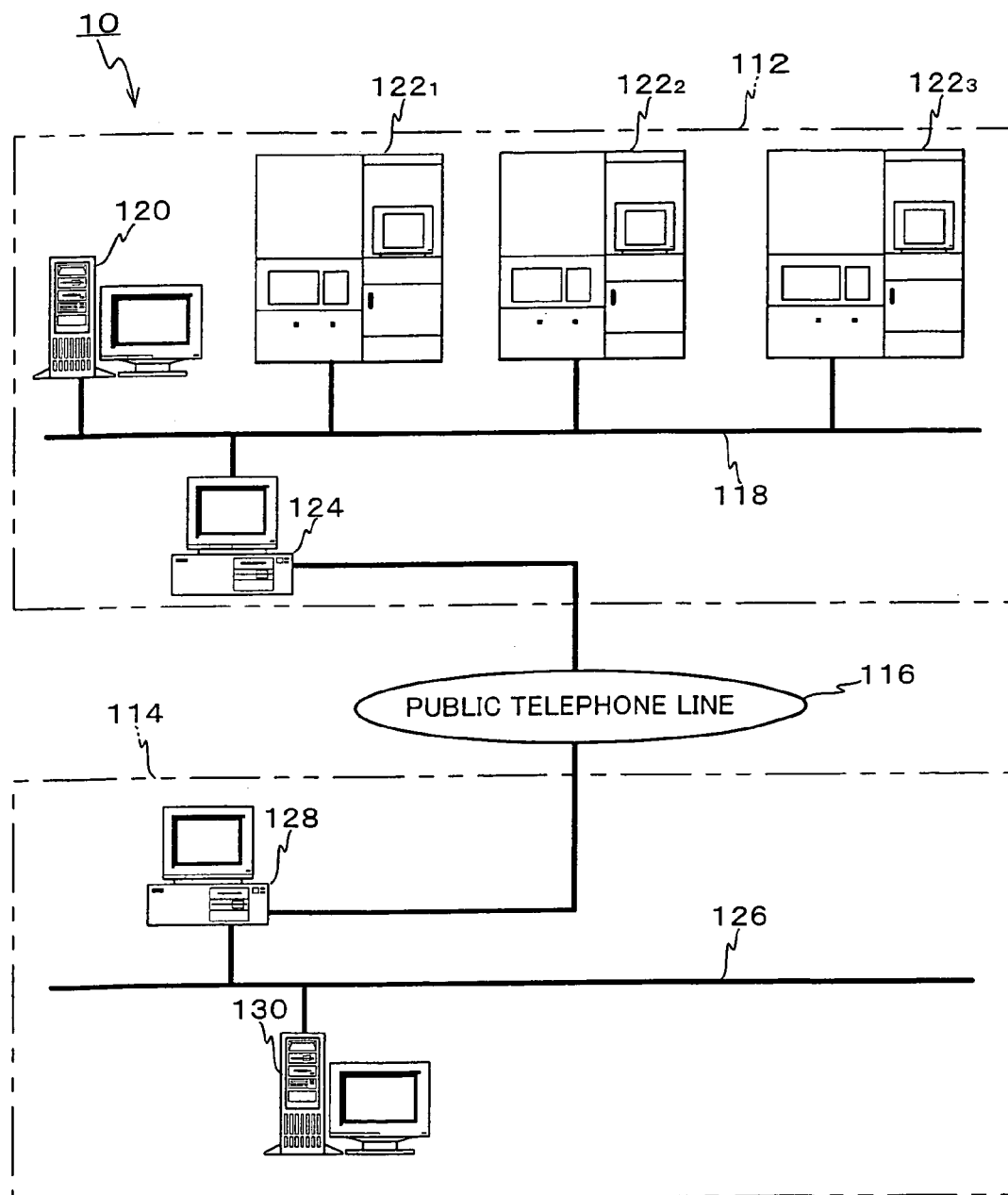
FIG. 1 is a schematic view showing the construction of a computer system according to an embodiment of this invention.

FIG. 1 shows the schematic construction of a computer system according to an embodiment of this invention.

A computer system 10 shown in FIG. 1 comprises a lithography system 112 in a semiconductors-manufacturing factory of a device maker (hereinafter, called "maker A" as needed), which is a user of a device manufacturing apparatus such as an exposure apparatus, and a computer system 114 of an exposure apparatus maker (hereinafter, called "maker B" as needed) connected via a communication line including the public telephone line 116 to part of the lithography system 112.

The lithography system 112 comprises a communication server 120 as a first computer, a first, second and third exposure apparatuses 122$_1$, 122$_2$, 122$_3$ as optical apparatuses, and a first proxy server 124 for verification, all of which are connected with each other via a local area network (LAN) 118.

The communication server 120 and a first through third exposure apparatuses 122$_1$, 122$_2$, 122$_3$ are assigned addresses AD1 through AD4 with which to distinguish them respectively.

The first proxy server 124 is provided between the LAN 118 and the public telephone line 116 and serves as a kind of firewall. That is, the first proxy server 124 prevents communication data flowing through the LAN 118 from leaking to the outside, allows only information from the outside having one of the addresses AD1 through AD4 to pass through it and blocks the passage of other information, so that the LAN 118 is protected against unjust invasion from the outside.

The computer system 114 comprises a second proxy server 128 for verification, a second communication server 130 as a second computer and the like, all of which are connected with each other via a local area network (LAN) 126. The second communication server 130 is assigned an address AD5 with which to identify it.

The second proxy server 128, in the same way as the first proxy server 124, prevents communication data flowing through the LAN 126 from leaking to the outside and serves as a kind of firewall that protects the LAN 126 against unjust invasion from the outside.

In this embodiment, data from the first through third exposure apparatuses 122$_1$, 122$_2$, 122$_3$ is transferred to the outside via the first communication server 120 and the first proxy server 124, and data to the first through third exposure apparatuses 122$_1$, 122$_2$, 122$_3$ is transferred from the outside via the first proxy server 124 or via the first proxy server 124 and the first communication server 120.

Figure 2:
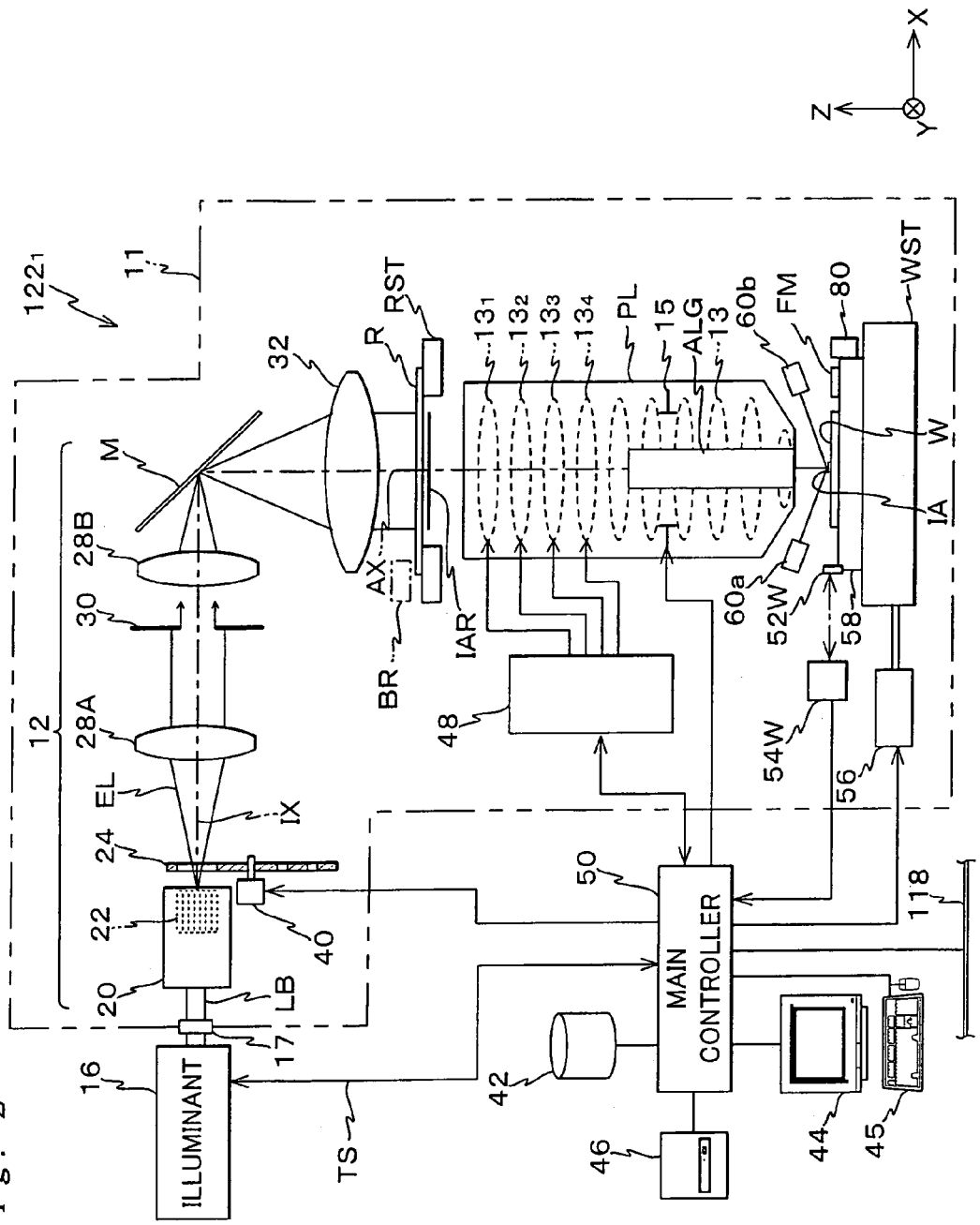
FIG. 2 is a schematic view showing the construction of a first exposure apparatus $122_1$ in FIG. 1.

FIG. 2 shows the schematic construction of the first exposure apparatus 122$_1$, which is a reduction projection exposure apparatus of a step-and-repeat type, i.e. a stepper, using a pulse-laser light source as an exposure light source (hereinafter, called a "light source").

The exposure apparatus 122$_1$ comprises an illumination system composed of a light source 16 and illumination optical system 12, a reticle stage RST as a mask stage holding a reticle R as a mask illuminated with exposure illumination light EL as an energy beam from the illumination system, a projection optical system PL as an exposure optical system, which projects exposure illumination light EL from the reticle R onto a wafer W as a substrate which is on the image plane, a wafer stage WST on which a Z-tilt stage 58 for holding the wafer W is mounted, and a control system for controlling these.

The light source 16 is a pulse-ultraviolet light source that emits pulse light having a wavelength in the vacuum-ultraviolet range such as $F_2$ laser (a wavelength of 157 nm) or ArF laser (a wavelength of 193 nm). Alternatively the light source 16 may be a light source that emits pulse light having a wavelength in the far-ultraviolet or ultraviolet range such as KrF excimer laser (a wavelength of 248 nm).

The light source 16 is disposed, in practice, in a service room having low cleanliness that is separate from a clean room where a chamber 11 housing an exposure-apparatus main body composed of various elements of the illumination optical system 12, the reticle stage RST, the projection optical system PL, the wafer stage WST, etc., is disposed, and is connected to the chamber 11 via a light-transmitting optical system (not shown) including at least part of an optical-axis adjusting optical system called a beam-matching unit. The light source 16 is controlled by an internal controller thereof according to control-information TS from a main controller 50 in terms of switching the output of laser beam LB, the energy of laser beam LB per pulse, output-frequency (pulse frequency), the center wavelength and half band width in spectrum (width of the wavelength range) and the like.

The illumination optical system 12 comprises a cylinder lens, a beam expander (none are shown), a beam-shaping, illuminance-uniformalizing optical system 20 having an optical integrator (homogenizer) 22 therein, an illumination-system aperture stop plate 24, a first relay lens 28A, a second relay lens 28B, a reticle blind 30, a mirror M for deflecting the optical path, and a condenser lens 32. The optical integrator is a fly-eye lens, a rod-integrator (inner-side-reflective-type integrator) or a diffracting optical device. In this embodiment a fly-eye lens is used as the optical integrator 22, which is also referred to as a fly-eye lens 22.

The beam-shaping, illuminance-uniformalizing optical system 20 is connected through a light transmission window 17 provided on the chamber 11 to the light-transmitting optical system (not shown), and gets the cross section of laser beam LB, which is incident thereon through the light transmission window 17 from the light source 16, to be shaped by the cylinder lens or beam expander, for example. The fly-eye lens 22 in the exit side of the beam-shaping, illuminance-uniformalizing optical system 20 forms, from the laser beam having its cross-section shaped, a surface illuminant (secondary illuminant) composed of a lot of point illuminants (illuminant images) on the focal plane on the output side, which plane substantially coincides with the pupil plane of the illumination optical system 12 in order to illuminate the reticle R with uniform illuminace. The laser beam emitted from the secondary illuminant is called "illumination light EL" hereinafter.

The illumination-system aperture stop plate 24 constituted by a disk-like member is disposed near the focal plane on the exit side of the fly-eye lens 22. And arranged at almost regular pitches along a circle on the illumination-system aperture stop plate 24 are, e.g., a usual aperture stop (usual stop) constituted by a circular opening, a aperture stop (small-σ stop) for making coherence factor σ small which is constituted by a small, circular opening, a ring-like aperture stop (ring stop) for forming a ring of illumination light, and a deformation aperture stop for a deformation illuminant method composed of a plurality of openings arranged eccentrically, of which two types of aperture stops are shown in FIG. 1. The illumination-system aperture stop plate 24 is constructed and arranged to be rotated by a driving unit 40 such as a motor controlled by the main controller 50, and one of the aperture stops is selectively set to be on the optical path of the illumination light EL, so that the shape of the illuminant surface in Koehler illumination described later is a ring, a small circle, a large circle, four eyes or the like.

Instead of the aperture stop plate 24 or in combination with it, for example, a plurality of diffracting optical devices disposed in the illumination optical system, a movable prism (conical prism, polyhedron prism, etc.) along the optical axis of the illumination optical system, and an optical unit comprising at least one zoom optical system are preferably arranged between the light source 16 and the optical integrator 22, and by making variable, when the optical integrator 22 is a fly-eye lens, the intensity distribution of the illumination light on the incidence surface thereof or, when the optical integrator 22 is an inner-face-reflective-type integrator, the range of incidence angle of the illumination light to the incidence surface, light-amount distribution (the size and shape of the secondary illuminant) of the illumination light on the pupil plane of the illumination optical system is preferably adjusted, that is, loss of light due to the change of conditions for illuminating the reticle R is preferably suppressed. It is noted that in this embodiment a plurality of illuminant images (virtual images) formed by the inner-face-reflective-type integrator are also referred to as a secondary illuminant.

Disposed on the optical path of the illumination light EL from the illumination-system aperture stop plate 24 is a relay optical system composed of the first and second relay lenses 28A, 28B, between which the reticle blind 30 is disposed. The reticle blind 30, in which a rectangular opening for defining a rectangular illumination area IAR on the reticle R is made, is disposed on a plane conjugate to the pattern surface of the reticle R, and is a blind whose opening is variable in shape and set by the main controller 50 based on blind-setting information also called masking information.

Disposed on the optical path of the illumination light EL behind the second relay lens 28B forming part of the relay optical system is the deflecting mirror M for reflecting the illumination light EL having passed through the second relay lens 28B toward the reticle R, and on the optical path of the illumination light EL behind the mirror M, the condenser lens 32 is disposed.

In the construction described above, the incidence surface of the fly-eye lens 22, the plane on which the reticle blind 30 is disposed, and the pattern surface of the reticle R are optically conjugate to each other, while the illuminant surface formed on the focal plane on the exit side of the fly-eye lens 22 (the pupil plane of the illumination optical system) and the Fourier transform plane of the projection optical system PL (the exit pupil plane) are optically conjugate to each other, and these form a Koehler illumination system.

The operation of the illumination optical system having the above construction will be described briefly in the following. The laser beam LB emitted in pulse out of the light source 16 is made incident on the beam-shaping, illuminance-uniformalizing optical system 20 which shapes the cross section thereof, and then is made incident on the fly-eye lens 22. By this, the secondary illuminant is formed on the focal plane on the exit side of the fly-eye lens 22.

The illumination light EL emitted out of the secondary illuminant passes through an aperture stop on the illumination-system aperture stop plate 24, the first relay lens 28A, the rectangular aperture of the reticle blind 30, and the second relay lens 28B in that order and then is deflected vertically and toward below by the mirror M and, after passing through the condenser lens 32, illuminates the rectangular illumination area IAR on the reticle R held on the reticle stage RST.

A reticle R is loaded onto the reticle stage RST and is held by electrostatic chuck, vacuum chuck or the like (not shown). The reticle stage RST is constructed to be able to be finely driven (including rotation) on a horizontal plane (an X-Y plane) by a driving system (not shown). It is remarked that the position of the reticle stage RST is measured by a position detector such as a reticle laser interferometer with given resolving power of, e.g., 0.5 to 1 nm to supply the measurement results to the main controller 50.

It is noted that the material for the reticle R depends on the light source used. That is, when ArF excimer laser or KrF excimer laser is used as the light source, synthetic quartz, fluoride crystal such as fluorite, fluorine-doped quartz or the like can be used while, when $F_2$ laser is used as the light source, fluoride crystal such as fluorite, fluorine-doped quartz or the like needs to be used.

The projection optical system PL is, for example, a reduction system that is telecentric bilaterally, and the projection magnification of the projection optical system PL is, e.g., ¼, ⅕ or ⅙. Therefore, when the illumination area IAR on the reticle R is illuminated with the illumination light EL as is described above, the image of the pattern on the reticle R is reduced to the projection magnification times the original size and projected and transferred by the projection optical system PL onto a rectangular area IA on a wafer W coated with a resist (photosensitive material), which area IA usually coincides with a shot area.

The projection optical system PL is a refractive system composed of a plurality of refracting optical devices 13 (lens devices), e.g. about 10 to 20 ones, as shown in FIG. 2. A plurality of lens devices $13_1$, $13_2$, $13_3$, $13_4$ (considering four ones for the sake of brief description) in the object-plane side (reticle R side) of the projection optical system PL out of the plurality of lens devices 13 are movable lenses that can be driven by an imaging-characteristic correcting controller 48. The lens devices $13_1$, through $13_4$ are held in a lens-barrel via double-structured lens holders (not shown) respectively. The lens devices $13_1$, $13_2$, $13_4$ of these are held by inner lens holders each of which is supported at three points against a respective outer lens holder by driving devices such as piezo devices (not shown). By independently adjusting the voltages applied to the driving devices, the lens devices $13_1$, $13_2$, $13_4$ can be shifted in a Z-direction, the optical axis direction of the projection optical system PL and tilted relative to the X-Y plane, that is, rotated about the X- and Y-axes. The lens device $13_3$ is held by an inner lens holder (not shown), and between the outer-circle side face of the inner lens holder and the inner-circle side face of the outer lens holder, driving devices such as piezo devices are disposed at almost regular pitches each of which covers an angle of, e.g., 90 degrees. And adjusting the voltages applied to two opposite driving devices the lens device $13_3$ can be shifted two-dimensionally in the X-Y plane.

The other lens devices 13 are held in the lens-barrel via a usual lens holder. It is noted that not being limited to the lens devices $13_1$ through $13_4$, lenses near the pupil plane, or in the image plane side, of the projection optical system PL or an aberration-correcting plate (optical plate) for correcting the projection optical system PL in terms of aberration, especially clockwise asymmetric component thereof, may be constructed to be able to be driven. Furthermore, the degree of freedom of those optical devices (the number of directions in which to be movable) may be one or more than three, not being limited to two or three.

Moreover, near the pupil plane of the projection optical system PL, an aperture stop 15 whose numerical aperture (N.A.) is variable continuously in a predetermined range is disposed, is a so-called iris aperture stop, for example, and is controlled by the main controller 50.

It is noted that the material for the lens devices of the projection optical system PL is fluoride crystal such as fluorite, fluorine-doped quartz, synthetic quartz, or the like when ArF excimer laser or KrF excimer laser is used as the illumination light EL or, when $F_2$ laser is used, fluoride crystal such as fluorite or fluorine-doped quartz.

The wafer stage WST is constructed to be driven freely on the X-Y two-dimensional plane by a wafer-stage driving portion 56 including a linear motor, and on a Z-tilt stage 58 mounted on the wafer stage WST, a wafer W is held via a wafer holder (not shown) by electrostatic chuck, vacuum chuck or the like.

Furthermore, the Z-tilt stage 58 is constructed to be able to be positioned in the X-Y plane on the wafer stage WST and to be tilted relative to the X-Y plane as well as to be movable in the Z-direction so that the surface of a wafer W held on the Z-tilt stage 58 can be set at a specified position (position in the Z-direction and tilt to the X-Y plane).

Moreover, fixed on the Z-tilt stage 58 is a movable mirror 52W, through which a wafer laser interferometer 54W externally disposed measures the position in the X- and Y-directions and $\theta_Z$ direction (counterclockwise about the Z-axis) of the Z-tilt stage 58, and position information measured by the wafer laser interferometer 54W is supplied to the main controller 50, which controls the wafer stage WST (and the Z-tilt stage 58) based on the position information via the wafer-stage driving portion 56 including the driving systems of the wafer stage WST and the Z-tilt stage 58.

A reference mark plate FM having reference marks including one for base-line measurement is disposed on the Z-tilt stage 58 such that the surface thereof substantially coincides in height with the surface of the wafer W.

A wave-front-aberration measuring unit 80 that is attachable and detachable and portable is disposed on the side face in the +X direction of the Z-tilt stage 58 (right side of the drawing of FIG. 2).

Figure 3:
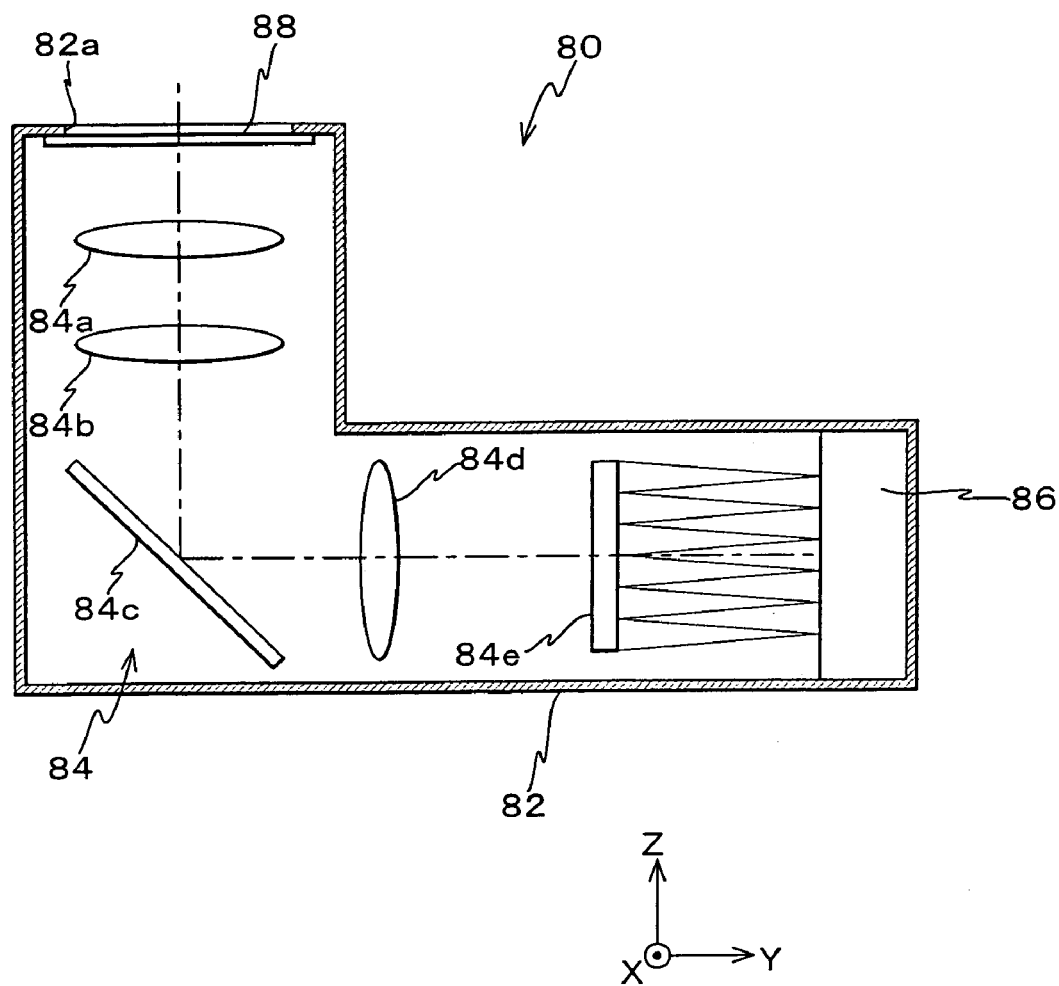
FIG. 3 is a cross-sectional view of an exemplary wave-front-aberration measuring unit.

The wave-front-aberration measuring unit 80, as shown in FIG. 3, comprises a housing 82, a light-receiving optical system 84 composed of a plurality of optical devices arranged in a predetermined positional relation in the housing 82, and a light-receiving portion 86 arranged in the end in the +Y direction of the housing 82.

The cross section along the Y-Z plane of the housing 82 having a space therein is shaped like an "L", and in the topside (in the +Z direction) thereof, an opening 82a which is circular in a plan view is made so that light from above the housing 82 can be made incident through it. Furthermore, a cover glass 88 is provided so as to cover the opening 82a from inside the housing 82. Formed on the upper surface of the cover glass 88 by deposition of metal such as chrome is a shielding membrane having a circular opening in the center thereof, which stops unnecessary light from entering the light-receiving optical system 84 in measuring wavefront aberration due to the projection optical system PL.

The light-receiving optical system 84 comprises an objective lens 84a, a relay lens 84b, and a deflecting mirror 84c, which are arranged in that order from under the cover glass 88 in the housing 82, and a collimator lens 84d and a micro-lens array 84e, which are arranged in that order on the +Y side of the deflecting mirror 84c. The deflecting mirror 84c is fixed to make an angle of 45 degrees with the Z- and Y-directions so that light incident vertically from above on the objective lens 84a is deflected toward the collimator lens 84d. It is noted that the optical elements of the light-receiving optical system 84 are fixed to the inner wall of the housing 82 via holding members (not shown). The micro-lens array 84e has a plurality of small convex lenses (lens devices) arranged in an array on a plane perpendicular to the optical path.

The light-receiving portion 86 comprises a light-receiving device such as two-dimensional CCD and an electric circuit such as a charge-transfer controlling circuit. The light-receiving device has a size enough to receive all rays of light sent from the micro-lens array 84e after having passed through the objective lens 84a. Data measured by the light-receiving portion 86 is sent to the main controller 50 via a signal line (not shown) or by radio.

The wave-front-aberration measuring unit 80 can measure the wave-front aberration due to the projection optical system PL while the projection optical system PL is fixed in the exposure-apparatus main body. The method of measuring the wave-front aberration due to the projection optical system PL by using the wave-front-aberration measuring unit 80 will be described later.

Referring back to FIG. 2, the exposure apparatus $122_1$ further comprises an oblique incidence type of multi-focus-position detection system composed of a light source switched by the main controller 50, an illumination system 60a for sending out imaging beams, which form a lot of pinhole or slit images, toward the image plane of the projection optical system PL and in an oblique direction to the optical axis AX, and a light-receiving system 60b for receiving the imaging beams reflected by the surface of the wafer W, the multi-focus-position detection system being simply called a "focus detection system" hereinafter. The focus detection system (60a, 60b) has the same construction as is disclosed in, for example, Japanese Patent Laid-Open No. 6-283403 and U.S. Pat. No. 5,448,332 corresponding thereto. The disclosure in the above U.S. Patent is incorporated herein by reference as long as the national laws in designated states or elected states, to which this international application is applied, permit.

The main controller 50, upon exposure and the like, controls the Z-position and the tilt relative to the X-Y plane of the wafer W via the wafer-stage driving portion 56 based on the focus deviation signal (defocus signal) such as an S-curve signal from the light-receiving system 60b such that the focus deviation becomes zero, by which auto-focus and auto-leveling are performed. Furthermore, the main controller 50 measures the Z-position of the wave-front-aberration measuring unit 80 and positions it by using the focus detection system (60a, 60b) when measuring the wave-front aberration as described later. Here, the tilt of the wave-front-aberration measuring unit 80 may also be measured, if necessary.

The exposure apparatus $122_1$ further comprises an alignment system ALG of an off-axis type for measuring the positions of, e.g., alignment marks on a wafer W held on the wafer stage WST and the reference mark formed on the reference mark plate FM. The alignment system ALG is an FIA (Field Image Alignment) sensor of an image-processing type which directs, e.g., a detection beam whose frequency band is broad for resist on the wafer not to sense to a target mark and which picks up images of the target mark formed on the receiving plane by the beam reflected from the target mark and an index (not shown), by a pick-up device (CCD, etc.) with outputting the pick-up signals thereof. Not being limited to the FIA system, an alignment sensor which directs a coherent detection beam to a target mark and detects the beam scattered or diffracted from the target mark or an alignment sensor which detects the interference of two order sub-beams (e.g., of the same order) diffracted from the target mark or the combination of the two may be used, needless to say.

Moreover, above the reticle R in the exposure apparatus $122_1$ of this embodiment, a pair of reticle alignment microscopes (not shown) each constituted by a TTR (Through The Reticle) alignment optical system for simultaneously observing a reticle mark on the reticle R and a corresponding reference mark on the reference mark plate through the projection optical system PL using light having the same wavelength as exposure light are provided. The reticle alignment microscope has the same construction as is disclosed in, for example, Japanese Patent Laid-Open No. 7-176468 and U.S. Pat. No. 5,646,413 corresponding thereto. The disclosure in the above U.S. Patent is incorporated herein by reference as long as the national laws in designated states or elected states, to which this international application is applied, permit.

The control system includes the main controller 50 in FIG. 2 which is constituted by a work station (or microcomputer) comprising a CPU (Central Processing Unit), ROM (Read Only Memory), RAM (Random Access Memory), etc., and which controls the entire apparatus overall as well as the above operations. The main controller 50 controls between-shots stepping of the wafer stage, exposure timing and the like overall.

Furthermore, for example, a storage unit 42 constituted by hard disks, an input unit 45 comprising a pointing-device such as the mouse, a display unit 44 such as a CRT display or liquid-crystal display, and a drive unit for information-recording media such as CD-ROM, DVD-ROM, MO, FD, etc., are externally connected to the main controller 50. And the main controller 50 is connected with the LAN 118.

An information-recording medium provided in the drive unit 46 (hereinafter, CD-ROM for the sake of convenience) stores a conversion program (hereinafter, called a "first program" for the sake of convenience) for converting position deviations measured by the wave-front-aberration measuring unit 80 as described later into coefficients of the Zernike polynomial.

The second and third exposure apparatuses $122_2$, $122_3$ have the same construction as the exposure apparatus $122_1$.

Next, the method of measuring wave-front-aberration in the exposure apparatus $122_1$ through $122_3$ upon maintenance, etc., will be described assuming for the sake of simplicity that the wave-front-aberration due to the light-receiving optical system 84 of the wave-front-aberration measuring unit 80 is negligible.

As a premise, it is supposed that the first program of the CD-ROM in the driving unit 46 has been installed in the storage unit 42.

Upon usual exposure operation, because the wave-front-aberration measuring unit 80 is detached from the Z-tilt stage 58, a service engineer, operator or the like (hereinafter, called "service engineer, etc.," as needed) first attaches the wave-front-aberration measuring unit 80 to the side face of the Z-tilt stage 58. Here, the wave-front-aberration measuring unit 80 is fixed on a predetermined reference surface (herein, the side face in the +X direction) by bolts, magnets or the like, so that the wave-front-aberration measuring unit 80 can be put in place within the stroke distance of the wafer stage WST (the Z-tilt stage 58) when measuring the wave-front-aberration.

After the completion of the attaching, the main controller 50, according to a measurement-start command inputted by the service engineer, etc., moves the wafer stage WST via the wafer-stage driving portion 56 such that the wave-front-aberration measuring unit 80 is put underneath the alignment system ALG, detects an alignment mark (not shown) provided on the wave-front-aberration measuring unit 80 by the alignment system ALG, and, based on the detection result and values measured at the same time by the laser interferometer 54W, calculates the position coordinates of the alignment mark to obtain the accurate position of the wave-front-aberration measuring unit 80. And after the measuring of the wave-front-aberration measuring unit 80's position, the main controller 50 measures the wave-front-aberration in the manner described below.

The main controller 50 loads a measurement reticle, on which pinhole features are formed, (not shown; called a "pinhole reticle" hereinafter) onto the reticle stage RST by a reticle loader (not shown). The pinhole reticle is one on the pattern surface of which pinholes are formed in a plurality of points within an area identical to the illumination area IAR, each of the pinholes being an ideal point illuminant and producing a spherical wave.

It is noted that a diffusion plate, for example, is provided on the upper surface of the pinhole reticle so that the wave front of the beam passing through the projection optical system PL and the wave-front-aberration can be measured for all N.A.'s of the projection optical system PL.

After loading the pinhole reticle, the main controller 50 detects the reticle alignment mark of the pinhole reticle by the reticle alignment microscopes and, based on the detection result, positions the pinhole reticle in a predetermined position, so that the center of the pinhole reticle almost coincides with the optical axis of the projection optical system PL.

After that, the main controller 50 gives control information TS to the light source 16 to make it generate laser beam LB. By this, the pinhole reticle is illuminated with the illumination light EL from the illumination optical system 12. Then light from each of the plurality of pinholes of the pinhole reticle is focused through the projection optical system PL on the image plane to form a pinhole image.

Next, the main controller 50 moves the wafer stage WST via the wafer-stage driving portion 56, while monitoring measurement values of the laser interferometer 54W, such that the center of the opening 82a of the wave-front-aberration measuring unit 80 almost coincides with the imaging point where an image of a given pinhole on the pinhole reticle is formed. At the same time, the main controller 50 finely moves the Z-tilt stage 58 in the Z-direction via the wafer-stage driving portion 56 based on the detection result of the focus detection system (60a, 60b) such that the upper surface of cover glass 88 of the wave-front-aberration measuring unit 80 coincides with the image plane on which the pinhole images are formed, as well as adjusting the tilt angle of the wafer stage WST as needed. By this, the light beam from the given pinhole are made incident through the center opening of the cover glass 88 on the light-receiving optical system 84 and received by the light-receiving device of the light-receiving portion 86.

The operation will be described in more detail below. A spherical wave is produced from the given pinhole on the pinhole reticle. The spherical wave is made incident on the projection optical system PL and passes through the light-receiving optical system 84 of the wave-front-aberration measuring unit 80, i.e., the objective lens 84a, the relay lens 84b, the mirror 84c and the collimator lens 84d which produces parallel rays of the light that illuminate the micro-lens array 84e. By this, the pupil plane of the projection optical system PL is relayed to and divided by the micro-lens array 84e. Each lens device of the micro-lens array 84e focuses respective light on the receiving surface of the light-receiving device to form a pinhole image on the receiving surface.

Figure 4A:
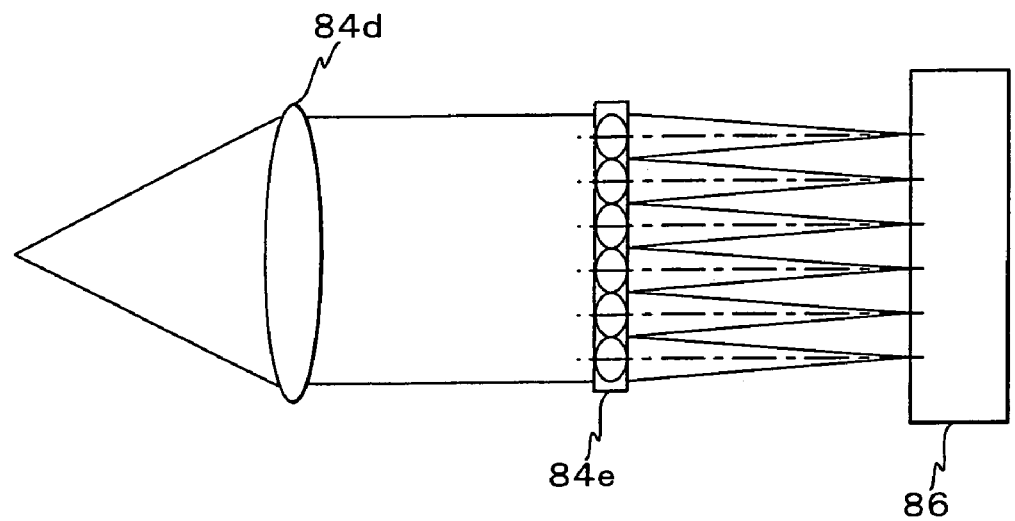
FIG. 4A is a view showing light beams emitted from micro-lens array when there is no aberration in the optical system.

If the projection optical system PL is an ideal optical system that does not cause the wave-front-aberration, the wave-front takes an ideal shape (herein, a flat plane) on the pupil plane of the projection optical system PL, and thus the parallel rays of the light incident on the micro-lens array 84e come to form a plane wave with an ideal wave-front, in which case a respective spot-image (hereinafter, also called a "spot") is, as shown in FIG. 4A, formed on the optical axis of each lens device of the micro-lens array 84e.

Figure 4B:
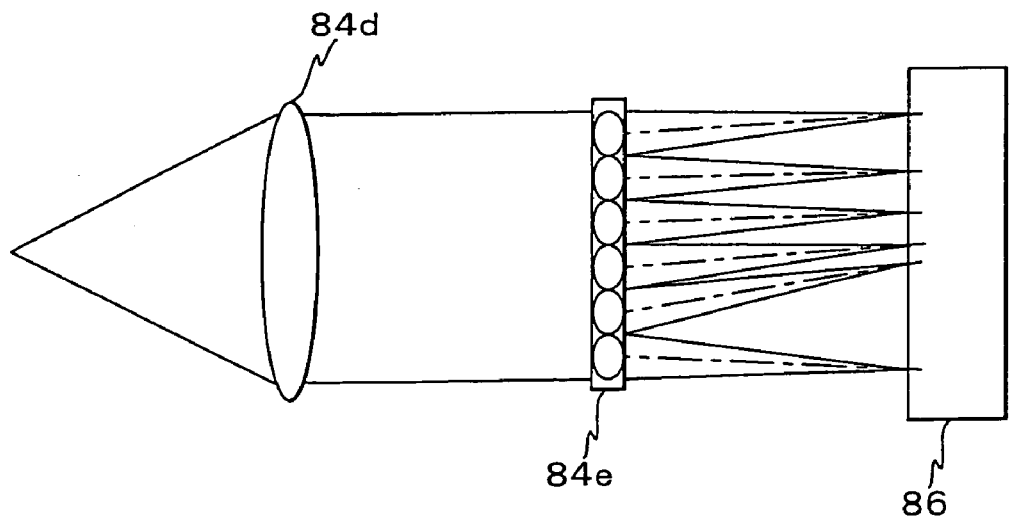
FIG. 4B is a view showing light beams emitted from micro-lens array when there is aberration in the optical system.

However, because the projection optical system PL usually causes wave-front-aberration, the wave-front formed by the parallel rays of the light incident on the micro-lens array 84e deviates from the ideal wave-front, and according to the deviation, that is, the tilt angle of the wave-front to the ideal wave-front, the imaging point of each spot deviates from the optical axis of a respective lens device forming part of the micro-lens array 84e as shown in FIG. 4B. Here, the deviation of each spot from the respective reference point corresponds to the tilt angle of the wave-front.

And the light-receiving device forming part of the light-receiving portion 86 converts light (beam for the spot image) incident and focused on each focus point thereon into an electric signal, which is sent to the main controller 50 via an electric circuit. The main controller 50 calculates the imaging position of each spot based on the electric signal and then a position deviation ($\Delta\xi$, $\Delta\eta$) based on the calculation result and known position data of the respective reference point and stores the position deviation ($\Delta\xi$, $\Delta\eta$) in the RAM, during which the main controller 50 receives a corresponding measurement value ($X_i$, $Y_i$) from the laser interferometer 54W.

After the wave-front-aberration measuring unit 80 has measured the position deviations of the spot images for the imaging point of the given pinhole, the main controller 50 moves the wafer stage WST such that the center of the opening 82a of the wave-front-aberration measuring unit 80 almost coincides with the imaging point of a next pinhole. After that, in the same way as described above, the main controller 50 makes the light source 16 generate laser beam LB and calculates the imaging position of each spot. For the imaging points of the other pinholes the same measurement sequence is repeated. It is remarked that in the above measurement, the position, size, etc., of the illumination area on the reticle may be changed for each given pinhole by using the reticle blind 30 such that only the given pinhole or some pinholes including the given pinhole are illuminated with the illumination light EL.

After the completion of all the necessary measurements, the RAM of the main controller 50 stores the position deviations ($\Delta\xi$, $\Delta\eta$) of the spot images for the imaging point of each pinhole and the coordinate data of the imaging point (the corresponding measurement value ($X_i$, $Y_i$) measured by the laser interferometer 54W upon measurement for the imaging point of the pinhole).

Next, the main controller 50 loads the first program into the main memory and computes, according to the principle described below, the wave-front (wave-front aberration) for the imaging points of the pinholes, i.e. the first through n'th measurement points within the field of the projection optical system PL, specifically, the coefficients of the Zernike polynomial given by an equation (4) shown below, e.g. the second term's coefficient $Z_2$ through the 37th term's coefficient $Z_{37}$, based on the position deviations ($\Delta\xi$, $\Delta\eta$) of the spot images for the imaging point of each pinhole and the coordinate data of the imaging point in the RAM by using the first program.

In this embodiment, the wave-front of light having passed through the projection optical system PL is obtained based on the position deviations ($\Delta\xi$, $\Delta\eta$) by using the first program. The position deviations ($\Delta\xi$, $\Delta\eta$) directly reflect the tilts of the wave-front to the ideal wave-front to the degree that the wave-front is drawn based on the position deviations ($\Delta\xi$, $\Delta\eta$). It is remarked that, as is obvious from the physical relationship between the position deviations ($\Delta\xi$, $\Delta\eta$) and the wave-front, the principle in this embodiment for calculating the wave-front is the known Shack-Hartmann principle.

Next, the method of calculating the wave-front based on the above position deviations will be described briefly.

As described above, integrating the position deviations ($\Delta\xi$, 66 $\eta$), which correspond to the tilts of the wave-front, gives the shape of the wave-front (strictly speaking, deviations from a reference plane (the ideal plane)). Let W(x, y) indicate the wave-front (deviations from the reference plane) and k be a proportional coefficient, then the following equations (2), (3) exist.

$$\Delta\xi = k\frac{\partial W}{\partial x} \quad (2)$$

$$\Delta\eta = k\frac{\partial W}{\partial y} \quad (3)$$

Because it is not appropriate to directly integrate the tilts of the wave-front obtained only in the spot positions, the shape of the wave-front is fitted by and expanded in a series whose terms are orthogonal. The Zernike polynomial is a series suitable to expand a surface symmetrical around an axis in, where its component tangent to a circle is expanded in a trigonometric series. That is, the wave-front W is expanded in the equation (4) when using a polar coordinate system ($\rho$, $\theta$).

$$W(\rho, \theta) = \sum_i Z_i \cdot f_i(\rho, \theta) \quad (4)$$

Because the terms are orthogonal, coefficients $Z_i$ of the terms can be determined independently. The "i" may terminate at a certain number with an effect of a sort of filtering. The first through 37th terms ($Z_i \times f_i$) are shown in Table 1 as examples. Although the 37th term in Table 1 is, in practice, the 49th term of the Zernike polynomial, in this embodiment it is treated as the 37th term. That is, in this embodiment there is no limit to the number of the terms of the Zernike polynomial.

TABLE 1

| $Z_i$ | $f_i$ |
|---|---|
| $Z_1$ | 1 |
| $Z_2$ | $\rho \cos \theta$ |
| $Z_3$ | $\rho \sin \theta$ |
| $Z_4$ | $2\rho^2 - 1$ |
| $Z_5$ | $\rho^2 \cos 2\theta$ |
| $Z_6$ | $\rho^2 \sin 2\theta$ |
| $Z_7$ | $(3\rho^3 - 2\rho) \cos \theta$ |
| $Z_8$ | $(3\rho^3 - 2\rho) \sin \theta$ |
| $Z_9$ | $6\rho^4 - 6\rho^2 + 1$ |
| $Z_{10}$ | $\rho^3 \cos 3\theta$ |
| $Z_{11}$ | $\rho^3 \sin 3\theta$ |
| $Z_{12}$ | $(4\rho^4 - 3\rho^2) \cos 2\theta$ |
| $Z_{13}$ | $(4\rho^4 - 3\rho^2) \sin 2\theta$ |
| $Z_{14}$ | $(10\rho^5 - 12\rho^3 + 3\rho) \cos \theta$ |
| $Z_{15}$ | $(10\rho^5 - 12\rho^3 + 3\rho) \sin \theta$ |
| $Z_{16}$ | $20\rho^6 - 30\rho^4 + 12\rho^2 - 1$ |
| $Z_{17}$ | $\rho^4 \cos 4\theta$ |
| $Z_{18}$ | $\rho^4 \sin 4\theta$ |
| $Z_{19}$ | $(5\rho^5 - 4\rho^3) \cos 3\theta$ |
| $Z_{20}$ | $(5\rho^5 - 4\rho^3) \sin 3\theta$ |
| $Z_{21}$ | $(15\rho^6 - 20\rho^4 + 6\rho^2) \cos 2\theta$ |
| $Z_{22}$ | $(15\rho^6 - 20\rho^4 + 6\rho^2) \sin 2\theta$ |
| $Z_{23}$ | $(35\rho^7 - 60\rho^5 + 30\rho^3 - 4\rho) \cos \theta$ |
| $Z_{24}$ | $(35\rho^7 - 60\rho^5 + 30\rho^3 - 4\rho) \sin \theta$ |
| $Z_{25}$ | $70\rho^8 - 140\rho^6 + 90\rho^4 - 20\rho^2 + 1$ |
| $Z_{26}$ | $\rho^5 \cos 5\theta$ |
| $Z_{27}$ | $\rho^5 \sin 5\theta$ |
| $Z_{28}$ | $(6\rho^6 - 5\rho^4) \cos 4\theta$ |
| $Z_{29}$ | $(6\rho^6 - 5\rho^4) \sin 4\theta$ |
| $Z_{30}$ | $(21\rho^7 - 30\rho^5 + 10\rho^3) \cos 3\theta$ |
| $Z_{31}$ | $(21\rho^7 - 30\rho^5 + 10\rho^3) \sin 3\theta$ |
| $Z_{32}$ | $(56\rho^8 - 105\rho^6 + 60\rho^4 - 10\rho^2) \cos 2\theta$ |
| $Z_{33}$ | $(56\rho^8 - 105\rho^6 + 60\rho^4 - 10\rho^2) \sin 2\theta$ |
| $Z_{34}$ | $(126\rho^9 - 280\rho^7 + 210\rho^5 - 60\rho^3 + 5\rho) \cos \theta$ |
| $Z_{35}$ | $(126\rho^9 - 280\rho^7 + 210\rho^5 - 60\rho^3 + 5\rho) \sin \theta$ |
| $Z_{36}$ | $252\rho^{10} - 630\rho^8 + 560\rho^6 - 210\rho^4 + 30\rho^2 - 1$ |
| $Z_{37}$ | $924\rho^{12} - 2772\rho^{10} + 3150\rho^8 - 1680\rho^6 + 420\rho^4 - 42\rho^2 + 1$ |

Because the position deviations detected are the differentials of the wave front, fitting the differential coefficients for the terms to the position deviations is performed in practice. When expressed in a polar coordinate system ($x = \rho \cos \theta$, $y = \rho \sin \theta$), the equations (5), (6) exist.

$$\frac{\partial W}{\partial x} = \frac{\partial W}{\partial \rho} \cos \theta - \frac{1}{\rho} \frac{\partial W}{\partial \theta} \sin \theta \quad (5)$$

$$\frac{\partial W}{\partial y} = \frac{\partial W}{\partial \rho} \sin \theta + \frac{1}{\rho} \frac{\partial W}{\partial \theta} \cos \theta \quad (6)$$

Because the differentials of the terms of the Zernike polynomial are not orthogonal, the least-squares method is used in the fitting. Because the information (position deviation) of each spot image is expressed in two coordinates X and Y, let n indicate the number of the pinholes (e.g. n=about 81 to 400), then the number of sets of equations given by the equations (2) through (6) is 2n (=about 162 to 800).

Each term of the Zernike polynomial corresponds to an optical aberration. Lower-order terms (i's value being small) almost correspond to Seidel's aberrations. Therefore, the wave-front aberration due to the projection optical system PL can be expressed by the Zernike polynomial.

The computation procedure of the first program is determined according to the above principle, and executing the first program gives the wave-front information (wave-front aberration) for the first through n'th measurement points within the field of the projection optical system PL, specifically, the coefficients of terms of the Zernike polynomial, e.g. the second term's coefficient $Z_2$ through the 37th term's coefficient $Z_{37}$.

In the description below, the wave-front data (wave-front aberration) for the first through n'th measurement points within the field of the projection optical system PL is expressed by column matrix Q given by the equation (7).

$$Q = \begin{bmatrix} P_1 \\ P_2 \\ \vdots \\ \vdots \\ P_n \end{bmatrix} \quad (7)$$

In the equation (7), each of the elements $P_1$ through $P_n$ of matrix Q indicates a column matrix (vector) made up of the second through the 37th terms' coefficients ($Z_2$ to $Z_{37}$) of the Zernike polynomial.

The main controller 50 stores the wave-front data (e.g. the second term's coefficient $Z_2$ through the 37th term's coefficient $Z_{37}$ of the Zernike polynomial) obtained in the above manner in the storage unit 42.

Moreover, the main controller 50, according to an inquiry from the first communication server 120, reads out the wave-front data from the storage unit 42 and sends it to the first communication server 120 via LAN 118.

Referring back to FIG. 1, stored in the hard disk or the like of the first communication server 120 are information about targets to be achieved in the first through third exposure apparatuses $122_1$ through $122_3$, for example, resolving power, effective minimum line width (device rule), the wavelength of the illumination light EL (center wavelength and wavelength width in spectrum), information about patterns to be transferred, and other information about the projection optical system determining the capabilities of the exposure apparatuses $122_1$ through $122_3$, which information contains some target values as well as information about targets to be achieved by exposure apparatuses scheduled to be introduced, e.g., information about patterns to be transferred.

Meanwhile, the hard disk or the like of the second communication server 130 stores an adjustment-amount computing program (hereinafter, called a "second program" for the sake of convenience) for computing an adjustment-amount for the imaging characteristic based on the coefficients of terms of the Zernike polynomial, an optimum-exposure-conditions setting program (hereinafter, called a "third program" for the sake of convenience) for setting optimum exposure-conditions, and a database associated with the second program.

Next, the database will be described. The database contains numerical data of parameters for calculating target drive amounts (target adjustment amounts) of the movable lens devices $13_1$, $13_2$, $13_4$ (hereinafter, called "movable lenses"), which amounts are for adjusting the imaging characteristic of the projection optical system according to the measurement result of the wave-front aberration, and, more specifically, variation amounts of the imaging characteristics that are obtained by the simulation using a substantially equivalent model for the projection optical system PL of how the imaging characteristic, e.g. the second through the 37th terms' coefficients of the Zernike polynomial, for each of the plurality of measurement points within the field of the projection optical system PL varies when moving the movable lenses $13_1$, $13_2$, $13_4$ separately by a unit quantity in each of directions where these are movable, the variation amounts being arranged in the database according to a given rule.

Next, the procedure of generating the database will be briefly described. Exposure conditions, i.e., design values of the projection optical system PL (numerical aperture N.A., data of lenses, etc.) and illumination condition (coherence factor σ, the wavelength λ of the illumination light, the shape of the secondary illuminant, etc.) and then, data of a first measurement point within the field of the projection optical system PL are inputted into a computer for the simulation where a specific program for calculating the optical characteristic is installed.

Next, a unit quantity in each of directions in which movable lenses are movable is inputted. According to, for example, instructions to tilt the movable lens $13_1$ about the Y-axis counterclockwise by a unit quantity, the computer for the simulation calculates the deviations of a first wave-front from an ideal wave-front for the first measurement point, for example variations of the second term's coefficient through the 37th term's coefficient of the Zernike polynomial, and displays the deviations or variations on the screen thereof while storing them as parameter PARA1P1 in memory.

Next, according to instructions to tilt the movable lens $13_1$ about the X-axis counterclockwise by a unit quantity, the computer for the simulation calculates the deviations of a second wave-front from an ideal wave-front for the first measurement point, for example variations of the terms' coefficients of the Zernike polynomial, and displays the deviations or variations on the screen thereof while storing them as parameter PARA2P1 in memory.

Next, according to instructions to shift the movable lens $13_1$ in the +Z direction by a unit quantity, the computer for the simulation calculates the deviations of a third wave-front from an ideal wave-front for the first measurement point, for example variations of the terms' coefficients of the Zernike polynomial, and displays the deviations or variations on the screen thereof while storing them as parameter PARA3P1 in memory.

In the same procedure as described above, for each of the second through n'th measurement points, the computer for the simulation, after data of the measurement point being inputted, calculates data of first, second and third wave-fronts, for example variations of the terms' coefficients of the Zernike polynomial, according to instructions to tilt the movable lens $13_1$ about the X-axis, to tilt about the Y-axis and to shift in the +Z direction respectively and displays the deviations or variations on the screen thereof while storing them as parameters PARA1P2, PARA2P2, PARA3P2, through PARA1Pn, PARA2Pn, PARA3Pn in memory.

Also for the other movable lenses $13_2$, $13_3$, $13_4$, in the same procedure as described above, for each of the first through n'th measurement points, the computer for the simulation, after data of the measurement point being inputted, calculates the deviations of wave-fronts from respective ideal wave-fronts, for example variations of the terms' coefficients of the Zernike polynomial, according to instructions to drive the movable lens $13_2$, $13_3$, $13_4$ in respective directions where to be movable by a unit quantity and stores the deviations or variations as parameters (PARA4P1, PARA5P1, PARA6P1, through PARAmP1), (PARA4P2, PARA5P2, PARA6P2, through PARAmP2) through (PARA4Pn, PARA5Pn, PARA6Pn, through PARAmPn) in memory. And a matrix O given by the following expression (8) and composed of column matrices (vectors) PARA1P1 through PARAmPn each of which consists of variations of the terms' coefficients of the Zernike polynomial stored in memory in the above manner is stored as the database in the hard disk or the like of the second communication server 130. In this embodiment, because there are three three-degree-of-freedom movable lenses and a two-degree-of-freedom movable lens, m=3×3+2×1=11. The matrix O may be calculated for each exposure apparatus, i.e. projection optical system, or one matrix may be for the same kind (same design values) of projection optical systems.

$$O = \begin{bmatrix} PARA1P1 & PARA2P1 & \cdots & \cdots & PARAmP1 \\ PARA1P2 & PARA2P2 & \cdots & \cdots & PARAmP2 \\ \vdots & \vdots & & & \vdots \\ \vdots & \vdots & & & \vdots \\ PARA1Pn & PARA2Pn & \cdots & \cdots & PARAmPn \end{bmatrix} \quad (8)$$

Next, the method in this embodiment of adjusting the projection optical system PL of the exposure apparatuses $122_1$ through $122_3$ will be described. In the below, an exposure apparatus 122 indicates any of the exposure apparatuses $122_1$ through $122_3$ unless there is a need for distinguishing these.

As a premise, upon periodic maintenance, etc., of the exposure apparatus 122, the main controller 50 of the exposure apparatus 122, according to instructions of a service engineer to measure, has measured the wave-front due to the projection optical system PL by the wave-front-aberration measuring unit 80 and has stored the measured wave-front data in the storage unit 42.

First, the first communication server 120 inquires at given intervals whether or not there is measurement data of a new wave-front (e.g. the second term's coefficient $Z_2$ through the 37th term's coefficient $Z_{37}$ of the Zernike polynomial for the first through n'th measurement points) in the storage unit 42 of the exposure apparatus 122. At this point of time, suppose that measurement data of a new wave-front is stored in the storage unit 42 of the exposure apparatus 122 (in practice, any of the exposure apparatuses $122_1$ through $122_3$). The main controller 50 of the exposure apparatus 122 sends the measurement data of the new wave-front to the first communication server 120 via LAN 118.

The first communication server 120 sends the measurement data of the wave-front together with instructions to automatically adjust the projection optical system PL (or to compute an adjustment amount) to the second communication server 130. This data passes through LAN 118, the first proxy server 124, and the public telephone line 116 and reaches the second proxy server 128, which identifies the destination address attached to the data, so that it recognizes the data being sent to the second communication server 130 and which sends it to the second communication server 130 via LAN 126.

The second communication server 130 receives the data and displays its notification together with the identifier of the source of the data on screen while storing the measurement data of the wave-front in a hard disk or the like, and calculates an adjustment amount of the projection optical system PL, i.e. adjustment amounts of the movable lenses $13_1$ through $13_4$ in directions where to be movable, in the following manner.

The second communication server 130 loads the second program into the main memory from the hard disk or the like and computes the adjustment amounts of the movable lenses $13_1$ through $13_4$ in directions where to be movable, which computation is specifically shown in the below.

Between data Q of the wave-front (wave-front aberration) for the first through n'th measurement points, the matrix O contained in the database, and an adjustment-amounts vector P of the movable lenses $13_1$ through $13_4$ in directions where to be movable, there exists the equation (9)

$$Q = O \times P. \qquad (9)$$

In the equation (9), P indicates a column matrix (vector) having m elements given by the equation (10).

$$P = \begin{bmatrix} ADJ1 \\ ADJ2 \\ \vdots \\ \vdots \\ ADJm \end{bmatrix} \qquad (10)$$

Therefore, computing the following equation (11) obtained from the equation (9) with using the least-squares method gives P's elements ADJ1 through ADJm, that is, adjustment amounts (target adjustment amounts) of the movable lenses $13_1$ through $13_4$ in directions where to be movable $$P = (O^T \times O)^{-1} \times O^T \times Q. \qquad (11)$$

In the equation (11), $O^T$ and $(O^T \times O)^{-1}$ indicates the transposed matrix of matrix O and the inverse matrix of $(O^T \times O)$ respectively.

That is, the second program is one for performing a least-squares-method computation given by the equation (11) using the database. Therefore, the second communication server 130 calculates the adjustment amounts ADJ1 through ADJm according to the second program while reading the database from the hard disk into RAM.

Next, the second communication server 130 sends the adjustment amounts ADJ1 through ADJm to the main controller 50 of the exposure apparatus 122. By this, data containing the adjustment amounts ADJ1 through ADJm passes through LAN 126, the second proxy server 128, and the public telephone line 116 and reaches the first proxy server 124, which identifies the destination address attached to the data, so that it recognizes the data being sent to the exposure apparatus 122 and which sends it to the exposure apparatus 122 via LAN 118. In practice, when the address attached to the data containing the adjustment amounts ADJ1 through ADJm is AD2, AD3, or AD4, the data is sent to the exposure apparatus $122_1$, $122_2$ or $122_3$ respectively.

The second communication server 130 can send the first communication server 120 the data containing the calculated adjustment amounts ADJ1 through ADJm, in which case the first communication server 120 relays the data to the main controller 50 of the exposure apparatus 122 that sent the corresponding wave-front data before.

In either case, the main controller 50 of the exposure apparatus 122 that received the data containing the calculated adjustment amounts ADJ1 through ADJm gives the imaging-characteristic correcting controller 48 values specifying drive amounts of the movable lenses $13_1$ through $13_4$ in directions where to be movable corresponding to the adjustment amounts ADJ1 through ADJm. The imaging-characteristic correcting controller 48 controls the voltages applied to devices for driving the movable lenses $13_1$ through $13_4$ in directions where to be movable, so that at least one of the position and yaw of each of the movable lenses $13_1$ through $13_4$ is adjusted and the imaging characteristic of the projection optical system PL, i.e. aberrations such as distortion, field curvature, coma, spherical aberration, and astigmatism, is corrected. It is remarked that as to coma, spherical aberration and astigmatism, higher orders of aberration components can be corrected as well as lower orders of aberration components.

As is obvious in the above description, the movable lenses $13_1$ through $13_4$, the devices for driving these movable lenses, the imaging-characteristic correcting controller 48 and the main controller 50 compose an imaging-characteristic adjusting mechanism that functions as an adjusting unit in this embodiment.

It is remarked that the first communication server 120 may send the data containing the adjustment amounts ADJ1 through ADJm to the imaging-characteristic correcting controller 48 via the main controller 50 of the exposure apparatus 122 that sent the corresponding wave-front data before so as to adjust at least one of the position and yaw of each of the movable lenses $13_1$ through $13_4$.

In this embodiment as described above, after a service engineer or the like attaches the wave-front-aberration measuring unit 80 to the Z-tilt stage 58, the imaging-characteristic of the projection optical system PL, according to instructions to measure the wave-front aberration that are inputted via the input unit 45, is accurately adjusted almost automatically and in a remote-controlled manner.

While in the above description the projection optical system is automatically adjusted, the aberrations may include one difficult to automatically correct. In this case, a skilled engineer on the second communication server 130's side gets corresponding wave-front measurement data in the hard disk of the second communication server 130 displayed on screen and analyzes it to find out a problem, and, if an aberration difficult to automatically correct is included, inputs an appropriate measure through the key-board or the like of the second communication server 130 and remotely gets it displayed on the screen of the display unit 44 of the exposure apparatus 122. A service engineer or the like on the maker A's side can adjust the projection optical system by finely adjusting the positions, etc., of lenses based on the appropriate measure on the screen in a short time.

Figure 5:
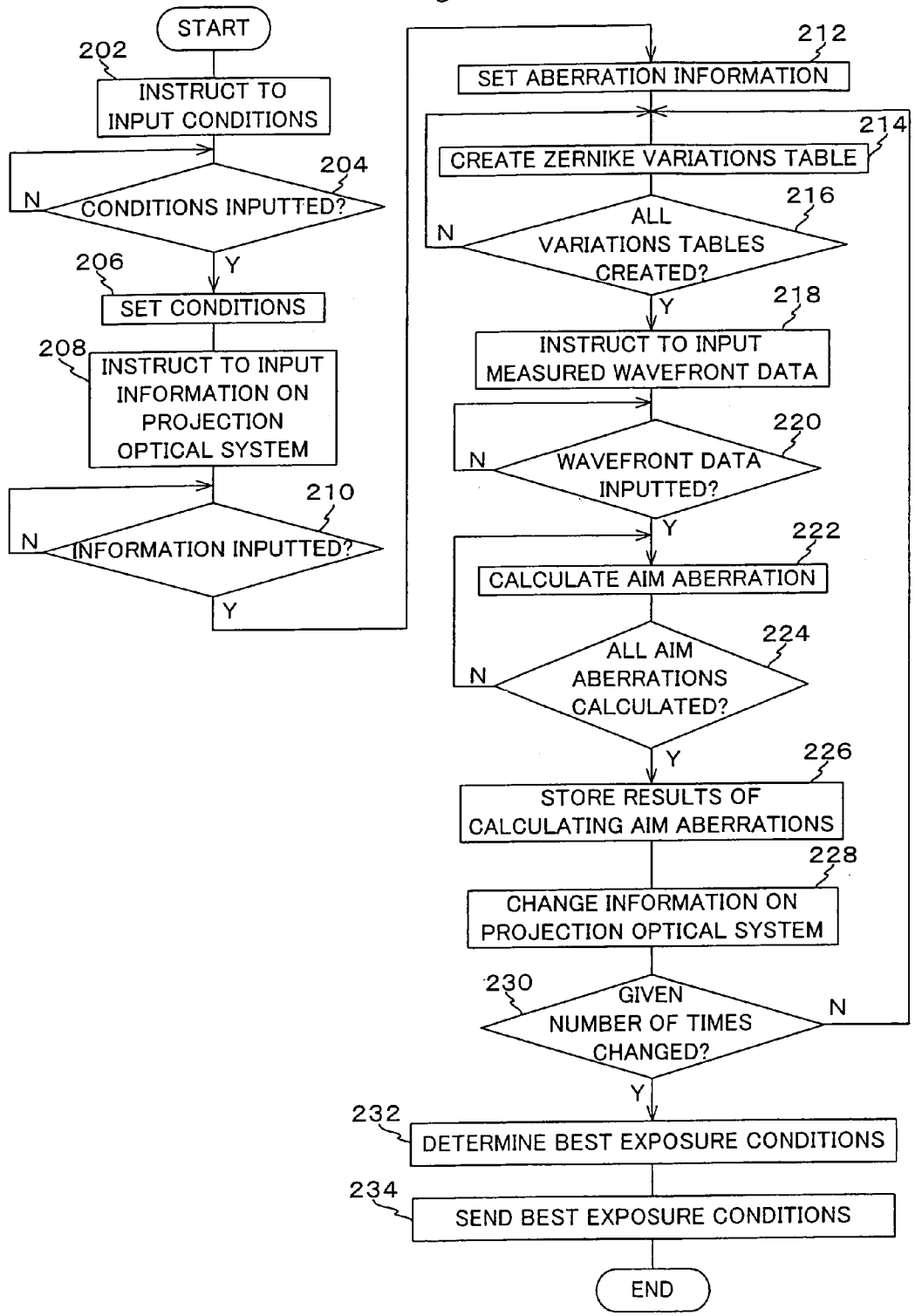
FIG. 5 is a flow chart showing a process algorithm executed by a CPU in the second communication server when setting best exposure conditions of an exposure apparatus.

Next, the procedure of setting the optimum exposure conditions of the exposure apparatus 122 ($122_1$ through $122_3$) will be described with reference to a flow chart of FIG. 5 showing main part of a process algorithm to be executed by the CPU of the second communication server 130. As a premise, upon periodic maintenance, etc., of the exposure apparatus $122_1$, the main controller 50 of the exposure apparatus $122_1$, according to service engineer's instructions to measure, has already measured the wave-front aberration due to the projection optical system PL by the wave-front-aberration measuring unit 80 and has stored the measured wave-front data in the hard disk or the like of the first communication server 120 in the same way as above. It is noted that although also in setting the optimum exposure conditions data communication between the first communication server 120 or the exposure apparatus $122_1$ and the second communication server 130 is performed likewise, explanation concerning communication and communication paths will be omitted for the sake of simplicity.

The process in the flow chart of FIG. 5 starts when according to instructions of an operator on the maker A's side the first communication server 120, with specifying an exposure apparatus whose optimum exposure conditions are to be determined, has instructed the second communication server 130 to determine the optimum exposure conditions and the second communication server 130, in response to this, has loaded the third program into the main memory. The process beginning with a step 202 in FIG. 5 is performed by executing the third program.

First, after in the step 202 it inquires conditions of the first communication server 120, the second communication server 130, in a step 204, waits for the conditions being inputted.

During this, according to instructions of the operator to determine the optimum exposure conditions, the first communication server 120 inquires of, e.g., a host computer (not shown) managing the exposure apparatuses $122_1$ through $122_3$ the information of a reticle to be used this time by the exposure apparatus $122_1$ and, based on the information of the reticle, searches for and gets pattern information thereof from the data base. Moreover, the first communication server 120 has inquired of the main controller 50 of the exposure apparatus $122_1$ current-setting information such as an illumination condition and has stored it in memory.

Alternatively the operator may manually input the pattern information and information such as an illumination condition via an input unit into the first communication server 120.

In either case, the first communication server 120 inputs the pattern information for the simulation (e.g., in the case of a line-and-space pattern, line widths, pitch, duty ratio, etc., or the design data of an actual pattern) together with information of a specified aim imaging characteristic (or an index of the imaging characteristic; the aim imaging characteristic being called an "aim aberration" hereinafter) and information of a line-width abnormal value and so forth.

When the first communication server 120 has completed the input of the conditions, the process proceeds to a step 206 in FIG. 5, which sets conditions for creating a Zernike-variations table of the aim aberration specified in the step 204 relative to Zernike coefficients, and then proceeds to a step 208. It is remarked that the aim aberration information inputted in the step 204 may specify plural kinds of aberrations in the projection optical system PL as aim aberrations (imaging characteristic) at the same time, not being limited to a single one.

After, in the step 208, it instructs the first communication server 120 to input information about the projection optical system PL of the exposure apparatus $122_1$, in a step 210 the second communication server 130 waits for the input. And when the information about the projection optical system PL, specifically a numerical aperture N.A., an illumination condition such as setting of the illumination-system aperture stop or coherence factor σ, a wavelength, etc., has been inputted, in a step 212 the second communication server 130 stores the inputted information in RAM and sets specified aberration-value information, in which the second term's coefficient $Z_2$ through the 37th term's coefficient $Z_{37}$ of the Zernike polynomial are set such that each term takes on, for example, a value 0.05λ.

A next step 214, based on the pattern information and the information about the projection optical system PL, creates graphs (a table of variations of, for example, a line-width abnormal value relative to Zernike coefficients) whose ordinate is the aim aberration (the set aberration-value information) or its index (for example, the line-width abnormal value that is an index of coma) and whose abscissas are corresponding terms' coefficients of the Zernike polynomial, and the process proceeds to a step 216.

Here, the table of the variations relative to Zernike coefficients is a table that represents sensitivities (Zernike Sensitivity), to a specific aberration, i.e. the aim aberration (or its index), of coefficients of terms of the Zernike polynomial in which the wave-front in the projection optical system is expanded, the aberration being measured with respect to the pattern given as an object pattern, and is uniquely defined based on the pattern information, the information about the projection optical system PL, and the set aberration-value information as well as, for the same kind of projection optical systems, based on design information containing the kind and configuration of lens devices composing the projection optical system. Therefore, by searching in the in-house database of the maker B for and identifying the kind of the projection optical system of an exposure apparatus specified, for example by product name, as an object whose optimum exposure conditions is to be determined, the Zernike-variations table can be created.

A next step 216 checks whether or not Zernike-variations tables for all the aim aberrations specified in the step 204 have been created. If the answer is NO, the process returns to the step 214, and the Zernike-variations table for a next aim aberration is created.

After Zernike-variations tables for all the aim aberrations have been created, and the answer in the step 216 becomes YES, the process proceeds to a next step 218. After, in the step 218, it instructs the first communication server 120 to input measurement data of the wave-front, in a step 220 the second communication server 130 waits for the input of the measurement data. When the first communication server 120 has inputted from its hard disk the measurement data of the wave-front (for example, the second term's coefficient $Z_2$ through the 37th term's coefficient $Z_{37}$ of the Zernike polynomial for wave-fronts for the first through n'th measurement points), in a next step 222 the second communication server 130 performs, for each measurement point, computation given by the following equation (12) using the created Zernike-variations tables in order to obtain and store one of the aim aberrations, specified in the step 204, in RAM $$A = K \times \{Z_2 \times (\text{a table's value}) + Z_3 \times (\text{a table's value}) + \ldots + Z_{37} \times (\text{a table's value})\}. \tag{12}$$

Here, A indicates an aim aberration in the projection optical system PL such as astigmatism or field curvature, or an index of the aim aberration such as a line-width abnormal value that is an index of coma, and K is a proportional constant depending on the sensitivity of the resist and so forth.

When A indicates the line-width abnormal value, and the pattern is a line-and-space pattern having five lines therein for example, the line-width abnormal value is given by the above equation (1). As is obvious in the equation (1), the calculation of the equation (12) is one for converting the pattern into space images (projected images).

A next step 224 checks whether or not all the aim aberrations (aberrations (imaging characteristic) for which conditions were set) have been calculated. If the answer is NO, the process returns to the step 222, and a next aim aberration is calculated and stored in RAM.

When all the aim aberrations have been calculated, in a step 226 the calculation results of all the aim aberrations in RAM are stored in the hard disk or the like, and the process proceeds to a next step 228.

In the step 228, after the information about the projection optical system PL, specifically a numerical aperture N.A., an illumination condition such as setting of the illumination-system aperture stop or coherence factor σ, a wavelength, etc., has been changed partly compared to the one given in the step 210, in a step 230 the second communication server 130 checks whether or not the information has been changed a predetermined number of times. At this point of time, because the information about the projection optical system PL has been changed only once, the answer is NO, and after the process returns to the step 214, the process of the steps 214 through 230 is repeated, in the step 214 of which Zernike-variations tables are created based on the information about the projection optical system PL that has been changed in the step 228. In this manner, the process of the steps 214 through 230 is repeated each time with partly different illumination condition, numerical aperture, wavelength, etc. After the process has been repeated the predetermined number of times, the answer in the step 230 becomes YES, and the process proceeds to a next step 232. At this point of time, the calculation results of the aim aberrations for the predetermined number of conditions settings are stored in the hard disk or the like.

In the step 232, the second communication server 130 determines conditions (an illumination condition, a numerical aperture, a wavelength, etc.) concerning the projection optical system, under which the aim aberrations stored in the hard disk or the like take on optimum values (for example, zero or minimum), as optimum exposure conditions.

In a next step 234, data containing the optimum exposure conditions are sent to the first communication server 120, and the process of this routine ends.

The first communication server 120, which has received the data containing the optimum exposure conditions, instructs, as needed, the main controller 50 of the exposure apparatus $122_1$ to set its exposure conditions to the optimum exposure conditions. Specifically, the main controller 50 can change and set the illumination condition by changing the aperture stop of the illumination-system aperture stop plate 24, can adjust the numerical aperture of the projection optical system PL by adjusting the aperture stop 15 of the projection optical system PL shown in FIG. 2, and can set the wavelength of exposure light by giving the light source 16 control information TS to change the wavelength of the illumination light EL.

It is noted that the second communication server 130 may directly instruct the exposure apparatus $122_1$ to set its exposure conditions to the optimum exposure conditions.

Moreover, by making a slight modification to the third program whose process is shown by the flow chart in FIG. 5, a process is given where the steps of creating Zernike-variations tables and calculating aim aberrations (or space images) based on wave-front measurement data in the same way as described above while little by little changing the pattern information with the other setting information fixed are repeated to determine optimum pattern information as optimum exposure conditions.

Likewise, by making a slight modification to the third program whose process is shown by the flow chart in FIG. 5, a process is given where the steps of creating Zernike-variations tables and calculating aim aberrations (or space images) based on wave-front measurement data in the same way as described above while little by little changing the specified-aberration-value information with the other setting information fixed are repeated to determine optimum aberration-value information of the projection optical system upon transferring the given pattern as optimum exposure conditions. In this case the second communication server 130 adjusts the imaging characteristic by controlling the imaging-characteristic correcting controller 48 via the main controller 50 of the exposure apparatus $122_1$ such that the aberration due to the projection optical system PL (for example, the second term's coefficient $Z_2$ through the 37th term's coefficient $Z_{37}$ of the Zernike polynomial) takes on the optimum aberration-value. Alternatively the second communication server 130 may adjust the imaging characteristic by controlling the imaging-characteristic correcting controller 48 via the first communication server 120 and the main controller 50 such that the aberration due to the projection optical system PL takes on the optimum aberration-value.

Optimum exposure conditions of the exposure apparatuses $122_2$, $122_3$ are set in the same way as described above.

In this embodiment, upon periodic maintenance, etc., of the exposure apparatus 122, when a service engineer inputs condition settings, information about the projection optical system, etc., through the first communication server 120, the second communication server 130 creates Zernike-variations tables using another program partly different from the third program in the same way as the simulation for setting optimum exposure conditions. And the main controller 50 of the exposure apparatus 122, according to instructions of the service engineer, measures the wave-front aberration and sends position deviations data obtained from the measurement via the first communication server 120 to the second communication server 130, which calculates the aim aberration in the same way as described above and drive amounts of the movable lenses $13_1$ through $13_4$ in directions where to be movable which amounts make the aim aberration optimal (e.g. zero or minimal), by using the another program and the least-squares method. And the second communication server 130 supplies the drive amounts to the imaging-characteristic correcting controller 48 via the main controller 50, according to which the imaging-characteristic correcting controller 48 controls voltages applied to the devices for driving the movable lenses $13_1$ through $13_4$ in directions where to be movable, so that at least one of the position and yaw of each of the movable lenses $13_1$ through $13_4$ is adjusted and that the aim aberration of the projection optical system PL such as distortion, field curvature, coma, spherical aberration, astigmatism, etc., is corrected. It is remarked that as to coma, spherical aberration and astigmatism, higher orders of aberration components can be corrected as well as lower orders of aberration components. In this case the second program is not necessarily used.

Moreover, in this embodiment when the another program partly different from the third program is installed in the storage unit 42 from the driving unit 46, automatic adjustment of the imaging characteristic of the projection optical system PL by the exposure apparatus 122 itself upon adjustment of the projection optical system PL of the exposure apparatus 122 such as periodic maintenance is easily achieved. In this case, according to instructions of an operator (with condition settings, information about the projection optical system, etc., inputted), the CPU of the main controller 50 performs the same process in the same way as in the above simulation, to create the same Zernike-variations tables. And after position deviations data obtained by measuring the wave-front aberration has been inputted, the CPU of the main controller 50 calculates the aim aberration in the same way as described above and then drive amounts of the movable lenses $13_1$ through $13_4$ in directions where to be movable which amounts make the aim aberration optimal (e.g. zero or minimal), by using the another program and the least-squares method. And the CPU of the main controller 50 supplies the drive amounts to the imaging-characteristic correcting controller 48, according to which the imaging-characteristic correcting controller 48 controls voltages applied to the devices for driving the movable lenses $13_1$ through $13_4$ in directions where to be movable, so that at least one of the position and yaw of each of the movable lenses $13_1$ through $13_4$ is adjusted and the aim aberration of the projection optical system PL such as distortion, field curvature, coma, spherical aberration, astigmatism, etc., is corrected. It is remarked that as to coma, spherical aberration and astigmatism, higher orders of components can be corrected as well as lower orders of components.

As is obvious in the above description, the movable lenses $13_1$ through $13_4$, the devices for driving these movable lenses, and the imaging-characteristic correcting controller 48 compose an imaging-characteristic adjusting mechanism which functions as an adjusting unit in this embodiment and which is controlled by the main controller 50.

It is noted that while the wave-front-aberration measuring unit 80 measures the wave-front aberration due to the projection optical system PL in the above description, not being limited to this, the wave-front aberration may be measured by using a measurement reticle $R_T$ described below (hereinafter, also called a "reticle $R_T$" as needed).

Figure 6:
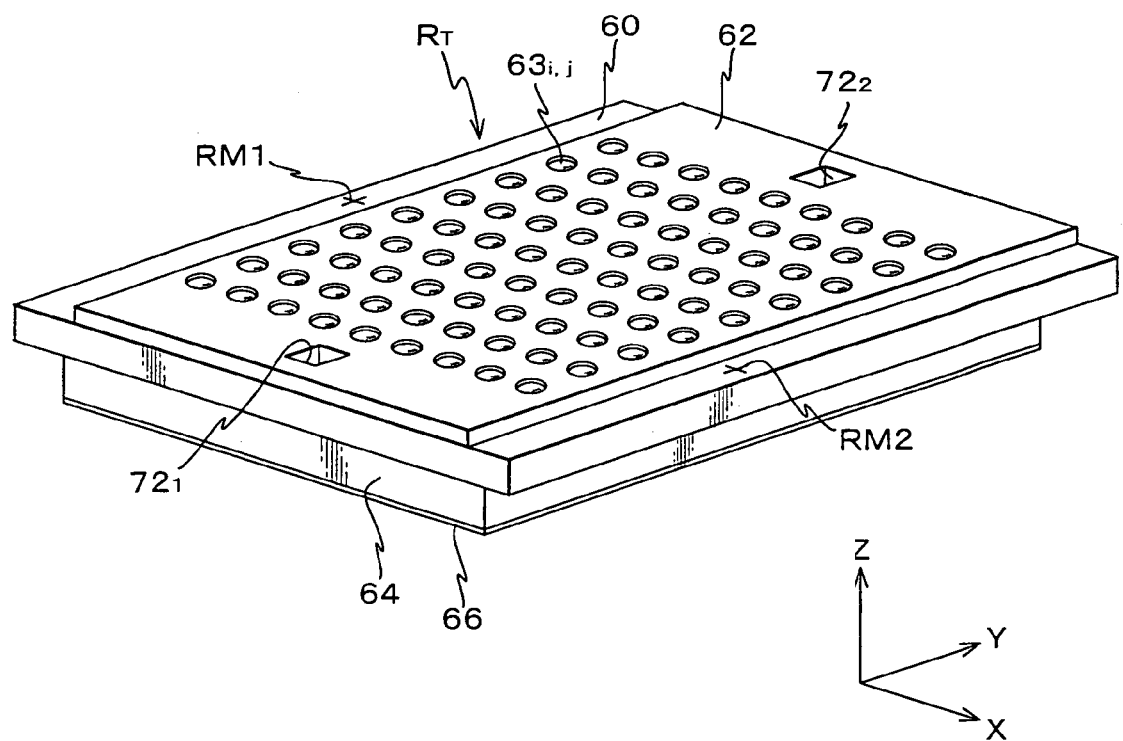
FIG. 6 is a schematic, oblique view of a measurement reticle.
Figure 7:
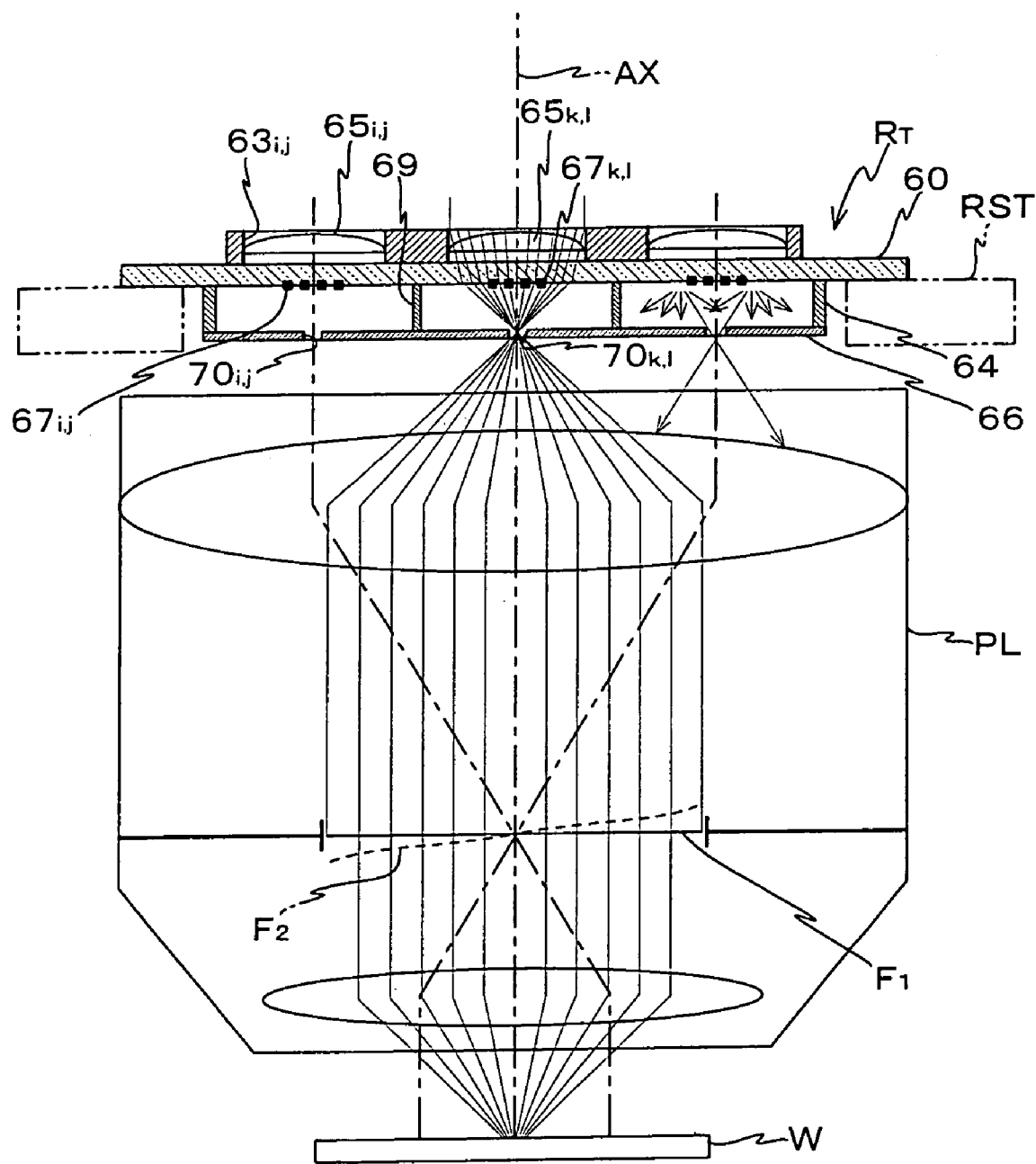
FIG. 7 is a schematic view showing an X-Z cross-section, near the optical axis AX, of the measurement reticle mounted on a reticle stage along with a projection optical system.
Figure 8:
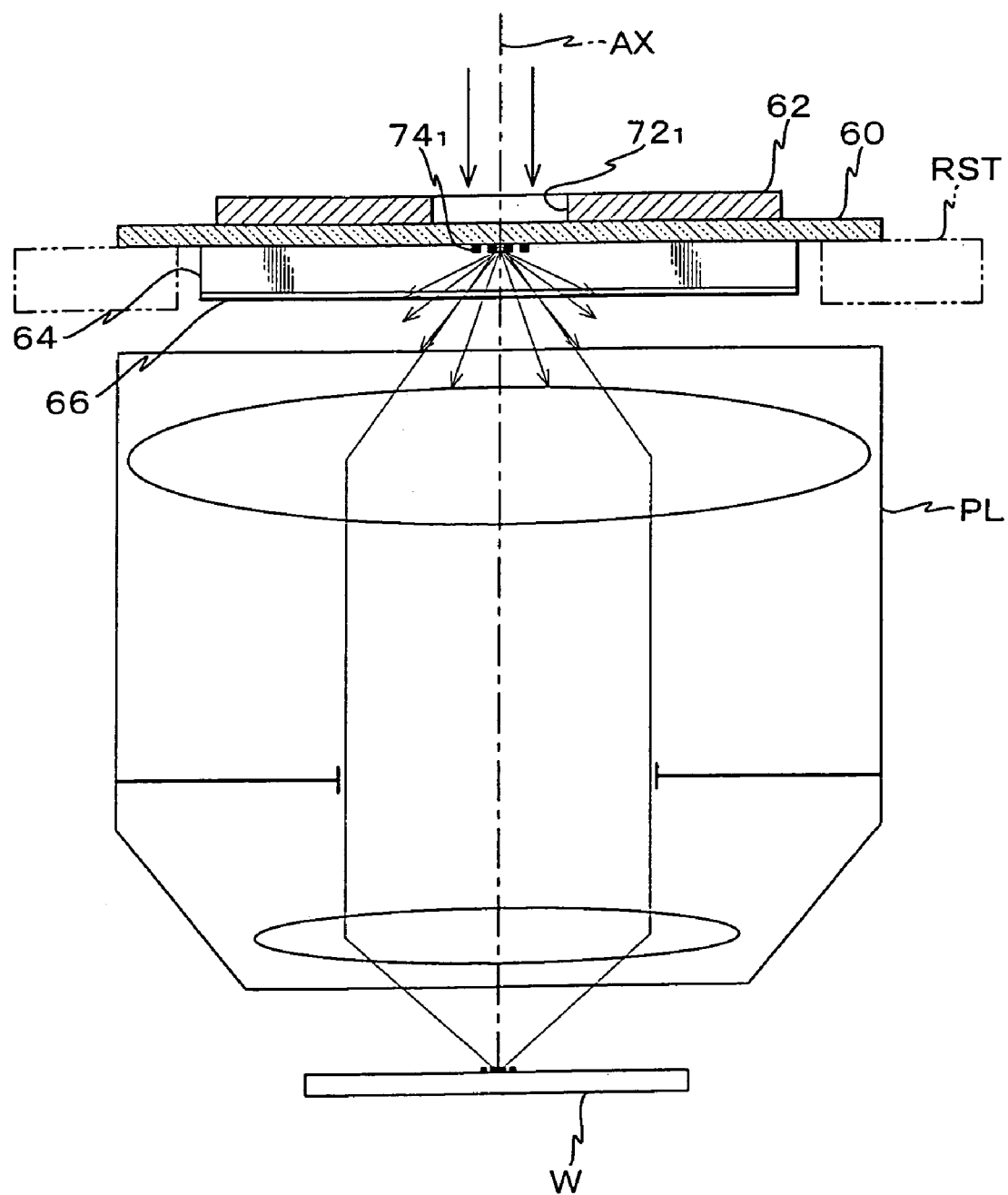
FIG. 8 is a schematic view showing an X-Z cross-section of the −Y direction end of the measurement reticle mounted on a reticle stage along with the projection optical system.

FIG. 6 shows a schematic oblique view of the measurement reticle $R_T$, and FIG. 7 shows a schematic view of the cross section of the reticle $R_T$ along a X-Z plane near the optical axis AX and a diagram of the projection optical system PL. FIG. 8 shows a schematic view of the cross section of the reticle $R_T$ along a X-Z plane near the end in the –Y side and a diagram of the projection optical system PL.

As is obvious in FIG. 6, the measurement reticle $R_T$ has almost the same shape as a usual reticle with a pellicle and comprises a glass substrate 60, a lens-attaching member 62 having a rectangular-plate-like shape and which is fixed on the upper surface of the glass substrate 60 in FIG. 6 such that its center coincides with that of the glass substrate 60, a spacer member 64 constituted by a frame member fixed on the bottom surface of the glass substrate 60 in FIG. 6 and having the same shape as a usual pellicle frame, and an aperture plate 66 fixed on the bottom surface of the spacer member 64.

In the lens-attaching member 62, a matrix arrangement of n circular apertures $63_{i,j}$ (i=1 through p, j=1 through q, p×q=n) is formed which covers the other part of the surface than both the ends in the Y-direction. Provided inside of the circular apertures $63_{i,j}$ are condenser lenses $65_{i,j}$ each constituted by a convex lens whose optical axis is parallel to the Z-direction (refer to FIG. 7).

Inside the space enclosed by the glass substrate 60, the spacer member 64 and the aperture plate 66, supporting members 69 are arranged spaced a predetermined distance apart from each other as shown in FIG. 7.

Furthermore, measurement patterns $67_{i,j}$ are formed on the opposite side of the glass substrate 60 to the condenser lenses $65_{i,j}$ as shown in FIG. 7. Made opposite the measurement patterns $67_{i,j}$ in the aperture plate 66 as shown in FIG. 7 are pinhole-like openings $70_{i,j}$, whose diameter is, for example, about 100 to 150 um.

Referring back to FIG. 6, openings $72_1$, $72_2$ are made in center of the band areas in the ends in the Y-direction of the lens-attaching member 62 respectively. A reference pattern $74_1$ is formed opposite the opening $72_1$ on the bottom surface (pattern surface) of the glass substrate 60 as shown in FIG. 8. Although not shown, a reference pattern $74_2$ identical to the reference pattern $74_1$ is formed opposite the other opening $72_2$ on the bottom surface (pattern surface) of the glass substrate 60.

Moreover, as shown in FIG. 6, a pair of reticle alignment marks RM1, RM2 is formed symmetrically with respect to the reticle's center, on the center line parallel to the X-direction of the glass substrate 60 and outside the lens-attaching member 62.

Figure 9A:
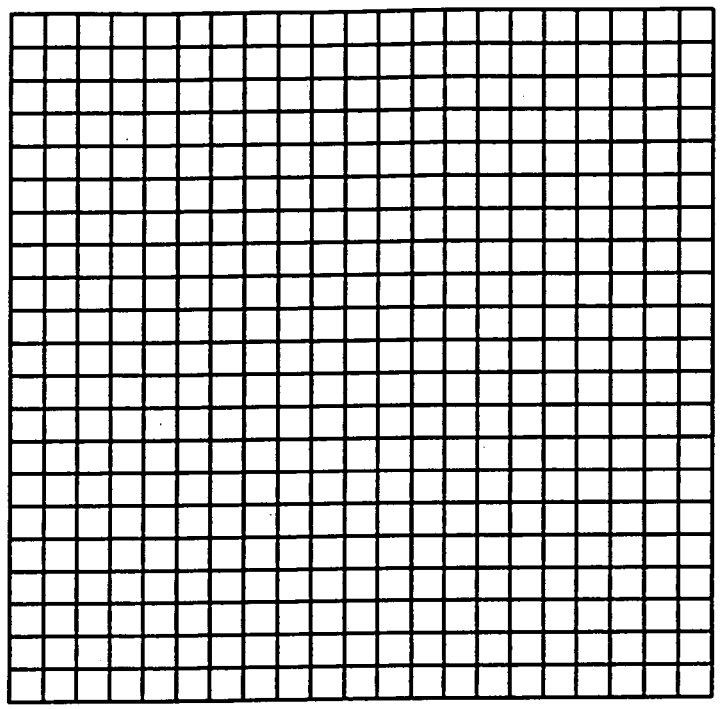
FIG. 9A is a view showing a measurement pattern formed on the measurement reticle of this embodiment.
Figure 9B:
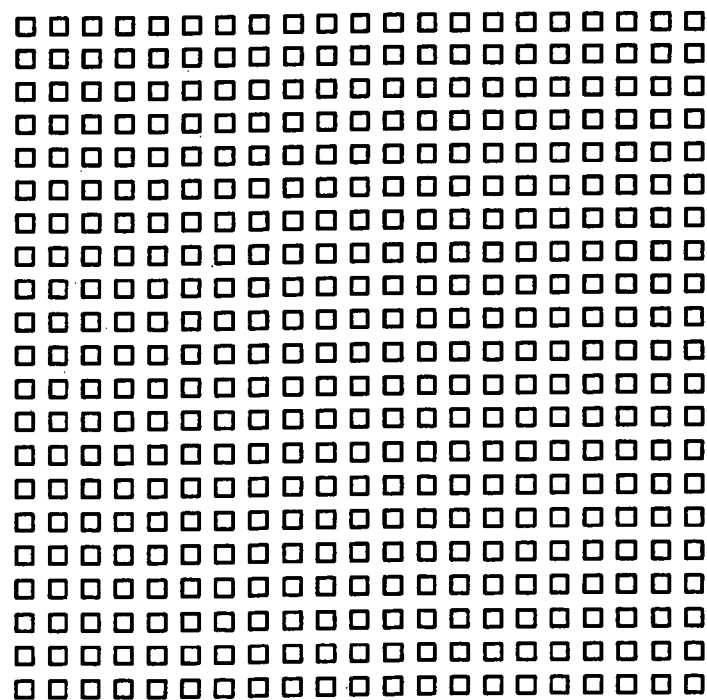
FIG. 9B is a view showing a reference pattern formed on the measurement reticle of this embodiment.

Here, in this embodiment, the measurement patterns $67_{i,j}$ are a mesh (street-lines-like) pattern as shown in FIG. 9A. Corresponding to these, the reference patterns $74_1$, $74_2$ are a two-dimensional pattern with square features arranged at the same pitch as the measurement pattern $67_{i,j}$ as shown in FIG. 9B. It is remarked that the reference pattern $74_1$, $74_2$ may be the pattern of FIG. 9A while the measurement pattern is the pattern of FIG. 9B. Furthermore, the measurement pattern $67_{i,j}$ may be a pattern having a different shape, in which case the corresponding reference pattern needs to be a pattern having a predetermined positional relation with the measurement pattern. That is, the reference pattern only has to be a pattern providing the reference for position deviation of the measurement pattern. Whatever the shape thereof is, the pattern preferably covers the whole image field or exposure area of the projection optical system PL in order to measure the imaging characteristic of the projection optical system PL.

Next, the measurement of the wave-front aberration due to the projection optical system PL of the exposure apparatus 122 (the exposure apparatus $122_1$ through $122_3$) using the reticle $R_T$ will be described.

First the wave-front aberration is measured for a plurality of measurement points (herein, n points) within the field of the projection optical system PL using the measurement reticle $R_T$ in the following manner.

When an operator (or a service engineer) has inputted an instruction to measure the wave-front aberration through the input unit 45, the main controller 50 loads the measurement reticle $R_T$ onto the reticle stage RST via a reticle loader (not shown), and moves the wafer stage WST via the wafer-stage driving portion 56 with monitoring the output of the laser interferometer 54W such that a pair of reticle alignment reference marks on the reference mark plate FM is positioned at a predetermined reference position, specifically for example, such that the center of the pair of reference marks coincides with the origin of the stage coordinate system defined by the laser interferometer 54W.

Next, while simultaneously observing a pair of reticle alignment marks RM1, RM2 on the measurement reticle $R_T$ and the reticle alignment reference marks corresponding thereto using the reticle alignment microscopes, the main controller 50 finely drives the reticle stage RST along the X-Y two-dimensional plane via a driving system (not shown) such that position deviations of projected images on the reference plate FM of the reticle alignment marks RM1, RM2 from the reference marks becomes minimal. By this, reticle alignment is completed, and the center of the reticle almost coincides with the optical axis of the projection optical system PL.

Next, the main controller 50 loads a wafer W whose surface is coated with a resist (photosensitive material) onto the Z-tilt stage 58 via a wafer loader (not shown).

Then, the main controller 50 sets the aperture size of the reticle blind 30 in order to form a rectangular illumination area which covers all the condenser lenses $65_{i,j}$ of the measurement reticle $R_T$ but not the openings $72_1$, $72_2$ and which has an X-direction length not larger than the maximum width in the X-direction of the lens-attaching member 62. At the same time, the main controller 50 rotates the illumination-system aperture stop plate 24 via the driving unit 40 to put a specified aperture stop, for example the small σ stop, on the optical path of the illumination light EL.

Figure 10A:
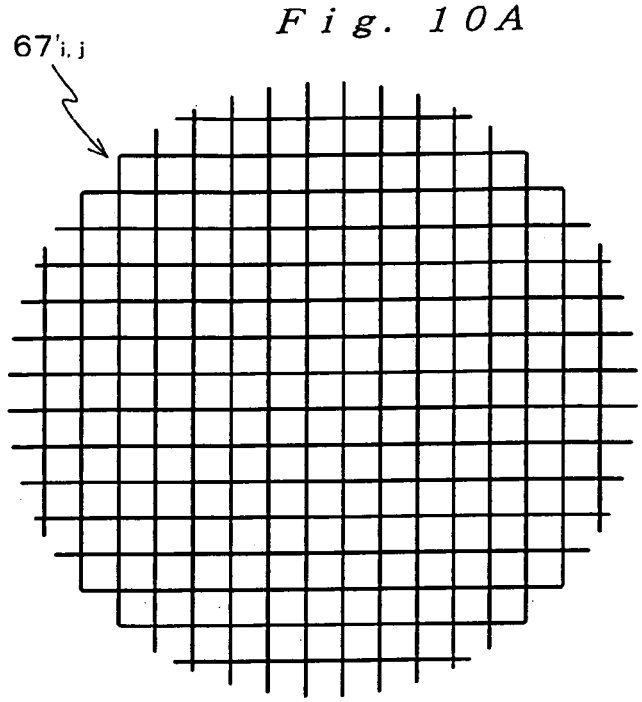
FIG. 10A is a view showing one of reduced images (latent images) of the measurement pattern formed a given distance apart from each other on the resist layer on a wafer.

After that preparation, the main controller 50 supplies control information TS to the light source 16 to make it generate laser beam LB and illuminate and expose the reticle $R_T$ to the illumination light EL. By this, as shown in FIG. 7, the measurement patterns $67_{i,j}$ are simultaneously transferred through the pinhole-like openings $70_{i,j}$ and the projection optical system PL. As a result, the reduced images $67'_{i,j}$ (latent images) of the measurement patterns $67_{i,j}$, as shown in FIG. 10A, are formed spaced a predetermined distance apart from each other two-dimensionally on the resist layer on the wafer W.

Next, the main controller 50 moves the reticle stage RST in the Y-direction by a predetermined distance via a driving system (not shown) based on a measurement value of a reticle laser interferometer and positional relation planned in design between the reticle's center and the reference pattern $74_1$ such that the center of the reference pattern $74_1$ is placed on the optical axis AX. Next, the main controller 50 sets the aperture of the reticle blind 30 via a driving system (not shown) such that the illumination light EL only illuminates a rectangular area having a predetermined size on the lens-attaching member 62 and including the opening $72_1$ (but not any condenser lens).

Then the main controller 50 moves the wafer stage WST with monitoring measurement values of the laser interferometer 54W such that the center of the latent image $67'_{1,1}$ on the wafer W of the first measurement pattern $67_{1,1}$ is placed almost on the optical axis AX.

Then the main controller 50 supplies control information TS to the light source 16 to make it generate laser beam LB and illuminate and expose the reticle $R_T$ to the illumination light EL. By this, the reference pattern $74_1$ is transferred and overlaid onto the area where the latent image of the measurement pattern $67_{1,1}$ is already formed on the resist layer on the wafer W, the area being called an area $S_{1,1}$. As a result, the latent images $67'_{1,1}$ and $74'_1$ of the first measurement pattern $67_{1,1}$ and the reference pattern $74_1$ are formed on the area $S_{1,1}$ in a positional relation as shown in FIG. 10B.

Next, the main controller 50 calculates the arrangement pitch P of the measurement patterns $67_{i,j}$ on the wafer W, which pitch P is planned in design, based on the arrangement pitch of the measurement patterns $67_{i,j}$ on the reticle $R_T$ and the projection magnification of the projection optical system PL and moves the wafer stage WST in the X-direction by the pitch P such that the center of an area $S_{1,2}$ where the latent image of the second measurement pattern $67_{1,2}$ is formed is placed almost on the optical axis AX.

Then the main controller 50 supplies control information TS to the light source 16 to make it generate laser beam LB and illuminate and expose the reticle $R_T$ to the illumination light EL. By this, the reference pattern $74_1$ is transferred and overlaid onto the area $S_{1,2}$ on the wafer W.

Figure 10B:
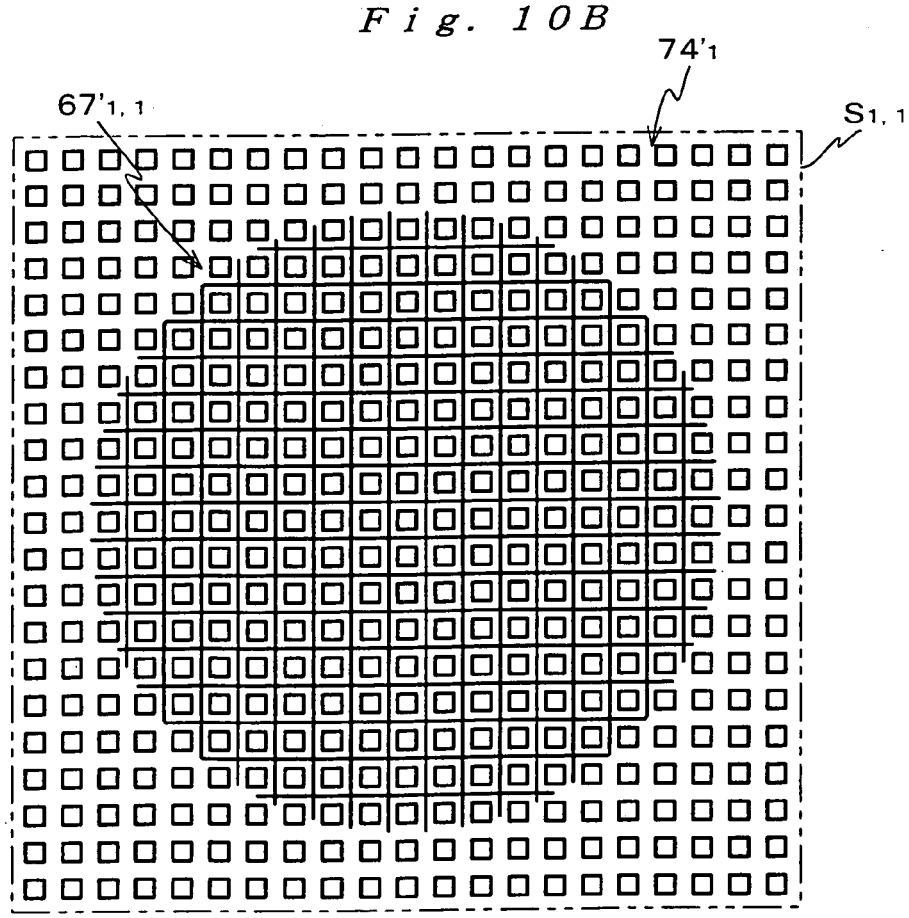
FIG. 10B is a view showing the positional relation between the latent image in FIG. 10A of the measurement pattern and the latent image of the reference pattern.

After that, stepping likewise between the areas and exposure are repeated, so that latent images, as shown in FIG. 10B, of the measurement patterns and the reference pattern are formed in the areas $S_{i,j}$ on the wafer W.

After the completion of exposure, the main controller 50 unloads the wafer W from the Z-tilt stage 58 via the wafer loader (not shown) and transfers the wafer to a coater-developer (not shown; hereinafter, "C/D" for short) connected in-line with the chamber 11, which C/D develops the wafer W, so that the resist images, each having the same arrangement as shown in FIG. 10B, of the measurement patterns and the reference pattern are formed in the areas $S_{i,j}$ arranged in a matrix on the wafer W.

After that, the wafer W already developed is removed from the C/D and an external overlay measuring unit (registration measuring unit) measures overlay errors in the areas $S_{i,j}$. Based on the result, position errors (position deviations) of the resist images of the measurement patterns $67_{i,j}$ from the corresponding reference pattern $74_1$ are calculated. It is remarked that while there are various methods of calculating the position deviations, statistical computation is preferably employed based on measured raw data in terms of improving accuracy.

In this manner, for the areas $S_{i,j}$, X-Y-two-dimensional position deviations ($\Delta\xi'$, $\Delta\eta'$) of the measurement patterns from the corresponding reference patterns are obtained, which are inputted into the main controller 50 through the input unit 45 by the service engineer or the like. It is remarked that the external overlay measuring unit may input the position deviations ($\Delta\xi'$, $\Delta\eta'$) in the areas $S_{i,j}$ into the main controller 50 through the network.

In either case, responding to the input the CPU of the main controller 50 loads the similar computing program to the first program, and, based on the position deviations ($\Delta\xi'$, $\Delta\eta'$), computes the wave-fronts (wave-front aberrations) for the areas $S_{i,j}$, that is, the first through n'th measurement points within the field of the projection optical system PL, specifically, the second term's coefficient $Z_2$ through the 37th term's coefficient $Z_{37}$ of the Zernike polynomial by using the computing program.

Here, the physical relation between the position deviations ($\Delta\xi'$, $\Delta\eta'$) and the wave-front will be briefly described with reference to FIGS. 7 and 8, which is a premise for the computation based on the position deviations ($\Delta\xi'$, $\Delta\eta'$) which the CPU of the main controller 50 performs to obtain the wave-front in the projection optical system PL.

As represented by a measurement pattern $67_{k,l}$ in FIG. 7, one of sub-beams diffracted by a measurement pattern $67_{i,j}$ passes through a respective pinhole-like opening $70_{i,j}$ and then the pupil plane of the projection optical system PL in a different position depending on the position of the measurement pattern $67_{i,j}$. That is, wave-front's part in each position on the pupil plane mainly reflects the wave-front of the sub-beam from the corresponding measurement pattern $67_{i,j}$. If the projection optical system PL caused no aberration, the wave-front on the pupil plane of the projection optical system PL would become an ideal one (herein, a flat plane) indicated by a numerical reference $F_1$. However, because projection optical systems that cause no aberration do not exist, the wave-front on the pupil plane becomes a curved surface $F_2$ represented by a dotted curve for example. Therefore, the measurement pattern $67_{i,j}$ is imaged in a position on the wafer W that deviates according to the angle that the curved surface $F_2$ makes with the ideal wave-front.

Meanwhile, light diffracted by the reference pattern $74_1$ (or $74_2$), as shown in FIG. 8, is not restricted by a pinhole-like aperture, is made incident directly on the projection optical system PL and is imaged on the wafer W through the projection optical system PL. Moreover, because exposure of the reference pattern $74_1$ is performed in a state where the center of the reference pattern $74_1$ is positioned on the optical axis of the projection optical system PL, almost no aberration of the imaging beam from the reference pattern $74_1$ is caused by the projection optical system PL, so that the image is formed with no position deviation on a small area that the optical axis passes through.

Therefore, the position deviations ($\Delta\xi'$, $\Delta\eta'$) directly reflect the tilts of the wave-front to an ideal wave-front, and based on the position deviations ($\Delta\xi'$, $\Delta\eta'$) the wave-front can be drawn. It is noted that as physical relation between the position deviations ($\Delta\xi'$, $\Delta\eta'$) and the wave-front indicates, the principle of this embodiment for calculating the wave-front is the known Shack-Hartmann wave-front calculation principle.

Disclosed in U.S. Pat. No. 5,978,085 is an invention concerning the technology where a plurality of measurement patterns on a mask having the same structure as the measurement reticle $R_T$ are sequentially imaged on a substrate through respective pinholes and a projection optical system, where a reference pattern on the mask is imaged on the substrate through the projection optical system but not through condenser lenses and the pinholes, and where position deviations of the resist images of the plurality of measurement patterns from the respective resist images of the reference pattern are measured to calculate the wave-front aberration by a predetermined computation.

Incidentally, when semiconductor devices are manufactured using the exposure apparatuses $122_1$ through $122_3$ of this embodiment, preparation such as reticle alignment, so-called base-line measurement and EGA (Enhanced Global Alignment) is perforemed after a reticle R for manufacturing the devices is loaded onto the reticle stage RST.

The above preparation such as reticle alignment and base-line measurement is disclosed in detail in, for example, Japanese Patent Laid-Open No. 4-324923 and U.S. Pat. No. 5,243,195 corresponding thereto. Furthermore, the EGA is disclosed in detail in, for example, Japanese Patent Laid-Open No. 61-44429 and U.S. Pat. No. 4,780,617 corresponding thereto. The disclosures in the above U.S. Patents are incorporated herein by reference as long as the national laws in designated states or elected states, to which this international application is applied, permit.

After that, exposure of the step-and-repeat type as in the measurement of the wave-front aberration using the measurement reticle $R_T$ is performed, in which stepping is performed based on the result of wafer alignment. Because the exposure operation is the same as in a usual stepper, its detailed description is omitted.

Next, the method of making the projection optical system PL in the making of the exposure apparatus 122 ($122_1$ through $122_3$) will be described.

a. Determining the Specification for the Projection Optical System PL

An engineer or the like of the maker A inputs into the first communication server 120 via its input unit (not shown) target information for the exposure apparatus such as an exposure wavelength, a minimum line width (resolution) and information regarding a pattern to be exposed, and instructs the first communication server 120, via its input unit, to send the target information.

The first communication server 120 inquires of the second communication server 130 whether or not it can receive data, and, when the second communication server 130 replies that it can receive data, sends the target information to the second communication server 130.

The second communication server 130 receives and analyzes the target information, selects based on the result of the analysis one of seven methods described later for determining the specification, and determines and stores the specification in RAM.

Here, before explaining the methods of determining the specification, what aberrations the terms of the Zernike polynomial (fringe Zernike polynomial) in which the wave-front is expanded are associated with will be briefly described. Each term includes the function $f_i(\rho,\theta)$ as shown in table 1 and is a term of n'th order and $m\theta$, where n indicates the maximum power of $\rho$ and m the coefficient of $\theta$.

The 0 order, $0\theta$ term (coefficient $Z_1$) represents the position of the wave-front and is not associated with any aberration.

The first order, $1\theta$ term (coefficients $Z_2$, $Z_3$) represents the distortion component.

The second order, $0\theta$ term (coefficient $Z_4$) represents the field curvature.

The third and over order, $0\theta$ terms (coefficients $Z_9$, $Z_{16}$, $Z_{25}$, $Z_{36}$, $Z_{37}$) represent the spherical aberration component.

The $2\theta$ terms (coefficients $Z_5$, $Z_6$, $Z_{12}$, $Z_{13}$, $Z_{21}$, $Z_{22}$, $Z_{32}$, $Z_{33}$) and the $4\theta$ terms (coefficients $Z_{17}$, $Z_{18}$, $Z_{28}$, $Z_{29}$) represent the astigmatism component.

The third and over order, $1\theta$ terms (coefficients $Z_7$, $Z_8$, $Z_{14}$, $Z_{15}$, $Z_{23}$, $Z_{24}$, $Z_{34}$, $Z_{35}$), the third and over order, $3\theta$ terms (coefficients $Z_{10}$, $Z_{11}$, $Z_{19}$, $Z_{20}$, $Z_{30}$, $Z_{31}$) and the $5\theta$ terms (coefficient $Z_{26}$, $Z_{27}$) represent the coma component.

The seven methods of determining the specification with using as a standard the wave-front aberration amount that the projection optical system PL is to satisfy will be described in the below.

<A First Method>

In this method, the coefficients of terms specified by the target information out of the terms of the Zernike polynomial in which the wave-front in the projection optical system is expanded are selected as standards. In the first method, with using, e.g., the coefficients $Z_2$, $Z_3$ corresponding to the distortion component as standards when the target information contains a resolving power for example, the specification of the projection optical system PL is determined such that the coefficients within the field are at or below respective, predetermined values.

<A Second Method>

In this method, with using the RMS value (Root-Mean-Square value) of the coefficients of the terms of the Zernike polynomial in which the wave-front in the projection optical system is expanded as a standard, the specification of the projection optical system PL is determined such that the RMS value within the field is not larger than a given limit. By the second method field curvature, etc., can be constrained. The second method can be suitably applied to any target information. Alternatively, for each coefficient the RMS value of its values within the field may be used as a standard.

<A Third Method>

In this method, with selecting as standards the coefficients of the terms of the Zernike polynomial in which the wave-front in the projection optical system is expanded, the specification of the projection optical system PL is determined such that the coefficients within the field are at or below respective, given limits. In the third method the limits may all be the same in value or different from each other, or some of the limits may be the same in value.

A Fourth Method

In this method, with using as a standard the RMS value, within the field, of the coefficients of terms (n'th order, mθ terms), which correspond to a given aberration, out of the terms of the Zernike polynomial in which the wave-front in the projection optical system is expanded, the specification of the projection optical system PL is determined such that the RMS value is not larger than a given limit. In the fourth method when the target information contains pattern information, based on a presumption, obtained from the pattern information, which aberration must particularly be restricted in order to form a good projected image of the pattern on the image plane, the limits for the RMS values of the coefficients of n'th order, mθ terms are determined, for example, as follows.

Let the RMS value $A_1$ of the coefficients $Z_2$, $Z_3$ within the field be a standard, then the standard $A_1 \leq$ limit $B_1$.

Let the RMS value $A_2$ of the coefficient $Z_4$ within the field be a standard, then the standard $A_2 \leq$ limit $B_2$.

Let the RMS value $A_3$ of the coefficients $Z_5$, $Z_6$ within the field be a standard, then the standard $A_3 \leq$ limit $B_3$.

Let the RMS value $A_4$ of the coefficients $Z_7$, $Z_8$ within the field be a standard, then the standard $A_4 \leq$ limit $B_4$.

Let the RMS value $A_5$ of the coefficient $Z_9$ within the field be a standard, then the standard $A_5 \leq$ limit $B_5$.

Let the RMS value $A_6$ of the coefficients $Z_{10}$, $Z_{11}$ within the field be a standard, then the standard $A_6 \leq$ limit $B_6$.

Let the RMS value $A_7$ of the coefficients $Z_{12}$, $Z_{13}$ within the field be a standard, then the standard $A_7 \leq$ limit $B_7$.

Let the RMS value $A_8$ of the coefficients $Z_{14}$, $Z_{15}$ within the field be a standard, then the standard $A_8 \leq$ limit $B_8$.

Let the RMS value $A_9$ of the coefficient $Z_{16}$ within the field be a standard, then the standard $A_9 \leq$ limit $B_9$.

Let the RMS value $A_{10}$ of the coefficients $Z_{17}$, $Z_{18}$ within the field be a standard, then the standard $A_{10} \leq$ limit $B_{10}$.

Let the RMS value $A_{11}$ of the coefficients $Z_{19}$, $Z_{20}$ within the field be a standard, then the standard $A_{11} \leq$ limit $B_{11}$.

Let the RMS value $A_{12}$ of the coefficients $Z_{21}$, $Z_{22}$ within the field be a standard, then the standard $A_{12} \leq$ limit $B_{12}$.

Let the RMS value $A_{13}$ of the coefficients $Z_{23}$, $Z_{24}$ within the field be a standard, then the standard $A_{13} \leq$ limit $B_{13}$.

Let the RMS value $A_{14}$ of the coefficient $Z_{25}$ within the field be a standard, then the standard $A_{14} \leq$ limit $B_{14}$.

Let the RMS value $A_{15}$ of the coefficients $Z_{26}$, $Z_{27}$ within the field be a standard, then the standard $A_{15} \leq$ limit $B_{15}$.

Let the RMS value $A_{16}$ of the coefficients $Z_{28}$, $Z_{29}$ within the field be a standard, then the standard $A_{16} \leq$ limit $B_{16}$.

Let the RMS value $A_{17}$ of the coefficients $Z_{30}$, $Z_{31}$ within the field be a standard, then the standard $A_{17} \leq$ limit $B_{17}$.

Let the RMS value $A_{18}$ of the coefficients $Z_{32}$, $Z_{33}$ within the field be a standard, then the standard $A_{18} \leq$ limit $B_{18}$.

Let the RMS value $A_{19}$ of the coefficients $Z_{34}$, $Z_{35}$ within the field be a standard, then the standard $A_{19} \leq$ limit $B_{19}$.

Let the RMS value $A_{20}$ of the coefficients $Z_{36}$, $Z_{37}$ within the field be a standard, then the standard $A_{20} \leq$ limit $B_{20}$.

A Fifth Method

In a fifth method, with using as a standard the RMS value, within the field, of the coefficients of each group of mθ terms having the same mθ value out of terms, which correspond to a given aberration, out of the terms of the Zernike polynomial in which the wave-front in the projection optical system is expanded, the specification of the projection optical system PL is determined such that the RMS value for each group is not larger than a respective, given limit.

For example, let the RMS value $C_1$, within the field, of the coefficients $Z_9$, $Z_{16}$, $Z_{25}$, $Z_{36}$, $Z_{37}$ of the third and over order, 0θ terms be a standard, then the standard $C_1 \leq$ limit $D_1$.

Let the RMS value $C_2$, within the field, of the coefficients $Z_7$, $Z_8$, $Z_{14}$, $Z_{15}$, $Z_{23}$, $Z_{24}$, $Z_{34}$, $Z_{35}$ of the third and over order, 1θ terms be a standard, then the standard $C_2 \leq$ limit $D_2$.

Let the RMS value $C_3$, within the field, of the coefficients $Z_5$, $Z_6$, $Z_{12}$, $Z_{13}$, $Z_{21}$, $Z_{22}$, $Z_{32}$, $Z_{33}$ of the 2θ terms be a standard, then the standard $C_3 \leq$ limit $D_3$.

Let the RMS value $C_4$, within the field, of the coefficients $Z_{10}$, $Z_{11}$, $Z_{19}$, $Z_{20}$, $Z_{30}$, $Z_{31}$ of the 3θ terms be a standard, then the standard $C_4 \leq$ limit $D_4$.

Let the RMS value $C_5$, within the field, of the coefficients $Z_{17}$, $Z_{18}$, $Z_{28}$, $Z_{29}$ of the 4θ terms be a standard, then the standard $C_5 \leq$ limit $D_5$.

Let the RMS value $C_6$, within the field, of the coefficients $Z_{26}$, $Z_{27}$ of the 5θ terms be a standard, then the standard $C_6 \leq$ limit $D_6$.

Also in this method, as is obvious from the meanings of the coefficients, when the target information contains pattern information, based on a presumption, obtained from the pattern information, which aberration must particularly be restricted in order to form a good projected image of the pattern on the image plane, a standard is selected.

A Sixth Method

In a sixth method, with using a given standard of the RMS value, within the field, of coefficients given by weighting according to the target information the coefficients of the terms of the Zernike polynomial in which the wave-front in the projection optical system is expanded, the specification of the projection optical system is determined such that the RMS value is not larger than a given limit. Also in this method when the target information contains pattern information, based on a presumption, obtained from the pattern information, which aberration must particularly be restricted in order to form a good projected image of the pattern on the image plane, the weights are determined.

A Seventh Method

A seventh method can be employed only when the target information contains information about a pattern that the projection optical system projects, and by analyzing the result of a simulation for, based on the pattern information, obtaining a space image formed on the image plane when the projection optical system projects the pattern, the specification of the projection optical system is determined using as a standard the wave-front aberration amount allowed for the projection optical system such that the pattern is transferred finely. In the simulation, based on linear combinations between sensitivities (Zernike Sensitivity) of the coefficients of the terms of the Zernike polynomial in which the wave-front in the projection optical system is expanded, to a given aberration (or an index) for the pattern (object pattern) and the coefficients of the terms of the Zernike polynomial, the space image may be obtained which sensitivities are given from Zernike-variations tables which were created beforehand in the same way as above, the sensitivities depending on said pattern.

This will be described in more detail below. There exists a relation given by the following equation (13) between a matrix f with n rows and m columns that comprises data of various aberrations (or their indexes) in n measurement points within the field of the projection optical system, for example, m kinds of aberrations and a matrix Wa with n rows and 36 columns that comprises the wave-front aberration data for n measurement points, for example, terms' coefficients (e.g. the second term's coefficient $Z_2$ through the 37th term's coefficient $Z_{37}$) of the Zernike polynomial in which the wave-front aberration is expanded and a Zernike-variations table, i.e., a matrix ZS with, e.g., 36 rows and m columns that comprises variation (Zernike Sensitivity) per 1λ in each of the coefficients (e.g. $Z_2$ through $Z_{37}$) of Zernike polynomial's terms corresponding to m kinds of aberrations under given exposure conditions:

$$f = Wa \times ZS. \tag{13}$$

Here, f, Wa, and ZS are represented by, for example, the equations (14), (15), (16) respectively:

$$f = \begin{bmatrix} f_{1,1} & f_{1,2} & \cdots & f_{1,m} \\ f_{2,1} & \ddots & & f_{2,m} \\ \vdots & & \ddots & \vdots \\ f_{n,1} & f_{n,2} & \cdots & f_{n,m} \end{bmatrix} \tag{14}$$

$$Wa = \begin{bmatrix} Z_{1,2} & Z_{1,3} & \cdots & Z_{1,36} & Z_{1,37} \\ Z_{2,2} & & & & Z_{2,37} \\ \vdots & & \ddots & & \vdots \\ \vdots & & & & \vdots \\ Z_{n,2} & Z_{n,3} & \cdots & Z_{n,36} & Z_{n,37} \end{bmatrix} \tag{15}$$

$$ZS = \begin{bmatrix} b_{1,1} & b_{1,2} & \cdots & b_{1,m} \\ b_{2,1} & \ddots & & b_{2,m} \\ \vdots & & \ddots & \vdots \\ b_{36,1} & b_{36,2} & \cdots & b_{36,m} \end{bmatrix} \tag{16}$$

As the equation (13) indicates, the amount of any aberration can be defined by using the Zernike-variations table and the wave-front aberration data (for example, terms' coefficients (e.g. the second term's coefficient $Z_2$ through the 37th term's coefficient $Z_{37}$) of the Zernike polynomial in which the wave-front aberration is expanded). In other words, by specifying desired aberration values in the form of f (equation (14)), and solving the equation (13) with the known (created before) Zernike-variations table, the values of terms' coefficients (e.g. the second term's coefficient $Z_2$ through the 37th term's coefficient $Z_{37}$) of the Zernike polynomial for each measurement point within the field of the projection optical system can be determined which values make the amount of a specific aberration at a desired value.

That is, in the seventh method the specification of the projection optical system is determined using as a standard the wave-front aberration (terms' coefficients of the Zernike polynomial in which the wave-front is expanded) for a space image of the pattern where the amount of a specific aberration, e.g., a line-width abnormal value (an index of coma) is at a given value.

In any of the above methods of determining the specification, the specification of the projection optical system is determined based on information of the target that the exposure apparatus must achieve, with using as a standard the information of the wave-front on the pupil plane of the projection optical system, that is, the overall information of light passing the pupil plane, and therefore by making the projection optical system satisfying the specification, the target of the exposure apparatus can be securely achieved.

b. The Process of Making a Projection Optical System

Figure 11:
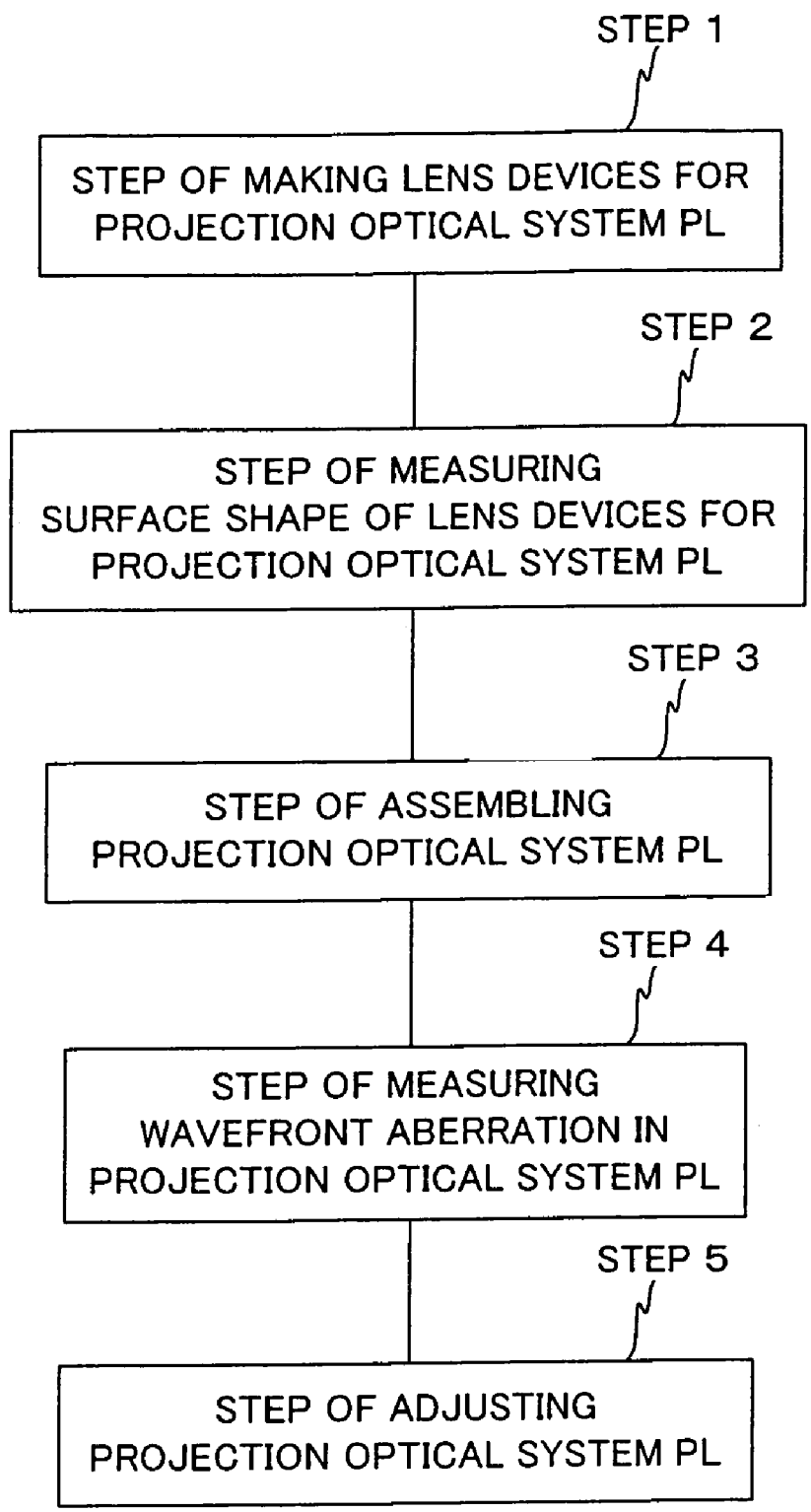
FIG. 11 is a flow chart schematically showing the process of making the projection optical system.

Next, the process of making a projection optical system will be described with reference to a flow chart in FIG. 11.

[Step 1]

First in a step 1, lens devices, lens holders for holding the lens device, and a lens barrel for housing optical units each comprising the lens device and the lens holder are made according to given lens data in design which are optical members composing the projection optical system. That is, a known lens-processing apparatus processes given optical material to the lens devices such that these have a radius of curvature and a thickness along the axis, which were planned in design. And a known metal-processing apparatus processes given material (stainless, brass, ceramic, etc.) to the lens barrel for housing the optical units comprising the lens device and the lens holder such that it has dimensions which were planned in design.

[Step 2]

In a step 2, the surface shapes of the lens devices of the projection optical system PL made in the step 1 are measured by, for example, a Fizeau-type interferometer which employs a He—Ne gas laser emitting light having a wavelength of 633 nm, an Ar laser emitting light having a wavelength of 363 nm, or a light source which converts an Ar-laser light into a higher-harmonic wave having a wavelength of 248 nm from an Ar laser. The Fizeau-type interferometer measures by a pick-up unit such as CCD an interference fringe caused by light reflected by a reference surface on the surface of a condenser lens on the optical path and light reflected by the surface of a lens device to be measured, so that it can accurately obtain the shape of the surface to be measured. Obtaining the shape of the surface (lens surface) of an optical device such as a lens by using the Fizeau-type interferometer is disclosed in, for example, Japanese Patent Laid-Open No. 62-126305 and Japanese Patent Laid-Open No. 6-185997, and thus its detailed description is omitted.

For the lens surfaces of all lens devices forming part of the projection optical system PL, the measuring of the shape of the surface of an optical device using the Fizeau-type interferometer is performed, and the measurement results are stored in a memory such as RAM or a storage unit such as a hard disk of the second communication server 130 through an input unit (not shown) such as a console.

[Step 3]

After the completion of, in step 2, measuring the shapes of the lens surfaces of all lens devices forming part of the projection optical system PL, the plurality of optical units each comprising the lens device and a lens holder for holding the lens device which are processed according to design values are assembled individually. A plurality of, for example, four units of these optical units each have the movable lens $13_1$ through $13_4$ and a double-structured lens holder described above which has an inner lens holder for holding the movable lens $13_1$ through $13_4$ and an outer lens holder for holding the inner lens holder, between which the positional relation are adjustable through a mechanical adjustment mechanism. The double-structured lens holder further comprises the above driving devices arranged in respective, predetermined positions.

Then the plurality of optical units are assembled individually by sequentially dropping these and a spacer each time between these into the lens barrel through its upper opening. The optical unit which was first dropped in the lens barrel is supported by a protrusion in the lower end of the lens barrel via a spacer, and when all the optical units have been accommodated in the lens barrel, the assembly ends. During the assembly, distances between the optical surfaces (lens surfaces) of the lens devices are measured by a tool (micrometer, etc.) with taking into account the thickness of the spacers to be accommodated in the lens barrel. And the assembly and the measurement are repeated to obtain final distances upon the completion of the assembly in the step 3 between the optical surfaces (lens surfaces) of the lens devices in the projection optical system PL.

Incidentally, during the making process including the assembly, the movable lenses $13_1$ through $13_4$ are fixed in their neutral positions. Although the explanation is omitted, the pupil aperture stop 15 is instaled in the projection optical system PL in the assembly.

The results of measuring, during the assembly and upon its completion, distances between the optical surfaces (lens surfaces) of the lens devices in the projection optical system PL are stored in a memory such as RAM or a storage unit such as a hard disk of the second communication server 130 through the input unit (not shown) such as a console. It is remarked that in the assembly the optical units may be adjusted as needed.

At that time, relative distances along the optical axis between the optical devices are changed via, e.g., a mechanical adjustment mechanism, or the optical devices are tilted to a direction perpendicular to the optical axis. Moreover, the lens barrel may have a tapped hole made therein and a screw which screws through the tapped hole and which touches the lens holder so that the lens holder can be displaced in a direction perpendicular to the optical axis to adjust eccentricity, etc., thereof by screwing the screw with a tool such as a screw-driver.

[Step 4]

Next, a step 4 measures the wave-front aberration due to the projection optical system PL assembled in the step 3.

Specifically, the projection optical system PL is attached to the body of a large-sized wave-front measuring apparatus (not shown), and the wave-front aberration is measured. The principle of the wave-front measuring apparatus measuring the wave-front is the same as in the wave-front-aberration measuring unit 80 and thus its detailed description is omitted.

As a result of measuring the wave-front, terms' coefficients $Z_i$ (i=1, 2, through 81) of the Zernike polynomial (fringe Zernike polynomial) in which the wave-front in the projection optical system is expanded are obtained. Thus when the second communication server 130 is connected with the wave-front measuring apparatus, the terms' coefficients $Z_i$ of the Zernike polynomial are automatically stored in a memory such as RAM (or a storage unit such as a hard disk) of the second communication server 130. While in the above description the wave-front measuring apparatus outputs the coefficients up to the 81st term of the Zernike polynomial in order to calculate higher-order components of the aberrations due to the projection optical system PL, coefficients up to the 37th term as in the wave-front-aberration measuring unit or coefficients over the 81st term may be output.

[Step 5]

In a step 5, the projection optical system PL is adjusted based on the wave-front aberration measured in the step 4 such that the wave-front aberration satisfies the specification determined according to one of the first through seventh methods of determining the specification.

Before the adjustment of the projection optical system PL, the second communication server 130 reproduces optical data in the making process of the projection optical system PL based on information in the memory, that is, the shape information of the surfaces of the optical devices obtained in the step 2, the information of distances between the optical surfaces of the lens devices obtained in the assembly of the step 3 and optical basic data stored beforehand, which reproduced data is used to calculate adjustment amounts for the optical devices.

That is, a basic database for adjustment is already stored in the hard disk of the second communication server 130, which database contains, for all the lens devices of the projection optical system PL, the variation of each term's coefficient $Z_i$ of the Zernike polynomial relative to a unit drive amount in each of the six directions where the lens devices are movable, which variation is calculated based on design values of the projection optical system, the database being a matrix given by expanding the matrix O so as to contain non-movable lenses as well as the movable lenses. The second communication server 130 performs a predetermined computation based on the optical data in the making process for the projection optical system PL to correct the basic database for adjustment.

And when one of the first through sixth methods is selected, the second communication server 130, using a predetermined computing program and the least-squares method, calculates drive amount for each lens device in each of the six directions where the lens devices are movable, based on the corrected basic database, the target values for the wave-front, i.e. limits for terms' coefficients $Z_i$ of the Zernike polynomial given by the selected method of determining the specification, and measured values of the terms' coefficients $Z_i$ of the Zernike polynomial, which are a result of measurement by the wave-front measuring apparatus.

Then the second communication server 130 displays on screen information of drive amounts (may be zero) for the lens devices in each of the six directions where the lens devices are movable.

According to the display, an engineer (or operator) adjusts the lens devices, so that the projection optical system PL is adjusted so as to satisfy the specification determined according to the selected method of determining the specification.

Specifically, when the first method is selected as the method of determining the specification, the projection optical system PL is adjusted such that the coefficients of specific terms selected based on the target information out of the terms of the Zernike polynomial in which the wave-front in the projection optical system is expanded are not over the limits. When the second method is selected, the projection optical system PL is adjusted such that the RMS value of terms' coefficients of the Zernike polynomial in which the wave-front within the field of the projection optical system is expanded is not over the limit. When the third method is selected, the projection optical system PL is adjusted such that terms' coefficients of the Zernike polynomial in which the wave-front in the projection optical system is expanded are not over the respective limits. When the fourth method is selected, the projection optical system PL is adjusted such that the RMS value, within the field, of the coefficients of terms (n'th order, mθ terms), which correspond to a given aberration, out of the terms of the Zernike polynomial in which the wave-front within the field of the projection optical system is expanded is not over the limit. When the fifth method is selected, the projection optical system PL is adjusted such that the RMS value, within the field, of the coefficients of each group of mθ terms having the same mθ value out of terms, which correspond to a given aberration, out of the terms of the Zernike polynomial in which the wave-front within the field of the projection optical system is expanded is not over the limit. When the sixth method is selected, the projection optical system PL is adjusted such that the RMS value, within the field, of coefficients given by weighting according to the target information the coefficients of the terms of the Zernike polynomial in which the wave-front within the field of the projection optical system is expanded is not over the limit.

When the seventh method is selected, the second communication server 130 performs a simulation for obtaining a space image formed on the image plane when the pattern is projected by the projection optical system PL based on the pattern information contained in the target information, and analyzes the simulation result to adjust the projection optical system PL such that the projection optical system satisfies the wave-front aberration amount allowed for transferring the pattern finely. In the simulation, based on linear combinations between sensitivities (Zernike Sensitivity) of the coefficients of the terms of the Zernike polynomial, in which the wave-front in the projection optical system is expanded, to a watched aberration (or an index) for the pattern (object pattern) and the coefficients of the terms of the Zernike polynomial, the second communication server 130 obtains the space image, which sensitivities are given by Zernike-variations tables which were created beforehand in the same way as above, and calculates a drive amount for each lens device, which makes the amount of the watched aberration at or below a limit, based on the space image and by using the least-squares method.

Then the second communication server 130 displays on screen information of drive amounts (may be zero) for the lens devices in each of the six directions where the lens devices are movable. According to the display, an engineer (or operator) adjusts the lens devices, so that the projection optical system PL is adjusted so as to satisfy the specification determined according to the seventh method of determining the specification.

In any of the methods, because the projection optical system PL is adjusted based on a result of measuring the wave-front in the projection optical system, higher-order components of the wave-front aberration can be adjusted simultaneously as well as lower-order components, without considering the order of aberrations to be adjusted as in the prior art. Therefore, it is possible to adjust the optical characteristic of the projection optical system very accurately and easily, and the projection optical system PL can be made which substantially satisfies the determined specification.

Although, in this embodiment, after, in step 4, measuring the wave-front aberration and installing the not-adjusted projection optical system in the exposure apparatus, the projection optical system is adjusted, the projection optical system adjusted may be installed in the exposure apparatus after having adjusted the projection optical system (reprocessing, replacement, etc., of optical devices). Here, for example, an operator may adjust the projection optical system by adjusting the positions of optical devices without using the imaging-characteristic adjusting mechanism. Further, based on the result of, after installing the projection optical system in the exposure apparatus, measuring the wave-front aberration with the wave-front-aberration measuring unit 80 or the measurement reticle $R_T$ again, the projection optical system is preferably readjusted.

While in the above measuring of the wave-front upon the adjustment of the projection optical system, the wave-front measuring unit uses a space image formed through a pinhole and the projection optical system PL, not being limited to this, it may use the pattern formed on a wafer W by projecting, for example, the image of a predetermined measurement pattern of the measurement reticle $R_T$ through a pinhole and the projection optical system PL.

It is remarked that in order to make easy reprocessing of optical devices of the projection optical system PL, after identifying an optical device that needs reprocessing based on a result of the wave-front measuring apparatus measuring the wave-front aberration, reprocessing the optical device and readjusting other optical devices may be performed at the same time. Furthermore, if reprocessing or replacement of optical devices of the projection optical system is necessary, the reprocessing or replacement is preferably performed before installing the projection optical system in the exposure apparatus.

Next, the method of making the exposure apparatus 122 will be described.

First in the making of the exposure apparatus 122, the illumination optical system 12 comprising a plurality of lens devices and mirrors is assembled as a unit while the projection optical system PL is assembled as a unit in the above way. And a reticle stage system and a wafer stage system, which each comprise a lot of mechanical elements, are assembled as individual units, and optical adjustment, mechanical adjustment, electric adjustment, etc., are performed so that these achieve desirable performance. During the adjustments, the projection optical system PL is also adjusted in the above way.

Next, the illumination optical system 12 and the projection optical system PL are installed in an exposure-apparatus main body, and the reticle stage system and the wafer stage system are attached to the exposure-apparatus main body, and these are connected together with electric wires and pipes.

Then, optical adjustment is performed on the illumination optical system 12 and the projection optical system PL because, between before and after being installed in the exposure-apparatus main body, optical characteristics, particularly the imaging characteristic of the projection optical system PL, are different. In this embodiment, upon the optical adjustment of the projection optical system PL after being installed in the exposure-apparatus main body, the wave-front aberration is measured in the same way as above after having attached the wave-front-aberration measuring unit 80 to the Z-tilt stage 58. Wave-front information of measurement points as a result of measuring the wave-front aberration is sent via the network from the main controller 50 of the exposure apparatus to the second communication server 130, which, using, e.g., the least-squares method, calculates and displays drive amounts for the lens devices in each of the six directions where the lens devices are movable, in the same way as in adjustment in the making of the projection optical system PL as a single unit.

And according to the display, an engineer (or operator) adjusts the lens devices, so that the projection optical system PL is made which securely satisfies the specification determined.

Although it is possible for the main controller 50 to automatically perform the final adjustment on the projection optical system PL via the imaging-characteristic correcting controller 48 according to instructions from the second communication server 130 in the making process, the movable lenses are preferably kept in their neutral positions after the completion of making the exposure apparatus in order to ensure enough drive stroke of driving devices just after having introduced into a semiconductor-manufacturing factory. Furthermore, because higher-order components of the wave-front aberration are supposedly difficult to automatically correct, the positions, etc., of the lenses, etc., are preferably readjusted.

It is remarked that for example when the above readjustment does not yield a desirable performance, some lenses need to be reprocessed or replaced. In order to make easy reprocessing of optical devices of the projection optical system PL, an optical device that needs reprocessing may be, as described above, identified based on a result of a wave-front measuring apparatus measuring the wave-front aberration in the projection optical system PL before installing the projection optical system PL in the exposure-apparatus main body, or reprocessing the optical device and readjusting other optical devices may be performed at the same time.

Moreover, optical devices of the projection optical system PL may be individually replaced or, when the projection optical system has a plurality of lens barrels, lens barrels as units may be replaced. Furthermore, in reprocessing the optical device, its surface may be processed so as to become non-spherical, if necessary. Yet further, in adjusting the projection optical system PL only the position (or distance from another), tilt, etc., of an optical device thereof may be changed, or, when the optical device is a lens, its eccentricity may be changed, or it may be rotated about the optical axis AX.

After that, overall adjustment (electrical adjustment, operation verification, etc.) is performed. By this, the exposure apparatus 122 of this embodiment has been made which can accurately transfer a pattern on a reticle R onto a wafer W by the projection optical system PL whose optical characteristic has been adjusted very accurately. It is remarked that the making of the exposure apparatus is preferably performed in a clean room where the temperature and cleanliness are controlled.

As described above, according to the computer system 10 of this embodiment and the methods of determining the specification of the projection optical system, the specification of the projection optical system is determined based on target information that the exposure apparatus 122 should achieve and a given standard of the wave-front aberration due to the projection optical system PL. That is, the specification of the projection optical system is determined using a given standard of information of the wave-front on the pupil plane of the projection optical system. Therefore, the projection optical system PL is adjusted based on a result of measuring the wave-front aberration, for example, in making the projection optical system PL according to the determined specification, so that higher-order components of the wave-front aberration are simultaneously adjusted as well as lower-order components. Thus compared with the prior art where after the adjustment of the projection optical system for correcting lower-order components, the adjustment of the projection optical system for correcting higher-order components is performed based on a result of detecting the higher-order components by tracing light-rays, the process of making the projection optical system is obviously simple. In addition, because the specification is determined based on the target information, the exposure apparatus 122 comprising the projection optical system can securely achieve the target.

In addition, in this embodiment, in adjusting the projection optical system in the process of making the projection optical system and exposure apparatus, after determining the specification and measuring the wave-front aberration due to the projection optical system PL, the projection optical system PL is adjusted based on the measurement result so as to satisfy the specification. Therefore, the projection optical system PL can be easily and securely made which satisfies the specification. Thus, sequentially performing the adjustments for lower-order components and for higher-order components and tracing light-rays for the adjustment as in the prior art are not needed, so that the process of making the projection optical system PL becomes simpler and that the exposure apparatus 122 comprising the projection optical system securely achieves the target.

In this embodiment, both before and after installing the projection optical system PL in the exposure-apparatus main body, the wave-front aberration is measured. In the former, the wave-front aberration measuring apparatus very accurately measures the wave-front in the projection optical system, and in the latter the optical characteristic of the projection optical system can be very accurately adjusted regardless of whether or not environmental conditions are different between before and after installing the projection optical system PL in the exposure-apparatus main body. Alternatively, either before or after installing the projection optical system PL in the exposure-apparatus main body, the wave-front aberration may be measured.

In any of the cases, because the projection optical system PL is adjusted based on a result of measuring the wave-front in the projection optical system, higher-order components of the wave-front aberration can be adjusted simultaneously as well as lower-order components, without considering the order of aberrations to be adjusted as in the prior art. Therefore, it is possible to adjust the optical characteristic of the projection optical system very accurately and easily, and the projection optical system PL can be made which substantially satisfies the determined specification.

According to the exposure apparatus 122 of this embodiment, the main controller 50 measures the wave-front in the projection optical system via the wave-front-aberration measuring unit 80 (or the measurement reticle $R_T$) as described above, and controls the imaging-characteristic adjusting mechanism (48, $13_1$ through $13_4$), etc., using the result of measuring the wave-front, which provides overall information on light passing through the pupil plane of the projection optical system. Therefore, the imaging characteristic of the projection optical system PL is automatically adjusted using the result of measuring the wave-front, so that the image of a pattern formed by the projection optical system PL is adjusted to be fine.

In addition, because the exposure apparatus 122 of this embodiment comprises the projection optical system PL that has been made according to the making method and adjusted in terms of higher-order components of the wave-front aberration as well as lower-order components in the later adjustment as well as in the making process, a pattern of a reticle R can be accurately transferred onto a wafer W by the projection optical system PL.

In addition, according to the computer system 10 of this embodiment, the wave-front-aberration measuring unit 80 of the exposure apparatus 122 measures the wave-front in the projection optical system PL. The first communication server 120 sends the result of the wave-front-aberration measuring unit 80 measuring the wave-front in the projection optical system PL to the second communication server 130, which controls the imaging-characteristic adjusting mechanism (48, $13_1$ through $13_4$), using the result of measuring the wave-front. Therefore, the imaging characteristic of the projection optical system PL is accurately adjusted using information of the wave-front on the pupil plane of the projection optical system, that is, overall information on light passing through the pupil plane, so that the image of a pattern formed by the projection optical system PL is adjusted to be optimal. The second communication server 130 can be disposed in a remote position from the exposure apparatus 122 and the first communication server 120 connected thereto, in which case the imaging characteristic of the projection optical system PL and thus the image of a pattern formed by the projection optical system PL can be very accurately adjusted in remote control.

According to the computer system 10 of this embodiment and the method of determining optimum conditions, when a host computer managing the exposure apparatus 122 or an operator has inputted information on exposure conditions including pattern information into the first communication server 120, the second communication server 130 repeats the simulation for obtaining a space image of the pattern formed on the image plane based on the pattern information included in the information on exposure conditions received from the first communication server 120 through the network and known aberration information of the projection optical system PL, and determines optimum exposure conditions by analyzing the simulation results. Therefore, the exposure conditions are almost automatically set to be optimal.

According to the computer system 10 of this embodiment, when adjusting the projection optical system PL upon, e.g., the maintenance of the exposure apparatus 122, a service engineer, etc., attaches the wave-front-aberration measuring unit 80 to the Z-tilt stage 58 and instructs to measure the wave-front via the input unit 45, so that the second communication server 130 very accurately adjusts the imaging characteristic of the projection optical system PL in remote control. Alternatively, a service engineer, etc., using the measurement reticle $R_T$, may measure the wave-front aberration due to the projection optical system PL of the exposure apparatus 122 in the above procedure, and input position deviation data obtained by the measurement into the main controller 50 of the exposure apparatus 122, in which case also the second communication server 130 can very accurately adjust the imaging characteristic of the projection optical system PL in remote control.

Furthermore, the exposure apparatus 122 whose exposure conditions are set to be optimal before exposure can, with high overlay accuracy, transfer a fine pattern on a reticle R onto a wafer W via the projection optical system PL whose imaging characteristic has been adjusted accurately.

Although the above embodiment describes the case where an adjusting apparatus for adjusting the image of a pattern formed by the projection optical system PL is constituted by the imaging-characteristic adjusting mechanism for adjusting the imaging characteristic of the projection optical system PL, this invention is not limited to this. The adjusting apparatus may alternatively or additionally include, for example, a mechanism which drives at least one of the reticle R and the wafer W in the direction parallel to the optical-axis AX or a mechanism which shifts the wavelength of the illumination light EL. For example when using the mechanism which shifts the wavelength of the illumination light EL together with the imaging-characteristic adjusting mechanism, the adjustment of the imaging characteristic, as in the case of the movable lenses, is possible by using the variation of the imaging characteristic in each of a plurality of measurement points within the field of the projection optical system PL, specifically wave-front data, for example the variations of the second term's coefficient through the 37th term's coefficient of the Zernike polynomial relative to a unit shift amount of the illumination light EL, which were obtained by the above simulation, etc., and contained in the database beforehand. That is, performing the least-squares computation according to the above second program with using the database gives an optimum shift amount for the wavelength of the illumination light EL in terms of obtaining an optimum image of a pattern formed by the projection optical system, and based on the computing result, the wavelength can be automatically adjusted.

Although the above embodiment describes the case of using the exposure apparatus as an optical apparatus, not being limited to this, the optical apparatus only has to comprise a projection optical system.

Figure 12:
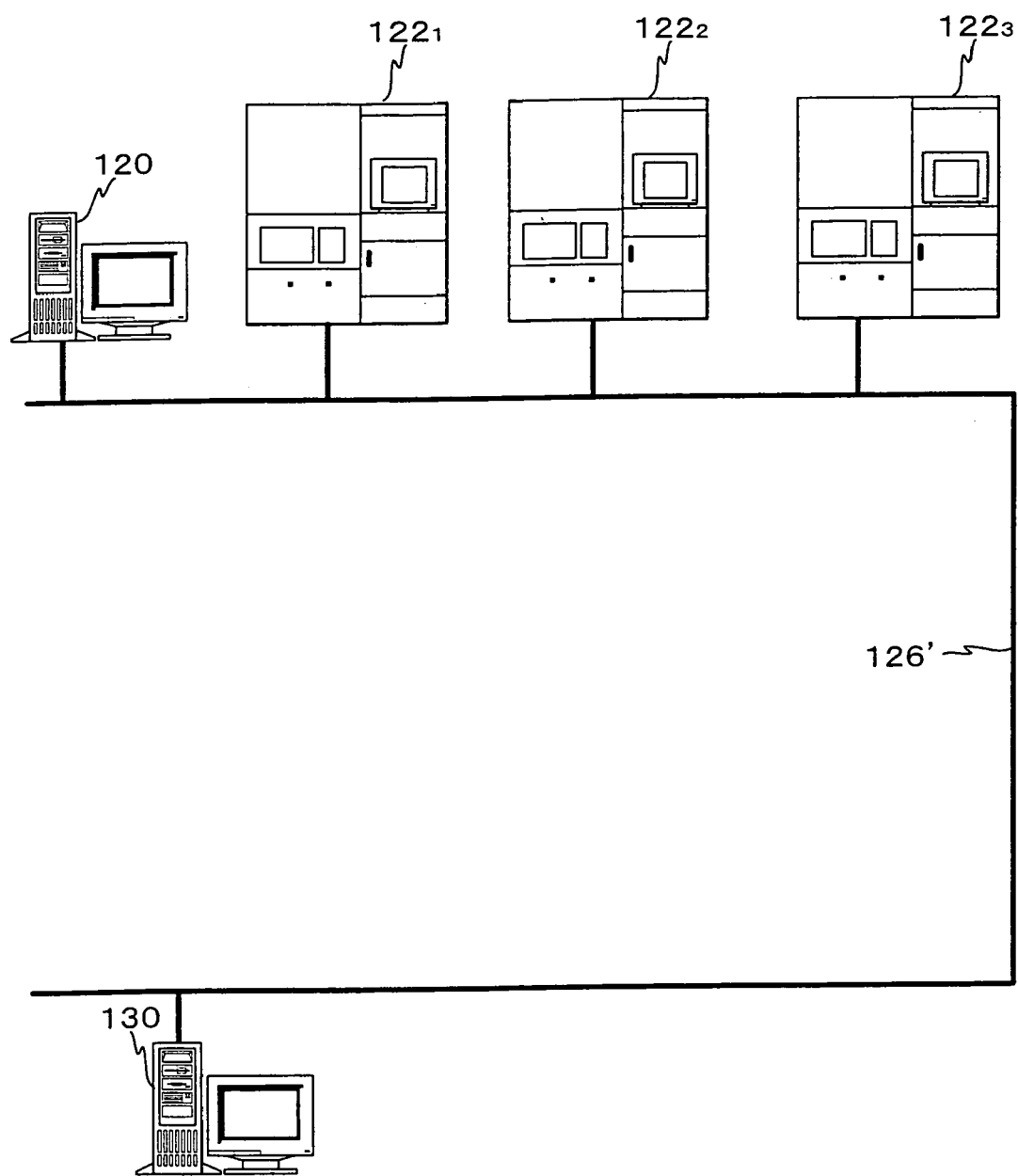
FIG. 12 is a schematic view showing the construction of a computer system modified.

Although the above embodiment describes the computer system where the first communication server 120 as the first computer and the second communication server 130 as the second computer are connected with each other via a communication path including the public telephone line, this invention is not limited to this. For example, it may be a computer system where the first communication server 120 and the second communication server 130 are connected with each other via a communication path LAN 126' as shown in FIG. 12, such as an in-house LAN system installed in the research-and-development section of an exposure-apparatus maker.

In the construction of such an in-house LAN system, the first communication server 120 is installed on a clean room side in the research-and-development section such as a place where an exposure apparatus is assembled and adjusted (hereinafter, called a "site"), and the second communication server 130 is installed in an office remote from the site. And an engineer in the site sends measurement data of the wave-front aberration and information of exposure conditions (including pattern information) for an exposure apparatus under experiment to the second communication server 130 on the office side via the first communication server 120. And an engineer on the office side instructs the second communication server 130 to perform automatic correction of the imaging characteristic of the projection optical system PL of the exposure apparatus 122 based on the received information, in which server 130 a program being developed by them is already installed, and receives the result of measuring the wave-front aberration due to the projection optical system PL after the adjustment of the imaging characteristic to confirm the effect of the adjustment of the imaging characteristic. The result can also be used in developing the program.

Alternatively, an engineer in the site may send pattern information from the first communication server 120 to the second communication server 130 and make it determine an optimum specification of the projection optical system for the pattern.

In addition, the first communication server 120 and the second communication server 130 may be connected with each other by radio.

Although the above embodiment and modified ones describe a case where a plurality of exposure apparatuses $122_1$ through $122_3$ are arranged which are connected with each other via a communication path, this invention is not limited to this, and there may be only one exposure apparatus.

Although the above embodiment describes the case of determining the specification of the projection optical system using the computer system 10, the technical idea of determining the specification of the projection optical system using a standard for the wave-front can be used irrelevantly to the computer system 10. That is, in a business between the makers A and B, the maker B may determine, using a standard for the wave-front, the optimum specification of the projection optical system for pattern information, etc., provided by the maker A. Also this case has the advantage, when making the projection optical system based on the specification determined using a standard for the wave-front, that the process thereof is simpler.

In addition, in the above embodiment, the second communication server 130 calculates adjustment amounts ADJ1 through ADJm of the movable lenses $13_1$ through $13_4$ using the second program and based on the result of measuring the wave-front aberration of the projection optical system of the exposure apparatus 122, and sends the adjustment-amounts data to the main controller 50 of the exposure apparatus 122, which gives the imaging-characteristic correcting controller 48 instruction-values according to the adjustment-amounts ADJ1 through ADJm to move in the movement directions the movable lenses $13_1$ through $13_4$ by, so that the adjustment of the imaging characteristic of the projection optical system PL is performed in remote control. However, not being limited to this, the exposure apparatus 122 may be constructed to automatically adjust the imaging characteristic of the projection optical system based on the result of measuring the wave-front aberration and using the same program as the second program.

Note that in the manufacturing of microprocessors for example, when forming gates, a phase-shift reticle as a phase-shift mask, particularly, a phase-shift reticle of a space-frequency-modulation-type (Levenson type) is used together with small σ illumination. Specifically, under an illumination condition that a coherence factor (σ value) is smaller than 0.5, preferably below about 0.45, the phase-shift reticle is illuminated. Here, the best focus position within the exposure area in the field of the projection optical system deviates due to the aberrations of the projection optical system (e.g. astigmatism, spherical aberration, etc.), so that the depth of focus is smaller, which exposure area is conjugate to the illumination area with respect to the projection optical system and is a projection area on which the image of the pattern on a reticle is formed by exposure illumination light.

Therefore, in the making of the projection optical system, by, e.g., adjusting the aberrations of the projection optical system (e.g. field curvature, astigmatism, spherical aberration, etc.) based on the deviation of the best focus position (image surface) within the exposure area of the projection optical system due to the use of the phase-shift reticle, the best focus position within the exposure area is preferably displaced partially and deliberately. In this case, focus-correction for correcting the aberrations may be performed so as to make a so-called overall focus difference small. By this, the deviation of the best focus position upon using the phase-shift reticle is greatly reduced, so that the pattern of the phase-shift reticle is transferred onto a wafer with a larger depth of focus than before.

Furthermore, the same problem may occur when a phase-shift reticle is used in an exposure apparatus in a device-manufacturing factory. Therefore, the best focus position within the exposure area is preferably displaced partially and deliberately by adjusting the aberrations with using a mechanism for adjusting the imaging characteristic of the projection optical system such as a mechanism that drives at least one optical device of the projection optical system via an actuator (piezo device, etc.). Here, at least one of the field curvature and astigmatism or additionally the spherical aberration in the projection optical system is adjusted. Also in this case, focus-correction for correcting the aberrations may be performed so as to make the overall focus difference small.

Before the adjustment the imaging characteristic of the projection optical system, the imaging characteristic thereof, mainly, the image-surface (representing the best focus positions in the exposure area) may be obtained by computing from design data of the projection optical system or by actually measuring the imaging characteristic.

In the former case, a method of computing by using Zernike-variations tables described above may be used. In the latter case, the imaging characteristic may be obtained from the wave-front aberration measured, or from the result of detecting the pattern image of the reticle by a space-image measuring unit having a light-receiving surface on the wafer stage or from the result of detecting an image of the reticle's pattern (latent image or resist image) projected onto a wafer.

Here, it is preferable that with using a pattern image formed under almost the same exposure conditions, e.g. small σ illumination, as in manufacturing devices, the imaging characteristic of the projection optical system is obtained.

In addition, the imaging characteristic of the projection optical system in which the deviation of the best focus position upon using the phase-shift reticle is reduced is measured again after the assembly or adjustment.

At this point of time, the deviation of line width in the best focus position surface may occur due to residual aberration in the projection optical system. If the deviation is above a limit, at least part of the projection optical system needs to be replaced or readjusted to make the aberration in the projection optical system smaller.

Here, optical devices of the projection optical system may be individually replaced or, when the projection optical system has a plurality of lens barrels, lens barrels as units may be replaced. Furthermore, at least one optical device may be reprocessed, and especially when the optical device is a lens, its surface may be processed so as to become non-spherical, if necessary. The optical device is a refracting optical device such as a lens or a reflecting optical device such as a concave mirror or an aberration-correcting plate for correcting the aberrations (distortion, spherical aberration, etc.), especially, non-rotation-symmetry components due to the projection optical system. Further, in adjusting the projection optical system only the position (or distance from another), tilt, etc., of an optical device thereof may be changed or, when the optical device is a lens, its eccentricity may be changed or it may be rotated about the optical axis AX. Such adjustment (replacement, reprocess, etc.) may also be performed in the above embodiment.

Although the above embodiment describes the case where the measurement reticle $R_T$ has a reference pattern as well as a measurement pattern, the reference pattern is not necessarily provided on an optical-characteristic measurement mask (in the above embodiment, the measurement reticle $R_T$). That is, the reference pattern may be provided on another mask or on the substrate (wafer) side and not on the mask side. That is, a reference wafer is prepared by, after coating with a resist a wafer where the image of the reference pattern is formed reduced to the projection magnification times its original size, transferring the measurement pattern onto the resist layer and then developing it, and by measuring the position deviation of the measurement pattern's resist image from the reference pattern on the reference wafer, substantially the same measurement as in the above embodiment is possible.

Although in the above embodiment the wave-front aberration due to the projection optical system is calculated based on the result of measuring the resist images which are obtained by, after transferring the measurement and reference patterns on the wafer W, developing it, not being limited to this, the result of measuring the image (space image) of the measurement pattern projected onto a wafer using the space-image measuring unit or of measuring the latent images of the measurement and reference patterns formed in the resist layer or images formed by etching a wafer may be used. Also in this case, the wave-front aberration can be obtained in the same procedure as in the above embodiment based on the result of measuring the position deviation of the measurement pattern from a reference position (e.g. projection position of the measurement pattern planned in design). Instead of transferring the measurement pattern onto the wafer, after transferring the reference pattern onto the resist layer on a reference wafer on which the measurement pattern is already formed, the position deviation of the measurement pattern from the reference pattern may be measured by, e.g., using a space-image measuring unit having a plurality of apertures corresponding to the measurement pattern. Moreover, although in the above embodiment the overlay-measuring unit measures the position deviation, the alignment sensor may be used which is provided in the exposure apparatus.

While in the above embodiment the coefficients up to the 37th term of the Zernike polynomial are used, the coefficients over the 37th term, e.g. up to the 81st term, of the Zernike polynomial may be used to calculate higher-order components of the aberrations due to the projection optical system PL. That is, this invention is irrelevant to the number of terms, and term numbers, of the Zernike polynomial in use. In addition, depending on the illumination condition the aberration in the projection optical system PL may be caused deliberately, and thus in the above embodiment the optical devices of the projection optical system PL may be adjusted for the aim aberration to take on a given value and not zero or minimum.

In the above embodiment the first communication server 120 inquires information of reticle to be used this time in, for example, the exposure apparatus 122$_1$ from the host computer (not shown) managing the exposure apparatuses 122$_1$ through 122$_3$ and, based on the reticle information, searches a given database to obtain the pattern information, or alternatively an operator inputs the pattern information into the first communication server 120 via an input unit. However, not being limited to this, the exposure apparatus may further comprise a reader BR such as a bar-code reader indicated by an imaginary line in FIG. 2, by which the first communication server 120 reads a bar-code, two-dimensional code, etc., attached to a reticle R being transferred to the reticle stage RST, via the main controller 50 in order to obtain the pattern information.

In addition, in the case of measuring the wave-front aberration using the measurement reticle for example, the alignment system ALG may detect the position deviation of the latent image of the measurement pattern from that of the reference pattern, the two latent images being formed in the resist layer on the wafer. Moreover, in the case of measuring the wave-front aberration using a wave-front-aberration measuring unit for example, the wave-front-aberration measuring unit may be one having such a shape that it can replace the wafer holder. In this case, the wave-front-aberration measuring unit can be automatically transported by a transport system (including a wafer loader) for replacing a wafer or wafer holder. By implementing the above various means, the computer system 10 can automatically adjust the imaging characteristic of the projection optical system PL and set best exposure conditions without the help of an operator or service engineer. Although this embodiment describes the case where the wave-front-aberration measuring unit 80 is attachable to and detachable from the wafer stage, the wave-front-aberration measuring unit 80 may be fixed on the wafer stage, in which case a part of the wave-front-aberration measuring unit 80 may be provided on the wafer stage while the rest is disposed separately from the wafer stage. Although in this embodiment, wave-front aberration due to the light-receiving optical system of the wave-front-aberration measuring unit 80 is neglected, the wave-front aberration in the projection optical system may be determined in view of the wave-front aberration due to the light-receiving optical system.

In addition, the exposure apparatus 122 alone may automatically adjust the imaging characteristic of the projection optical system PL and set best exposure conditions by using the first through third programs and databases associated therewith, described in the above embodiment and which are stored in an information storage media or the storage unit 42 of the drive unit 46 thereof. Furthermore, the first through third programs may be stored in an exclusive server (equivalent to the second communication server 130) that is disposed in the factory of the maker A and connected to the exposure apparatuses through LAN. The point is that this invention is not limited to the construction in FIG. 1, and that it does not matter where a computer (server, etc.) storing the first through third programs is disposed.

Although the above embodiment describes the case where the exposure apparatus is a stepper, not being limited to this, it may be a scan-type exposure apparatus that is disclosed in, for example, U.S. Pat. No. 5,473,410 and that transfers the pattern of a mask while moving synchronously the mask and a substrate.

This invention can be applied not only to an exposure apparatus for manufacturing semiconductor devices but also to an exposure apparatus for transferring a liquid crystal display device pattern onto a rectangular glass plate and an exposure apparatus for producing membrane-magnetic heads, micro machines, DNA chips, etc. Furthermore, this invention can be applied to an exposure apparatus for transferring a circuit pattern onto glass plates or silicon wafers to produce masks or reticles used by a light exposure apparatus, an EUV exposure apparatus, an X-ray exposure apparatus, a charged-particle-beam exposure apparatus employing an electron or ion beam, etc.

In addition, the light source may be an ultraviolet pulse illuminant such as an $F_2$ laser, ArF excimer laser or KrF excimer laser or a continuous illuminant such as an ultra-high pressure mercury lamp emitting an emission line such as g-line (a wavelength of 436 nm) or i-line (a wavelength of 365 nm).

Moreover, a higher harmonic wave may be used which is obtained with wavelength conversion into ultraviolet by using non-linear optical crystal after having amplified a single wavelength laser light, infrared or visible, emitted from a DFB semiconductor laser device or a fiber laser by a fiber amplifier having, for example, erbium (or erbium and ytterbium) doped. Furthermore, the projection optical system is not limited in magnification to a reduction system and may be an even-ratio or magnifying system. Yet further, the projection optical system is not limited to a refracting system and may be a catadioptric system having reflecting optical elements and refracting optical elements or a reflecting system having only reflecting optical elements. It is remarked that, when the catadioptric system or the reflecting system is used as the projection optical system, the imaging characteristic of the projection optical system is adjusted by changing the positions, etc., of the reflecting optical elements (concave mirror, reflective mirror, etc.) as the above-mentioned movable optical devices. When $F_2$ laser light, $Ar_2$ laser light, EUV light, or the like is employed as the illumination light EL, the projection optical system PL may be a reflecting system having only reflecting optical elements, and when $Ar_2$ laser light, EUV light, or the like is employed, a reticle R needs to be of a reflective type.

It is remarked that the process of manufacturing semiconductor devices comprises the steps of designing function/performance of the devices; making reticles according to the function/performance planned in the designing step; making wafers from silicon material; transferring the pattern of the reticle onto the wafer by using the above-mentioned exposure apparatus; assembling the devices (including the steps of dicing, bonding, and packaging); and inspection. According to this device manufacturing method, because, in a lithography step, the exposure apparatus of the above-mentioned embodiment performs exposure, the pattern of a reticle R is transferred onto a wafer W through the projection optical system PL whose imaging characteristic is very accurately adjusted according to the pattern to be transferred or based on the result of measuring the wave-front aberration, and therefore it is possible to transfer the fine pattern onto the wafer W with high overlay accuracy, so that the yield of the devices as final products and the productivity are improved.

Although the embodiments according to the present invention are preferred embodiments, those skilled in the art of lithography systems can readily think of numerous additions, modifications and substitutions to the above embodiments, without departing from the scope and spirit of this invention. It is contemplated that any such additions, modifications and substitutions will fall within the scope of the present invention, which is defined by the claims appended hereto.

What is claimed is:

1. An exposure apparatus that transfers a pattern onto an object via a projection optical system, the apparatus comprising:
    a movable member arranged on an image plane side with respect to the projection optical system;
    a wavefront measuring unit at least a part of which is arranged on the movable member, and that measures wavefront information of the projection optical system;
    an adjusting unit that adjusts an imaging state of a projected pattern generated on the object via the projection optical system; and
    a controller that controls the adjusting unit using the wavefront information and Zernike Sensitivity corresponding to exposure conditions of the object.

2. An exposure apparatus according to claim 1, wherein the controller determines adjustment information of the projection optical system using the least-squares method, based on the wavefront information and the Zernike Sensitivity, and controls the adjusting unit based on the adjustment information.

3. An exposure apparatus according to claim 2, wherein based on data regarding a relation between an adjustment amount of an optical element of the projection optical system and variation of a coefficient of a predetermined term of a Zernike polynomial, the controller determines an adjustment amount of the optical 4. An exposure apparatus according to claim 3, wherein the controller determines a coefficient in a predetermined term of a Zernike polynomial from the wavefront information, and when determining the adjustment amount, the determined coefficient in a predetermined term of a Zernike polynomial is used.

5. An exposure apparatus according to claim 4, wherein the controller determines the adjustment amount so that an error of the projected pattern is equal to or less than a permissible value at a plurality of points in a predetermined area where the projected pattern is generated, within a field of the projection optical system.

6. An exposure apparatus according to claim 1, wherein the exposure conditions include at least an illumination condition of a pattern to be transferred onto the object.

7. An exposure apparatus according to claim 1, wherein based on the wavefront information, the Zernike Sensitivity; and data regarding a relation between an adjustment amount by the adjusting unit and variation of a coefficient in a predetermined term of a Zernike polynomial, the controller determines an adjustment amount by the adjusting unit used to substantially optimize an imaging state of the projected pattern, and controls the adjusting unit based on the determined adjustment amount.

8. An exposure apparatus according to claim 7, wherein the exposure conditions include at least an illumination condition of a pattern to be transferred onto the object, and
the controller uses the least-squares method when determining the adjustment amount.

9. An exposure apparatus according to claim 8, wherein the controller determines a coefficient in a predetermined term of a Zernike polynomial from the wavefront information, and uses the coefficient when determining the adjustment amount.

10. An exposure apparatus according to claim 9, wherein the controller determines the adjustment amount so that aberration of the projection optical system is substantially optimized at a plurality of points in a predetermined area where the projected pattern is generated, within a field of the projection optical system.

11. An exposure apparatus according to claim 10, wherein the controller determines the adjustment amount so that both a lower-order component and a higher-order component of aberration of the projection optical system are substantially optimized.

12. An exposure apparatus according to claim 10, wherein the controller determines the adjustment amount so that different aberrations of the projection optical system and different order components of each aberration are substantially optimized.

13. An exposure apparatus according to claim 7, wherein the adjusting unit includes an actuator that moves an optical element of the projection optical system, and
the adjustment amount includes a drive amount of the optical element.

14. An exposure apparatus according to claim 7, wherein the pattern is transferred onto the object with an exposure beam via the projection optical system, and
the adjustment amount includes a shift amount of the wavelength of the exposure beam.

15. An exposure apparatus according to claim 7, wherein the adjusting unit can adjust an imaging state of the projected pattern in each of a plurality of methods including a method of moving an optical element of the projection optical system, and
the controller determines an adjustment amount in each of the plurality of methods.

16. An exposure apparatus according to claim 15, wherein in order to determine an adjustment amount in each of the plurality of methods, the controller uses data regarding a relation between each of a plurality of adjustment amounts including a drive amount of the optical element and a coefficient in a predetermined term of a Zernike polynomial.

17. An exposure apparatus according to claim 7, wherein when the exposure condition is changed, the controller uses Zernike Sensitivity that is different from Zernike Sensitivity before the change in determination of the adjustment amount.

18. A device manufacturing method comprising:
providing an exposure apparatus that transfers a pattern onto an object via a projection optical system, the exposure apparatus including a movable member arranged on an image plane side with respect to the projection optical system, a wavefront measuring unit at least a part of which is arranged on the movable member, and that measures wavefront information of the projection optical system, an adjusting unit that adjusts an imaging state of a projected pattern generated on the object via the projection optical system, and a controller that controls the adjusting unit using the wavefront information and Zernike Sensitivity corresponding to exposure conditions of the object; and
performing a lithography process,
wherein in said lithography process, said exposure apparatus performs exposure.

19. An exposure method in which a pattern is transferred onto an object via a projection optical system, the method comprising:
measuring wavefront information of the projection optical system by a wavefront measuring unit at least a part of which is arranged on a movable member that is arranged on an image plane side with respect to the projection optical system; and
adjusting an imaging state of a projected pattern generated on the object via the projection optical system, using the wavefront information and Zernike Sensitivity corresponding to exposure conditions of the object.

20. An exposure method according to claim 19, wherein based on the wavefront information, the Zernike Sensitivity, and data regarding a relation between an adjustment amount by an adjusting unit that adjusts an imaging state of the projected pattern and variation of a coefficient in a predetermined term of a Zernike polynomial, an adjustment amount by the adjusting unit used to substantially optimize the imaging state of the projected pattern is determined, and
the imaging state of the projected pattern is adjusted using the determined adjustment amount.

21. An exposure method according to claim 20, wherein the exposure conditions include at least an illumination condition of a pattern to be transferred onto the object, and
in determination of the adjustment amount, the least-squares method is used.

22. An exposure method according to claim 21, wherein a coefficient in a predetermined term of a Zernike polynomial is determined from the wavefront information, and
in determination of the adjustment amount, the coefficient is used.

23. An exposure method according to claim 22, wherein the adjustment amount is determined so that aberration of the projection optical system is substantially optimized at a plurality of points in a predetermined area where the projected pattern is generated, within a field of the projection optical system.

24. An exposure method according to claim 23, wherein the adjustment amount is determined so that both a lower-order component and a higher-order component of aberration of the projection optical system are substantially optimized.

25. An exposure method according to claim 23, wherein the adjustment amount is determined so that different aberrations of the projection optical system and different order components of each aberration are substantially optimized.

26. An exposure method according to claim 20, wherein in adjustment of the imaging state, an optical element of the projection optical system is moved, and
the adjustment amount includes a drive amount of the optical element.

27. An exposure method according to claim 20, wherein the pattern is transferred onto the object with an exposure beam via the projection optical system, and
the adjustment amount includes a shift amount of the wavelength of the exposure beam.

28. An exposure method according to claim 20, wherein an imaging state of the projected pattern is adjusted in each of a plurality of methods including a method of moving an optical element of the projection optical system, and
an adjustment amount in each of the plurality of methods is determined.

29. An exposure method according to claim 28, wherein in order to determine an adjustment amount in each of the plurality of methods, data regarding a relation between each of a plurality of adjustment amounts including a drive amount of the optical element and a coefficient in a predetermined term of a Zernike polynomial is used.

30. An exposure method according to claim 20, wherein when the exposure condition is changed, Zernike Sensitivity that is different from Zernike Sensitivity before the change is used in determination of the adjustment amount.

31. A device manufacturing method comprising:
measuring wavefront information of a projection optical system by a wavefront measuring unit at least a part of which is arranged on a movable member that is arranged on an image plane side with respect to the projection optical system;
adjusting an imaging state of a projected pattern generated on a photosensitive object via the projection optical system, using the wavefront information and Zernike Sensitivity corresponding to exposure conditions of the photosensitive object;
forming a pattern on the photosensitive object via the projection optical system, after the adjustment; and
processing the photosensitive object on which the pattern is formed.

32. A method of making an exposure apparatus that transfers a pattern onto an object via a projection optical system, the method comprising:
providing a movable member arranged on an image plane side with respect to the projection optical system;
providing a wavefront measuring unit at least a part of which is arranged on the movable member, and that measures wavefront information of the projection optical system;

providing an adjusting unit that adjusts an imaging state of a projected pattern generated on the object via the projection optical system; and providing a controller that controls the adjusting unit using the wavefront information and Zernike Sensitivity corresponding to exposure conditions of the object.

33. A storage medium in which a program is recorded that can be read by a computer that controls an exposure apparatus that transfers a pattern onto an object via a projection optical system, the program comprising:

a procedure of measuring wavefront information of the projection optical system with a wavefront measuring unit at least a part of which is arranged on a movable member that is arranged on an image plane side with respect to the projection optical system; and a procedure of adjusting an imaging state of a projected pattern generated on the object via the projection optical system, using the wavefront information and Zernike Sensitivity corresponding to exposure conditions of the object.

* * * * *